US009564989B2

(12) United States Patent
Lee et al.

(10) Patent No.: US 9,564,989 B2
(45) Date of Patent: Feb. 7, 2017

(54) DIGITAL TELEVISION TRANSMITTING SYSTEM AND RECEIVING SYSTEM AND METHOD OF PROCESSING BROADCAST DATA

(71) Applicant: LG ELECTRONICS INC., Seoul (KR)

(72) Inventors: Hyoung Gon Lee, Seoul (KR); In Hwan Choi, Gwacheon-si (KR); Byoung Gill Kim, Seoul (KR); Won Gyu Song, Seoul (KR); Jong Moon Kim, Gwangmyeong-si (KR); Jin Woo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 17 days.

(21) Appl. No.: 14/242,550

(22) Filed: Apr. 1, 2014

(65) Prior Publication Data

US 2014/0211884 A1   Jul. 31, 2014

Related U.S. Application Data

(63) Continuation of application No. 13/720,927, filed on Dec. 19, 2012, now Pat. No. 8,804,817, which is a
(Continued)

(30) Foreign Application Priority Data

May 23, 2006 (KR) .................. 10-2006-0046303
Sep. 15, 2006 (KR) .................. 10-2006-0089736

(51) Int. Cl.
*H04L 1/00* (2006.01)
*H03M 13/27* (2006.01)
(Continued)

(52) U.S. Cl.
CPC ........ *H04L 1/0041* (2013.01); *H03M 13/2732* (2013.01); *H03M 13/293* (2013.01);
(Continued)

(58) Field of Classification Search
CPC ...... H04L 1/0041; H04L 1/0042; H04L 1/007; H04L 1/0071
(Continued)

(56) References Cited

U.S. PATENT DOCUMENTS 4,642,755 A   2/1987 Hinch
5,177,796 A   1/1993 Feig et al.
(Continued)

FOREIGN PATENT DOCUMENTS

CA   2404404   3/2003
CN   1533174   9/2004
(Continued)

OTHER PUBLICATIONS

Novel approach to secure broadcast in distributed systems, Deng et al, IEEE, 1995, Security Technology, 1995. Proceedings. Institute of Electrical and Electronics Engineers 29th Annual 1995 International Carnahan Conference.*
(Continued)

*Primary Examiner* — Luu Pham
*Assistant Examiner* — Jahangir Kabir
(74) *Attorney, Agent, or Firm* — Birch, Stewart, Kolasch & Birch, LLP

(57) ABSTRACT

A DTV transmitting system includes a frame encoder, a randomizer, a block processor, a group formatter, a deinterleaver, and a packet formatter. The frame encoder builds an enhanced data frame and adds parity data into the data frame. The frame encoder further divides the data frame into first and second sub-frames including first and second portions of the parity data, respectively, and permutes a plurality
(Continued)

of the first sub-frames and a plurality of the second sub-frames, respectively. The randomizer randomizes enhanced data in the permuted sub-frames, and the block processor codes the randomized data at a rate of 1/N1. The group formatter forms a group of enhanced data having one or more data regions and inserts the 1/N1 coded data into at least one of the data regions. The deinterleaver deinterleaves the group of enhanced data, and the packet formatter formats the deinterleaved data into enhanced data packets.

6 Claims, 24 Drawing Sheets

Related U.S. Application Data continuation of application No. 11/752,870, filed on May 23, 2007, now Pat. No. 8,351,497.

(60) Provisional application No. 60/883,998, filed on Jan. 8, 2007.

(51) Int. Cl.
| | | |
|---|---|---|
| *H03M 13/29* | (2006.01) | |
| *H03M 13/35* | (2006.01) | |
| *H03M 13/37* | (2006.01) | |
| *H04N 21/235* | (2011.01) | |
| *H04N 21/2383* | (2011.01) | |
| *H04N 21/435* | (2011.01) | |
| *H04N 21/438* | (2011.01) | |
| *H03M 13/09* | (2006.01) | |
| *H03M 13/15* | (2006.01) | |
| *H03M 13/23* | (2006.01) | |

(52) U.S. Cl.
CPC ... *H03M 13/2909* (2013.01); *H03M 13/2915* (2013.01); *H03M 13/2918* (2013.01); *H03M 13/2927* (2013.01); *H03M 13/2933* (2013.01); *H03M 13/356* (2013.01); *H03M 13/3723* (2013.01); *H04L 1/0071* (2013.01); *H04N 21/235* (2013.01); *H04N 21/2383* (2013.01); *H04N 21/435* (2013.01); *H04N 21/4382* (2013.01); *H03M 13/09* (2013.01); *H03M 13/15* (2013.01); *H03M 13/1515* (2013.01); *H03M 13/23* (2013.01)

(58) Field of Classification Search
USPC ............ 375/240.01, 240.26, 240.27, 240.28
See application file for complete search history.

(56) References Cited

U.S. PATENT DOCUMENTS

| | | | |
|---|---|---|---|
| 5,208,816 | A | 5/1993 | Seshardi et al. |
| 5,258,987 | A | 11/1993 | Wei |
| 5,301,167 | A | 4/1994 | Proakis et al. |
| 5,488,635 | A | 1/1996 | Chennakeshu et al. |
| 5,502,506 | A | 3/1996 | Choi |
| 5,508,752 | A | 4/1996 | Kim et al. |
| 5,511,096 | A | 4/1996 | Huang et al. |
| 5,544,060 | A | 8/1996 | Fujii et al. |
| 5,602,593 | A | 2/1997 | Katto |
| 5,606,569 | A | 2/1997 | Macdonald et al. |
| 5,619,269 | A | 4/1997 | Lee et al. |
| 5,636,251 | A | 6/1997 | Citta et al. |
| 5,691,993 | A | 11/1997 | Fredrickson |
| 5,754,651 | A | 5/1998 | Blatter et al. |
| 5,757,416 | A | 5/1998 | Birch et al. |
| 5,771,239 | A | 6/1998 | Moroney et al. |
| 5,867,503 | A | 2/1999 | Ohsuga et al. |
| 5,896,181 | A | 4/1999 | Takamori |
| 5,903,324 | A | 5/1999 | Lyons et al. |
| 5,956,373 | A | 9/1999 | Goldston et al. |
| 5,978,424 | A | 11/1999 | Turner |
| 6,005,894 | A | 12/1999 | Kumar |
| 6,016,309 | A | 1/2000 | Benayoun et al. |
| 6,021,421 | A | 2/2000 | Retter et al. |
| 6,049,651 | A | 4/2000 | Oshima |
| 6,075,569 | A | 6/2000 | Lee et al. |
| 6,124,898 | A | 9/2000 | Patel et al. |
| 6,211,800 | B1 | 4/2001 | Yanagihara et al. |
| 6,212,659 | B1 | 4/2001 | Zehavi |
| 6,219,386 | B1 | 4/2001 | Amrany et al. |
| 6,226,380 | B1 | 5/2001 | Ding |
| 6,232,917 | B1 | 5/2001 | Baumer et al. |
| 6,233,295 | B1 | 5/2001 | Wang |
| 6,243,469 | B1 | 6/2001 | Kataoka et al. |
| 6,272,660 | B1 | 8/2001 | Chen et al. |
| 6,285,681 | B1 | 9/2001 | Kolze et al. |
| 6,289,485 | B1 | 9/2001 | Shiomoto |
| 6,334,187 | B1 | 12/2001 | Kadono |
| 6,339,618 | B1 | 1/2002 | Puri et al. |
| 6,356,598 | B1 | 3/2002 | Wang |
| 6,373,534 | B1 | 4/2002 | Yasuki et al. |
| 6,373,634 | B1 | 4/2002 | Nishikawa |
| 6,405,338 | B1 | 6/2002 | Sinha et al. |
| 6,411,253 | B1 | 6/2002 | Cox et al. |
| 6,446,234 | B1 | 9/2002 | Cox et al. |
| 6,456,611 | B1 | 9/2002 | Hu et al. |
| 6,459,741 | B1 | 10/2002 | Grabb et al. |
| 6,470,047 | B1 | 10/2002 | Kleinerman et al. |
| 6,490,007 | B1 | 12/2002 | Bouillet et al. |
| 6,498,936 | B1 | 12/2002 | Raith |
| 6,512,759 | B1 | 1/2003 | Hashimoto et al. |
| 6,515,713 | B1 | 2/2003 | Nam |
| 6,553,538 | B2 | 4/2003 | Zehavi |
| 6,573,947 | B1 | 6/2003 | Oh |
| 6,577,685 | B1 | 6/2003 | Bao et al. |
| 6,636,892 | B1 | 10/2003 | Philyaw |
| 6,650,880 | B1 | 11/2003 | Lee et al. |
| 6,651,250 | B1 | 11/2003 | Takai |
| 6,665,308 | B1 | 12/2003 | Rakib et al. |
| 6,665,343 | B1 | 12/2003 | Jahanghir et al. |
| 6,671,002 | B1 | 12/2003 | Konishi et al. |
| 6,686,880 | B1 | 2/2004 | Marko et al. |
| 6,687,310 | B1 | 2/2004 | Fimoff et al. |
| 6,693,984 | B1 | 2/2004 | Andre |
| 6,694,518 | B1 | 2/2004 | Dulac |
| 6,704,358 | B1 | 3/2004 | Li et al. |
| 6,731,700 | B1 | 5/2004 | Yakhnich et al. |
| 6,734,920 | B2 | 5/2004 | Ghosh et al. |
| 6,738,949 | B2 | 5/2004 | Senda et al. |
| 6,744,474 | B2 | 6/2004 | Markman |
| 6,744,822 | B1 | 6/2004 | Gaddam et al. |
| 6,744,926 | B1 | 6/2004 | Nishigaki |
| 6,760,077 | B2 | 7/2004 | Choi et al. |
| 6,768,517 | B2 | 7/2004 | Limberg et al. |
| 6,775,334 | B1 | 8/2004 | Liu et al. |
| 6,775,521 | B1 | 8/2004 | Chen |
| 6,775,664 | B2 | 8/2004 | Lang et al. |
| 6,803,970 | B1 | 10/2004 | Limberg et al. |
| 6,810,084 | B1 | 10/2004 | Jun et al. |
| 6,810,090 | B1 | 10/2004 | Perlow |
| 6,816,204 | B2 | 11/2004 | Limberg |
| 6,827,941 | B1 | 12/2004 | Lüddecke et al. |
| 6,842,875 | B2 | 1/2005 | Kondo et al. |
| 6,850,562 | B1 | 2/2005 | Dornstetter et al. |
| 6,904,110 | B2 | 6/2005 | Trans et al. |
| 6,909,743 | B1 | 6/2005 | Ward et al. |
| 6,917,655 | B2 | 7/2005 | Fimoff et al. |
| 6,922,215 | B2 | 7/2005 | Choi et al. |
| 6,924,753 | B2 | 8/2005 | Bretl et al. |
| 6,925,126 | B2 | 8/2005 | Lan et al. |
| 6,927,708 | B2 | 8/2005 | Fimoff |
| 6,931,198 | B1 | 8/2005 | Hamada et al. |
| 6,934,331 | B2 | 8/2005 | Kamikura et al. |
| 6,937,648 | B2 | 8/2005 | Raphaeli |
| 6,944,242 | B2 | 9/2005 | Yakhnich et al. |
| 6,947,487 | B2 | 9/2005 | Choi et al. |
| 6,952,595 | B2 | 10/2005 | Ikedo et al. |

(56) References Cited

U.S. PATENT DOCUMENTS

| | | | |
|---|---|---|---|
| 6,956,619 B2 | 10/2005 | Choi et al. |
| 6,973,137 B2 | 12/2005 | Birru et al. |
| 6,975,689 B1 | 12/2005 | McDonald et al. |
| 6,977,914 B2 | 12/2005 | Paila et al. |
| 6,977,977 B1 | 12/2005 | Dubrovin et al. |
| 6,980,603 B2 | 12/2005 | Choi et al. |
| 6,984,110 B2 | 1/2006 | Jang |
| 6,985,420 B2 | 1/2006 | Shishido |
| 6,985,537 B1 | 1/2006 | Milbar |
| 6,993,021 B1 | 1/2006 | Chuah et al. |
| 6,993,062 B1 | 1/2006 | Kong et al. |
| 6,996,133 B2 | 2/2006 | Bretl et al. |
| 7,010,038 B2 | 3/2006 | Choi et al. |
| 7,016,446 B1 | 3/2006 | Spalink |
| 7,020,481 B2 | 3/2006 | Kivijarvi |
| 7,030,935 B2 | 4/2006 | Choi et al. |
| 7,038,732 B1 | 5/2006 | Limberg et al. |
| 7,042,949 B1 | 5/2006 | Omura et al. |
| 7,050,419 B2 | 5/2006 | Azenkot et al. |
| 7,079,584 B2 | 7/2006 | Feher |
| 7,085,324 B2 | 8/2006 | Choi et al. |
| 7,092,447 B2 | 8/2006 | Choi et al. |
| 7,092,455 B2 | 8/2006 | Choi et al. |
| 7,093,179 B2 | 8/2006 | Shea |
| 7,095,707 B2 | 8/2006 | Rakib et al. |
| 7,096,484 B2 | 8/2006 | Mao et al. |
| 7,102,692 B1 | 9/2006 | Carlsgaard et al. |
| 7,110,449 B2 | 9/2006 | Heo et al. |
| 7,111,221 B2 | 9/2006 | Birru et al. |
| 7,130,313 B2 | 10/2006 | Pekonen |
| 7,148,932 B2 | 12/2006 | Choi et al. |
| 7,151,575 B1 | 12/2006 | Landry et al. |
| 7,170,849 B1 | 1/2007 | Arivoli et al. |
| 7,194,047 B2 | 3/2007 | Strolle et al. |
| 7,197,685 B2 | 3/2007 | Limberg |
| 7,209,459 B2 | 4/2007 | Kangas |
| 7,218,671 B2 | 5/2007 | Jeong et al. |
| 7,221,358 B2 | 5/2007 | Sasaki |
| 7,221,680 B2 | 5/2007 | Vijayan et al. |
| 7,246,296 B2 | 7/2007 | Yokokawa et al. |
| 7,277,709 B2 | 10/2007 | Vadgama |
| 7,295,623 B2 | 11/2007 | Raghavan |
| 7,333,153 B2 | 2/2008 | Hartson et al. |
| 7,334,176 B2 | 2/2008 | Schroder |
| 7,343,487 B2 | 3/2008 | Lindqvist et al. |
| 7,356,549 B1 | 4/2008 | Bruso et al. |
| 7,376,074 B2 | 5/2008 | Jung et al. |
| 7,376,186 B2 | 5/2008 | Boyce et al. |
| 7,400,820 B2 | 7/2008 | Uchida et al. |
| 7,406,647 B2 | 7/2008 | Lakkis |
| 7,440,410 B2 | 10/2008 | Ojard et al. |
| 7,440,516 B2 | 10/2008 | Kim et al. |
| 7,450,613 B2 | 11/2008 | Choi et al. |
| 7,450,628 B2 | 11/2008 | Feher |
| 7,454,683 B2 | 11/2008 | Vesma et al. |
| 7,460,606 B2 | 12/2008 | Choi et al. |
| 7,474,695 B2 | 1/2009 | Liu et al. |
| 7,590,187 B2 | 9/2009 | Jeong et al. |
| 7,590,917 B2 | 9/2009 | Barry et al. |
| 7,593,474 B2 | 9/2009 | Jeong et al. |
| 7,620,118 B2 | 11/2009 | Choi |
| 7,634,006 B2 | 12/2009 | Choi et al. |
| 7,644,343 B2 | 1/2010 | Gubbi et al. |
| 7,646,828 B2 | 1/2010 | Song et al. |
| 7,653,143 B2 | 1/2010 | Kim et al. |
| 7,675,994 B2 | 3/2010 | Gaddam et al. |
| 7,698,621 B2 | 4/2010 | Choi et al. |
| 7,701,850 B2 | 4/2010 | Kim et al. |
| 7,705,920 B2 | 4/2010 | Lee et al. |
| 7,733,426 B2 | 6/2010 | Lee et al. |
| 7,733,819 B2 | 6/2010 | Lee et al. |
| 7,733,820 B2 | 6/2010 | Choi et al. |
| 7,739,581 B2 | 6/2010 | Lee et al. |
| 7,764,323 B2 | 7/2010 | Choi et al. |
| 7,779,337 B2 | 8/2010 | Song et al. |
| 7,782,958 B2 | 8/2010 | Lee et al. |
| 7,783,960 B2 | 8/2010 | Choi et al. |
| 7,796,697 B2 | 9/2010 | Kim et al. |
| 7,797,607 B2 | 9/2010 | Choi et al. |
| 7,822,134 B2 | 10/2010 | Kim et al. |
| 7,823,052 B2 | 10/2010 | Yu et al. |
| 7,826,575 B2 | 11/2010 | Yang et al. |
| 7,840,882 B2 | 11/2010 | Lee et al. |
| 7,844,009 B2 | 11/2010 | Kim et al. |
| 7,844,012 B2 | 11/2010 | Park et al. |
| 7,848,400 B2 | 12/2010 | Heiman et al. |
| 7,852,961 B2 | 12/2010 | Chang et al. |
| 7,873,103 B2 | 1/2011 | Park et al. |
| 7,876,835 B2 | 1/2011 | Kim et al. |
| 7,882,421 B2 | 2/2011 | Oguz et al. |
| 7,890,980 B2 | 2/2011 | Yun et al. |
| 7,913,152 B2 | 3/2011 | Jeong et al. |
| 7,930,618 B2 | 4/2011 | Yu et al. |
| 7,932,956 B2 | 4/2011 | Choi et al. |
| 7,934,243 B2 | 4/2011 | Song et al. |
| 7,934,244 B2 | 4/2011 | Kim et al. |
| 7,941,735 B2 | 5/2011 | Jeong et al. |
| 7,983,354 B2 | 7/2011 | Park et al. |
| 7,986,715 B2 | 7/2011 | Song et al. |
| 8,009,662 B2 | 8/2011 | Lee et al. |
| 8,019,011 B2 | 9/2011 | Jeong et al. |
| 8,045,935 B2 | 10/2011 | Lakkis et al. |
| 8,050,327 B2 | 11/2011 | Lee et al. |
| 8,074,147 B2 | 12/2011 | Lee et al. |
| 8,081,716 B2 | 12/2011 | Kang et al. |
| 8,094,727 B2 | 1/2012 | Hong et al. |
| 8,171,369 B2 | 5/2012 | Lee et al. |
| 8,509,051 B2 | 8/2013 | Ling et al. |
| 8,582,596 B2 | 11/2013 | Agrawal et al. |
| 8,826,093 B2 | 9/2014 | Walker et al. |
| 8,984,381 B2 | 3/2015 | Lee et al. |
| 9,178,536 B2 | 11/2015 | Lee et al. |
| 2001/0011213 A1 | 8/2001 | Hindie et al. |
| 2001/0034867 A1 | 10/2001 | Jaffe et al. |
| 2001/0056565 A1 | 12/2001 | Li |
| 2002/0037058 A1 | 3/2002 | Birru |
| 2002/0046406 A1 | 4/2002 | Chelehmal et al. |
| 2002/0051087 A1 | 5/2002 | Limberg et al. |
| 2002/0056103 A1 | 5/2002 | Gong |
| 2002/0080992 A1 | 6/2002 | Decker et al. |
| 2002/0082767 A1 | 6/2002 | Mintz |
| 2002/0085632 A1 | 7/2002 | Choi et al. |
| 2002/0089078 A1 | 7/2002 | Suzuki et al. |
| 2002/0122511 A1 | 9/2002 | Kwentus et al. |
| 2002/0126222 A1 | 9/2002 | Choi et al. |
| 2002/0136197 A1 | 9/2002 | Owen et al. |
| 2002/0141440 A1 | 10/2002 | Stanley et al. |
| 2002/0150167 A1 | 10/2002 | Demjanenko et al. |
| 2002/0150246 A1 | 10/2002 | Ogina |
| 2002/0154620 A1 | 10/2002 | Azenkot et al. |
| 2002/0154709 A1 | 10/2002 | Choi et al. |
| 2002/0159520 A1 | 10/2002 | Choi et al. |
| 2002/0172154 A1 | 11/2002 | Uchida et al. |
| 2002/0186780 A1 | 12/2002 | Choi et al. |
| 2002/0186790 A1 | 12/2002 | Choi et al. |
| 2002/0187767 A1 | 12/2002 | Meehan |
| 2002/0191716 A1 | 12/2002 | Xia et al. |
| 2002/0194570 A1* | 12/2002 | Birru et al. .................. 714/792 |
| 2003/0002495 A1 | 1/2003 | Shahar et al. |
| 2003/0046431 A1 | 3/2003 | Belleguie |
| 2003/0067899 A9 | 4/2003 | Chen et al. |
| 2003/0093798 A1 | 5/2003 | Rogerson |
| 2003/0099303 A1 | 5/2003 | Birru et al. |
| 2003/0137765 A1 | 7/2003 | Yamazaki et al. |
| 2003/0152107 A1 | 8/2003 | Pekonen |
| 2003/0206053 A1 | 11/2003 | Xia et al. |
| 2003/0212948 A1 | 11/2003 | Eroz et al. |
| 2003/0223516 A1 | 12/2003 | Zhang et al. |
| 2003/0223519 A1 | 12/2003 | Jeong et al. |
| 2003/0234890 A1 | 12/2003 | Bae et al. |
| 2004/0022278 A1 | 2/2004 | Thomas et al. |
| 2004/0028076 A1 | 2/2004 | Strolle et al. |
| 2004/0034491 A1 | 2/2004 | Kim |
| 2004/0061645 A1 | 4/2004 | Seo et al. |

(56) References Cited

U.S. PATENT DOCUMENTS

| | | |
|---|---|---|
| 2004/0064574 A1 | 4/2004 | Kurauchi |
| 2004/0071241 A1 | 4/2004 | Bouillet et al. |
| 2004/0090997 A1* | 5/2004 | Choi et al. .................. 370/535 |
| 2004/0100588 A1 | 5/2004 | Hartson et al. |
| 2004/0101046 A1 | 5/2004 | Yang et al. |
| 2004/0105507 A1 | 6/2004 | Chang et al. |
| 2004/0110522 A1 | 6/2004 | Howard et al. |
| 2004/0125235 A1 | 7/2004 | Kim et al. |
| 2004/0141457 A1 | 7/2004 | Seo et al. |
| 2004/0148642 A1 | 7/2004 | Park et al. |
| 2004/0156460 A1 | 8/2004 | Kim et al. |
| 2004/0179616 A1 | 9/2004 | Choi et al. |
| 2004/0181800 A1 | 9/2004 | Rakib et al. |
| 2004/0184547 A1 | 9/2004 | Choi et al. |
| 2004/0246373 A1 | 12/2004 | Kadono et al. |
| 2004/0260985 A1 | 12/2004 | Krieger |
| 2005/0013380 A1 | 1/2005 | Kim et al. |
| 2005/0021827 A1 | 1/2005 | Matsuura |
| 2005/0024543 A1 | 2/2005 | Ramaswamy et al. |
| 2005/0031097 A1 | 2/2005 | Rabenko et al. |
| 2005/0049923 A1 | 3/2005 | Tanaka et al. |
| 2005/0058192 A1 | 3/2005 | Lee |
| 2005/0060635 A1 | 3/2005 | Eroz et al. |
| 2005/0089095 A1 | 4/2005 | Choi et al. |
| 2005/0090235 A1 | 4/2005 | Vermola et al. |
| 2005/0097428 A1 | 5/2005 | Chang et al. |
| 2005/0111586 A1 | 5/2005 | Kang et al. |
| 2005/0118984 A1 | 6/2005 | Akiyama et al. |
| 2005/0129132 A1 | 6/2005 | Choi et al. |
| 2005/0132413 A1 | 6/2005 | Barreyro et al. |
| 2005/0141606 A1 | 6/2005 | Choi et al. |
| 2005/0152446 A1 | 7/2005 | Choi et al. |
| 2005/0157758 A1 | 7/2005 | Yoo |
| 2005/0162886 A1 | 7/2005 | Jeong et al. |
| 2005/0172208 A1 | 8/2005 | Yoon |
| 2005/0175080 A1 | 8/2005 | Bouillett |
| 2005/0218237 A1 | 10/2005 | Laptstun et al. |
| 2005/0249300 A1 | 11/2005 | Jeong et al. |
| 2005/0249301 A1 | 11/2005 | Jeong et al. |
| 2005/0271158 A1 | 12/2005 | Birru |
| 2006/0015914 A1 | 1/2006 | Lee |
| 2006/0029159 A1 | 2/2006 | Oh et al. |
| 2006/0039460 A1 | 2/2006 | Fimoff et al. |
| 2006/0039503 A1 | 2/2006 | Choi et al. |
| 2006/0052052 A1 | 3/2006 | Jung et al. |
| 2006/0053436 A1 | 3/2006 | Allwein et al. |
| 2006/0072623 A1 | 4/2006 | Park |
| 2006/0078003 A1 | 4/2006 | Watanabe et al. |
| 2006/0078071 A1 | 4/2006 | Lee |
| 2006/0078072 A1 | 4/2006 | Cheon et al. |
| 2006/0085726 A1 | 4/2006 | Rhee et al. |
| 2006/0104391 A1 | 5/2006 | Choi et al. |
| 2006/0126757 A1 | 6/2006 | Choi et al. |
| 2006/0130099 A1 | 6/2006 | Rooyen |
| 2006/0133429 A1 | 6/2006 | Seo et al. |
| 2006/0140301 A1 | 6/2006 | Choi et al. |
| 2006/0146797 A1 | 7/2006 | Lebizay |
| 2006/0146951 A1* | 7/2006 | Chiu .................. H04B 1/7176 375/267 |
| 2006/0146955 A1 | 7/2006 | Choi et al. |
| 2006/0159183 A1 | 7/2006 | Gaddam et al. |
| 2006/0181797 A1 | 8/2006 | Sugawara et al. |
| 2006/0203127 A1 | 9/2006 | Choi et al. |
| 2006/0203944 A1 | 9/2006 | Kwak et al. |
| 2006/0212910 A1 | 9/2006 | Endres et al. |
| 2006/0223461 A1 | 10/2006 | Laroia et al. |
| 2006/0227857 A1* | 10/2006 | Gaal .................. H04L 25/03159 375/150 |
| 2006/0245488 A1 | 11/2006 | Puputti et al. |
| 2006/0245505 A1 | 11/2006 | Limberg |
| 2006/0245516 A1 | 11/2006 | Simon |
| 2006/0246836 A1 | 11/2006 | Simon |
| 2006/0248563 A1 | 11/2006 | Lee et al. |
| 2006/0253890 A9 | 11/2006 | Park et al. |
| 2006/0262227 A1 | 11/2006 | Jeong |
| 2006/0262744 A1 | 11/2006 | Xu et al. |
| 2006/0262863 A1 | 11/2006 | Park et al. |
| 2006/0268673 A1 | 11/2006 | Roh et al. |
| 2006/0269012 A1 | 11/2006 | Kim et al. |
| 2006/0285608 A1 | 12/2006 | Kim et al. |
| 2007/0019579 A1 | 1/2007 | Xu et al. |
| 2007/0053606 A1 | 3/2007 | Ali |
| 2007/0071110 A1 | 3/2007 | Choi et al. |
| 2007/0076584 A1 | 4/2007 | Kim et al. |
| 2007/0076585 A1 | 4/2007 | Kim et al. |
| 2007/0076586 A1 | 4/2007 | Kim et al. |
| 2007/0076721 A1 | 4/2007 | Kim et al. |
| 2007/0076758 A1 | 4/2007 | Kim et al. |
| 2007/0086488 A1 | 4/2007 | Kim et al. |
| 2007/0092027 A1 | 4/2007 | Yu et al. |
| 2007/0092043 A1 | 4/2007 | Yu et al. |
| 2007/0094566 A1 | 4/2007 | Park et al. |
| 2007/0094567 A1 | 4/2007 | Park et al. |
| 2007/0098114 A1 | 5/2007 | Hundhausen et al. |
| 2007/0110393 A1 | 5/2007 | Jang |
| 2007/0113145 A1 | 5/2007 | Yu et al. |
| 2007/0121681 A1 | 5/2007 | Kang et al. |
| 2007/0127598 A1 | 6/2007 | Kang et al. |
| 2007/0130495 A1 | 6/2007 | Yoon et al. |
| 2007/0135166 A1 | 6/2007 | Ding et al. |
| 2007/0136643 A1 | 6/2007 | Kang et al. |
| 2007/0140368 A1 | 6/2007 | Kim et al. |
| 2007/0140384 A1 | 6/2007 | Choi et al. |
| 2007/0147432 A1 | 6/2007 | Kang et al. |
| 2007/0147549 A1 | 6/2007 | Choi et al. |
| 2007/0147550 A1 | 6/2007 | Choi et al. |
| 2007/0168842 A1 | 7/2007 | Jeong et al. |
| 2007/0168844 A1 | 7/2007 | Jeong et al. |
| 2007/0171941 A1 | 7/2007 | Lee et al. |
| 2007/0172003 A1 | 7/2007 | Kim et al. |
| 2007/0195889 A1 | 8/2007 | Hong et al. |
| 2007/0201544 A1 | 8/2007 | Zhu et al. |
| 2007/0211769 A1 | 9/2007 | Lee et al. |
| 2007/0217499 A1 | 9/2007 | Limberg |
| 2007/0217551 A1 | 9/2007 | Kang et al. |
| 2007/0230387 A1 | 10/2007 | Roh et al. |
| 2007/0230607 A1 | 10/2007 | Yu et al. |
| 2007/0248055 A1 | 10/2007 | Jain et al. |
| 2007/0253502 A1 | 11/2007 | Park et al. |
| 2007/0268979 A1 | 11/2007 | Chang et al. |
| 2007/0274401 A1 | 11/2007 | Lee et al. |
| 2008/0008155 A1 | 1/2008 | Yoon et al. |
| 2008/0019466 A1 | 1/2008 | Limberg |
| 2008/0049824 A1 | 2/2008 | Yang et al. |
| 2008/0063089 A1 | 3/2008 | Chen |
| 2008/0069147 A1 | 3/2008 | Lee et al. |
| 2008/0080082 A1 | 4/2008 | Erden et al. |
| 2008/0095096 A1 | 4/2008 | Cho et al. |
| 2008/0112479 A1 | 5/2008 | Garmany et al. |
| 2008/0123615 A1 | 5/2008 | Hoshino et al. |
| 2008/0134007 A1 | 6/2008 | Lee et al. |
| 2008/0137525 A1 | 6/2008 | Liu |
| 2008/0151937 A1 | 6/2008 | Lee et al. |
| 2008/0151942 A1 | 6/2008 | Lee et al. |
| 2008/0152035 A1 | 6/2008 | Lee et al. |
| 2008/0159279 A1 | 7/2008 | Younis et al. |
| 2008/0170162 A1 | 7/2008 | Kim et al. |
| 2008/0239161 A1 | 10/2008 | Kim et al. |
| 2008/0240293 A1 | 10/2008 | Kim et al. |
| 2008/0267307 A1 | 10/2008 | Chang et al. |
| 2008/0273121 A1 | 11/2008 | Jeong et al. |
| 2008/0273589 A1 | 11/2008 | Kim et al. |
| 2008/0279270 A1 | 11/2008 | Zeng |
| 2009/0028230 A1 | 1/2009 | Leitner |
| 2009/0034629 A1 | 2/2009 | Suh et al. |
| 2009/0037794 A1 | 2/2009 | Choi et al. |
| 2009/0059086 A1 | 3/2009 | Lee et al. |
| 2009/0060097 A1 | 3/2009 | Kim et al. |
| 2009/0077588 A1 | 3/2009 | Sugai |
| 2009/0103657 A1 | 4/2009 | Park et al. |
| 2009/0103660 A1 | 4/2009 | Park et al. |
| 2009/0111486 A1 | 4/2009 | Burstrom |
| 2009/0116580 A1 | 5/2009 | Park et al. |
| 2009/0180571 A1 | 7/2009 | Song et al. |

(56) References Cited

U.S. PATENT DOCUMENTS

| | | |
|---|---|---|
| 2009/0201997 A1 | 8/2009 | Kim et al. |
| 2009/0262799 A1 | 10/2009 | Limberg |
| 2009/0285137 A1 | 11/2009 | Fujita et al. |
| 2010/0050047 A1 | 2/2010 | Choi et al. |
| 2010/0061476 A1 | 3/2010 | Kim et al. |
| 2010/0115379 A1 | 5/2010 | Gubbi et al. |
| 2010/0118206 A1 | 5/2010 | Gao et al. |
| 2010/0180294 A1 | 7/2010 | Yun et al. |
| 2010/0189122 A1 | 7/2010 | Dandekar et al. |
| 2010/0226392 A1 | 9/2010 | Lee et al. |
| 2010/0257435 A1 | 10/2010 | Kim et al. |
| 2010/0309969 A1 | 12/2010 | Kim et al. |
| 2010/0310015 A1 | 12/2010 | Choi et al. |
| 2010/0316110 A1 | 12/2010 | Choi et al. |
| 2010/0322091 A1 | 12/2010 | Savoor et al. |
| 2011/0075710 A1 | 3/2011 | Park et al. |
| 2011/0083056 A1 | 4/2011 | Choi et al. |
| 2011/0085603 A1 | 4/2011 | Lee et al. |
| 2011/0116541 A1 | 5/2011 | Choi et al. |
| 2011/0280301 A1 | 11/2011 | Lee et al. |
| 2012/0008716 A1 | 1/2012 | Lee et al. |

FOREIGN PATENT DOCUMENTS

| | | |
|---|---|---|
| CN | 1582580 | 2/2005 |
| EP | 0526833 | 2/1993 |
| EP | 1 133 128 A1 | 9/2001 |
| EP | 1211822 | 6/2002 |
| EP | 1566905 | 8/2005 |
| EP | 1628420 | 2/2006 |
| EP | 1689103 | 8/2006 |
| JP | 11261906 | 9/1999 |
| JP | 2000224136 | 8/2000 |
| JP | 2001274769 | 10/2001 |
| JP | 2002218339 | 8/2002 |
| JP | 2003032640 | 1/2003 |
| JP | 2003209525 | 7/2003 |
| JP | 2003284037 | 10/2003 |
| JP | 2004129126 | 4/2004 |
| JP | 2005094354 | 4/2005 |
| JP | 2006148543 | 6/2006 |
| JP | 2007010368 | 1/2007 |
| JP | 2007096403 | 4/2007 |
| KR | 0166923 | 3/1999 |
| KR | 1020000040481 | 7/2000 |
| KR | 10-2002-0082268 | 10/2002 |
| KR | 10-2002-0094426 | 12/2002 |
| KR | 10-2003-0011308 | 2/2003 |
| KR | 1020030026236 | 3/2003 |
| KR | 1020030037138 | 5/2003 |
| KR | 20030078354 | 10/2003 |
| KR | 20040032283 | 4/2004 |
| KR | 20040074345 | 8/2004 |
| KR | 10-2004-0104238 | 12/2004 |
| KR | 10-2005-0049923 | 5/2005 |
| KR | 20050065898 | 6/2005 |
| KR | 10-2005-0077255 | 8/2005 |
| KR | 1020050093921 | 9/2005 |
| KR | 10-2005-0097438 | 10/2005 |
| KR | 10-0523054 | 10/2005 |
| KR | 10-2005-0109052 | 11/2005 |
| KR | 10-2005-0111535 | 11/2005 |
| KR | 20050121504 | 12/2005 |
| KR | 1020060009737 | 2/2006 |
| KR | 1020060012510 | 2/2006 |
| KR | 10-2006-0057266 | 5/2006 |
| KR | 1020060039728 | 5/2006 |
| KR | 20060063258 | 6/2006 |
| KR | 20060068989 | 6/2006 |
| KR | 1020060062464 | 6/2006 |
| KR | 1020060063867 | 6/2006 |
| KR | 1020060065435 | 6/2006 |
| KR | 1020060070665 | 6/2006 |
| KR | 1020060072573 | 6/2006 |
| KR | 1020060088622 | 8/2006 |
| KR | 1020060095126 | 8/2006 |
| KR | 1020060095235 | 8/2006 |
| KR | 1020060102160 | 9/2006 |
| KR | 10-2006-0112159 | 10/2006 |
| KR | 20060112499 | 11/2006 |
| KR | 1020060117484 | 11/2006 |
| KR | 100661005 | 12/2006 |
| KR | 1020060133011 | 12/2006 |
| KR | 1020070007995 | 1/2007 |
| KR | 20070024162 | 3/2007 |
| KR | 1020070034215 | 3/2007 |
| KR | 10-0724891 | 6/2007 |
| KR | 1020070068960 | 7/2007 |
| KR | 20070091962 | 9/2007 |
| WO | 99/21323 | 4/1999 |
| WO | 00/44145 | 7/2000 |
| WO | 00/45552 | 8/2000 |
| WO | 02/37744 | 5/2002 |
| WO | WO 02/085014 A1 | 10/2002 |
| WO | 03/009197 | 1/2003 |
| WO | 2005/101655 | 10/2005 |
| WO | 2005/109878 | 11/2005 |
| WO | 2006003531 | 1/2006 |
| WO | WO 2006/030329 A1 | 3/2006 |
| WO | 2006/037925 | 4/2006 |
| WO | 2006/093389 | 9/2006 |
| WO | 2007/008028 | 1/2007 |
| WO | 2007/021157 | 2/2007 |
| WO | 2007/1068294 | 6/2007 |
| WO | 2007/091779 | 8/2007 |
| WO | 2008105587 | 9/2008 |
| WO | WO 2008/117981 A1 | 10/2008 |

OTHER PUBLICATIONS

Integrated interleaving error correcting code and high-dimensional parity codes, Kamabe et al, IEEE, 20005, IEEE Transactions on Magnetics (vol. 41, Issue: 10, Oct. 2005 ).*

QRPp1-6: Adaptive Forward Error Correction for Interactive Streaming Over the Internet, Filho et al, IEEE, 2006, Global Telecommunications Conference, 2006. GLOBECOM '06. IEEE, Nov. 27-Dec. 1, 2006.*

Korean Intellectual Property Office Application Serial No. 10-2006-0052094, Notice of Allowance dated Jan. 28, 2013, 2 pages.

U.S. Appl. No. 13/418,297, Notice of Allowance dated Mar. 15, 2013, 12 pages.

U.S. Appl. No. 13/490,401, First Action Interview Pilot Program Pre-Interview Communication dated Mar. 22, 2013, 2 pages.

U.S. Appl. No. 13/442,810, Notice of Allowance dated May 10, 2013, 12 pages.

U.S. Appl. No. 12/961,794, First Action Interview Pilot Program Pre-Interview Communication dated Apr. 21, 2013, 2 pages.

Korean Intellectual Property Office Application Serial No. 10-2006-0108038, Notice of Allowance dated Apr. 17, 2013, 2 pages.

Korean Intellectual Property Office Application Serial No. 10-2007-0029485, Notice of Allowance dated Jun. 26, 2013, 2 pages.

Korean Intellectual Property Office Application Serial No. 10-2007-0031960, Notice of Allowance dated Jun. 26, 2013, 2 pages.

U.S. Appl. No. 13/490,401, First Action Interview Pilot Program Pre-Interview Communication dated Jun. 26, 2013, 6 pages.

Yao, J., "IP Datacasting and Channel Error Handling With DVB-H", Graduate Institute of Communication Engineering, National Taiwan University, XP-010856441, 3 pages, 2005.

Kim, Sung-Noon et al.; "Enhanced-x VSB System Development for Improving ATSC Terrestrial DTV Transmission Standard", IEEE Transaction on Broadcasting, vol. 52, No. 2, Jun. 2006, 8 pages.

Touzni, A et al.; "Enhanced 8-VSB TRansmission for North American HDTV Terrestrial Broadcast"; IEEE Zenith Electronics, Lincolnshire, Il., XP010640975, 4 pages, 2003.

Gaddam, V.R.; "A Newly Proposed ATSC DTV System for Transmitting A Robust Bit-Stream Along With the Standard Bit-Stream", IEEE: Philips Research, USA., XP001201224, IEEE Transactions on Consumer Electronics, vol. 49, No. 4, Nov. 2003, 6 pages.

Chernock, Rich; "PSIP Generation and ATSC Stream Monitoring"; WEBE SMPTE, Oct. 8, 2004, 46 pages.

(56) References Cited

OTHER PUBLICATIONS

Advanced Television Systems Commitee; "Recommended practice: Guide to the Use of the ATSC Digital television Standard, Including Corrigendum No. 1"; Doc A/54A; Dec. 20, 2006, 110 pages.
European Telecommunication Standards Institute (ETSI); "Digital Video Broadcasting (DVB); DVB-H Implementation Guidelines"; ETSI TR 102 377 V 1.2.1 (Nov. 2005), Nov. 2005, 104 pages.
ISO/IEC 13818-1; International Standard; Information Technology—Generic Coding of Moving Pictures and Associated Audio Information: Systems; Second Edition; Dec. 1, 2000, 174 pages.
Federal Information Processing Standards Publication 197; Announcing the Advanced Encryption Standard (AES); Nov. 26, 2001, 51 pages.
Advanced Television Systems Committee; "ATSC Recommended Practice: E-VSB Implementation Guidelines"; Doc A/112, Apr. 18, 2006, 116 pages.
Graell, A. ; "Analysis and Design of Rate Compatible Serial Concatenated Convolution Codes"; Proceedings of the 2005 International Symposium on Information Theory; pp. 607-611; Sep. 4, 2005.
Digital Video Broadcasting (DVB); DVB-H Implementation Guidelines; DVB Document A092 Rev. 02, May 2007, 111 pages.
European Telecommunication Standards Institute (ETSI); "Radio Broadcasting Systems; Digital Audio Broadcasting (DAB) to Mobile, Portable and Fixed Receivers"; ETSI EN 300 401 V1.4.1. Jun. 2006, 202 pages.
Meyers, et al.; "Joint Carrier Phase and Symbol Timing Recovery for PAM Systems"; IEEE Transactions on Communications; vol. COM-28; No. 8; pp. 1121-1129; Aug. 1, 1980; XP000758588.
Hopkins, R., "Digital Terrestrial HDTV for North America—The Grand Alliance HDTV System," European Broadcasting Union (EBU) Review Technical, XP-000438385, pp. 36-50, Aug. 1994.
Fimoff, M, et al.; "E-VSB Map Signaling", IEEE Transactions on Consumer Electronics; vol. 49; Issue 3; pp. 515-518; Aug. 2003.
Uehara, M., et al.; "Transmission Scheme for the Terrestrial ISDB System"; IEEE Transactions on Consumer Electronics; vol. 45; Issue 1; Feb. 1999, 6 pages.
Advanced Television Systems Committee; "ATSC Standard; Digital Television Standard (A/53), Revision D, Including Amendment No. 1"; Doc A/53D; Jul. 19, 2005, 4 pages.
Lambrette, U., et al., "Variable Sample Rate Digital Feedback NDA Timing Synchronization," Global Telecommunications Conference on Communications: The Key to Global Prosperity, vol. 2, pp. 1348-1352, Nov. 1996.
Kim, et al., "Non-systematic RS Encoder Design for a Parity Replacer of ATSC-M/H System", IEEE Transactions on Consumer Electronics, vol. 56, No. 3, pp. 1270-1274, Aug. 2010.
Bretl, et al., "ATSC RF, Modulation, and Transmission", Proceedings of the IEEE, vol. 94, No. 1, pp. 44-59, Jan. 2006.
Bretl, et al., "E-VSB-AN 8-VSB Compatible System with Improved White Noise and Multipath Performance", Consumer Electronics, IEEE Transactions on, vol. 47, No. 3, pp. 307-312, Aug. 2001.
Kim, et al., "Enhanced-xVSB System Development for Mobile/Portable Reception", Consumer Electronics, ICCE, 2005 Digest of Technical Papers, International Conference on, pp. 419-420, 2005.
G. Sgrignoli, "Preliminary DTV Field Test Results and Their Effects on VSB Receiver Design", IEEE Transactions on Consumer Electronics, vol. 45, No. 3, Aug. 1999, 22 pages.
Zhang et al., "Future Transmitter/Receiver Diversity Schemes in Broadcast Wireless Networks", IEEE Communications Magazine, Oct. 2006, 8 pages.
Fazel et al., "A Hierarchical Digital HDTV Transmission Scheme for Terrestrial Broadcasting," 1993, 6 pages.
Lee et al., "ATSC-M/H Hardware Multiplexer using Simple Bus Arbitration and Rate Adaptation", Sep. 2011, 7 pages.
Kim et al., "Enhanced-xVSB System Development for Mobile/Portable Reception", Feb. 2005, 5 pages.
Korean Intellectual Property Office Application Serial No. 10-2006-0013128, Notice of Allowance dated Nov. 20, 2012, 2 pages.
Korean Intellectual Property Office Application Serial No. 10-2006-0039118, Notice of Allowance dated Nov. 28, 2012, 2 pages.
Ardakani, et al., "Low-Density Parity-Check Coding for Impulse Noise Correction on Power-Line Channels," IEEE, 2005, 5 pages.
Cardarilli, et al., "FPGA oriented design of parity sharing RS codecs," Proceedings of the 2005 20th IEEE International Symposium on Defect and Fault Tolerance in VLSI Systems, 2005, 7 pages.
EBU-UER, "Digital Video Broadcasting (DVB); Framing structure, channel coding and modulation for digital terrestrial television", ETSI EN 300 744, vol. BC, No. V1.5.1, Nov. 1, 2004, pp. 1-64, XP014026912.
U.S. Appl. No. 14/591,698, filed Jan. 7, 2015.
Korean Intellectual Property Office Application Serial No. 10-2006-0046303, Notice of Allowance dated Mar. 18, 2013, 2 pages.

\* cited by examiner

FIG. 5
(a) 
(b) 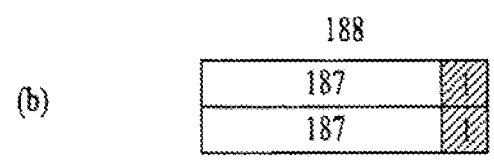
(c) 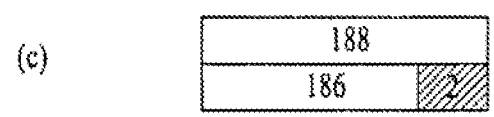

DIGITAL TELEVISION TRANSMITTING SYSTEM AND RECEIVING SYSTEM AND METHOD OF PROCESSING BROADCAST DATA

This application is a continuation of U.S. application Ser. No. 13/720,927, filed on Dec. 19, 2012, currently pending, which is a continuation of U.S. application Ser. No. 11/752,870, filed on May 23, 2007, now U.S. Pat. No. 8,351,497, which claims the benefit of earlier filing date and right of priority to Korean Patent Application No. 10-2006-0046303, filed on May 23, 2006, and Korean Patent Application No. 10-2006-0089736, filed on Sep. 15, 2006, and also claims the benefit of U.S. Provisional Application No. 60/883,998, filed on Jan. 8, 2007, the contents of all of which are hereby incorporated by reference herein in their entireties.

BACKGROUND OF THE INVENTION

Field of the Invention

The present invention relates to digital television (DTV) systems and methods of processing broadcast data.

Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitting system and a DTV receiving system and a method of processing broadcast data that substantially obviate one or more problems due to limitations and disadvantages of the related art.

An object of the present invention is to provide a DTV transmitting system and a DTV receiving system and a method of processing broadcast data that is suitable for transmitting supplemental data and that is highly resistant to noise.

Another object of the present invention is to provide a DTV transmitting system and a DTV receiving system and a method of processing broadcast data that can perform additional encoding on enhanced data and transmitting the processed enhanced data, thereby enhancing the performance of the receiving system.

A further object of the present invention is to provide a DTV transmitting system and a DTV receiving system and a method of processing broadcast data that can multiplex known data that are already known by a receiving system and/or a transmitting system and enhanced data with main data, and transmit the multiplexed data, thereby enhancing the performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a frame encoder, a randomizer, a block processor, a group formatter, a deinterleaver, and a packet formatter. The frame encoder builds an enhanced data frame and encodes the enhanced data frame for error correction by adding parity data. The frame encoder further divides the encoded data frame into first and second sub-frames including first and second portions of the parity data, respectively. The frame then permutes a plurality of the first sub-frames and a plurality of the second sub-frames, respectively. The randomizer randomizes enhanced data in the permuted sub-frames, and the block processor codes the randomized enhanced data at an effective coding rate of 1/N1. The group formatter forms a group of enhanced data having one or more data regions and inserts the enhance data coded at the effective coding rate of 1/N1 into at least one of the data regions. The deinterleaver deinterleaves the group of enhanced data, and the packet formatter formats the deinterleaved data into enhanced data packets.

In another aspect of the present invention, a digital television (DTV) receiving system includes a tuner, a demodulator, an equalizer, a block decoder, a data formatter, and a frame decoder. The tuner receives a digital broadcast signal including main and enhanced data. The demodulator demodulates the digital broadcast signal, and the equalizer compensates channel distortion of the demodulated signal. The block decoder decodes each block of enhanced data in the channel-equalized signal. The data deformatter deformats the decoded enhanced data and derandomizes the deformatted enhanced data. The frame decoder forms a group of first sub-frames and a group of second sub-frames and performs reverse permutation on the group of first sub-frames and the group of second sub-frames, respectively. Each first sub-frame includes the derandomized enhanced data and first parity data, and each second sub-frame includes second parity data. The frame decoder further forms an enhanced data frame by combining the first and second sub-frames and decodes the enhanced data frame for error correction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 5(a) to FIG. 5(c) illustrate examples showing the steps of an error detection encoding process according to an embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. By performing additional encoding on the enhanced data and by transmitting the processed data, the present invention may provide robustness to the enhanced data, thereby enabling the data to respond more effectively to the channel environment that undergoes frequent changes. For example, the present invention may perform each of an error correction encoding process, an error detection encoding process, and a row permutation process at least once on the enhanced data.

Figure 1:
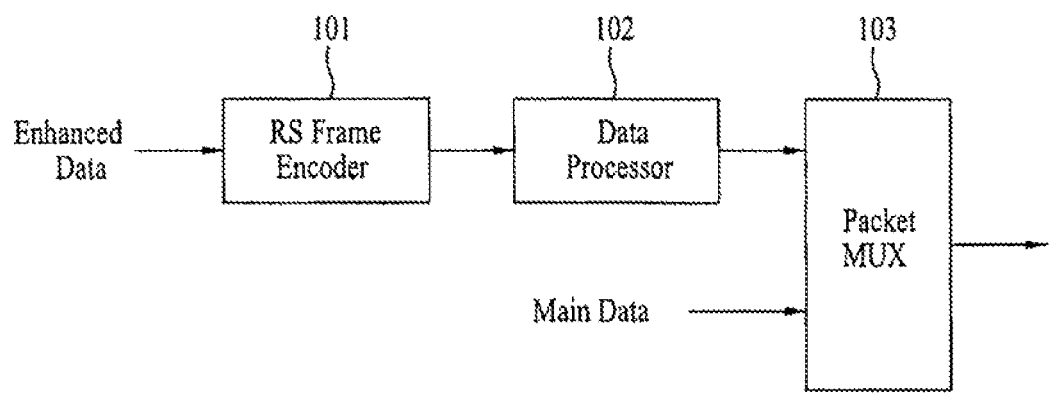
FIG. 1 illustrates a general diagram of a digital broadcast transmitting system according to the present invention.

FIG. 1 illustrates a block diagram showing a unit of a digital broadcast transmitting system for performing the error correction encoding process according to the present invention. The unit includes a RS frame encoder 101, a data processor 102, and a packet multiplexer 103. In the above-described structure of the present invention, the main data are inputted to the packet multiplexer 103, and the enhanced data are inputted to the RS frame encoder 101. Herein, additional encoding processes are performed on the enhanced data, thereby providing robustness to the enhanced data, so that the enhanced data can respond effectively and instantly to the noise and change in channel. The RS frame encoder 101 receives the enhanced data and configures frames for the additional encoding processes. Encoding processes such as the error correction encoding process, the error detection encoding process, and the row permutation process are performed on the configured frames, which are then outputted to the data processor 102. The encoding processes will be described in more detail in a later process.

The data processor 102 processes the enhanced data that are outputted from the RS frame encoder 101 with a data randomizing, data expansion, data group configuration, and data deinterleaving. Thereafter, the processed data are outputted to the packet multiplexer 103 in a MPEG TS packet format (i.e., enhanced data packets) of 188-byte units. More specifically, as one of the processes performed by the data processor 102, the data processor 102 configures data groups divided into a plurality of hierarchical areas (or layers). Then, by taking the characteristics of the hierarchically divided areas and the characteristics of the enhanced data, the enhanced data are inserted into each of the hierarchically divided areas within the data group.

In the example set forth in the description of the present invention, with respect to the data configuration prior to the data deinterleaving process, the data group may be divided into 3 hierarchical areas: a head area, a body area, and a tail area. More specifically, based on the data group being data-interleaved and outputted, the portion being outputted first corresponds to the head area, the portion being outputted next corresponds to the body area, and the portion being outputted last corresponds to the tail area. At this point, with respect to the data group being that is inputted for data deinterleaving, data may be allocated to each the head, body, and tail areas of the data group so that the body area is entirely configured of the enhanced data, thereby preventing the enhanced data from being mixed with the main data in the body area.

The data group is divided into 3 different areas so that each area may function and be used differently. More specifically, the body area is allocated with enhanced data only so as to prevent any interference with the main data from occurring, thereby enabling more robust and effective receiving performance. On the other hand, in the head and tail areas, the enhanced data are mixed with the main data in accordance with the output order of the data from the interleaver. Thus, the receiving performance of the head and tail areas may be deteriorated as compared to that of the body area. Further, if a system inserting known data in the data group and outputting the known data inserted data group is used, and when a consecutively long set of known data is to be periodically inserted in the enhanced data, such known data may be inserted in the body area where the enhanced data are not mixed with the main data.

In other words, known data having a constant pre-determined length may be periodically inserted in the body area. However, it is difficult to periodically insert such known data having a constant pre-determined length in the head area and/or the tail area. It is also difficult to insert data having a consecutively long length. Meanwhile, the packet multiplexer 103 multiplexes the inputted enhanced data packet and main data packet in accordance with a pre-defined multiplexing method. The multiplexed data packets are then outputted. Hereinafter, the encoding processes of the RS frame encoder 101 will now be described in detail. The encoding processes performed on the enhanced data will be described in detail according to first and second embodiment of the present invention.

First Embodiment

According to a first embodiment of the present invention, the RS frame encoder 101 performs a primary error correction encoding process on the received enhanced data in a column direction. Thereafter, the RS frame encoder 101 performs a secondary error correction encoding process on the primarily error correction encoded enhanced data in a row direction, thereby providing robustness to the enhanced data. At this point, the present invention may also perform the primary error correction encoding process in a row direction, and perform the secondary error correction encoding process in a column direction. Furthermore, the present invention may also sequentially perform a row permutation process and an error detection process on processed enhanced data. Herein, the row permutation process consists of permuting enhanced data in equal sizes so as to scatter group error that may occur during changes in a frequency environment, thereby enabling the enhanced data to respond to the frequency environment, which is extremely vulnerable and liable to frequent changes.

Figure 2:
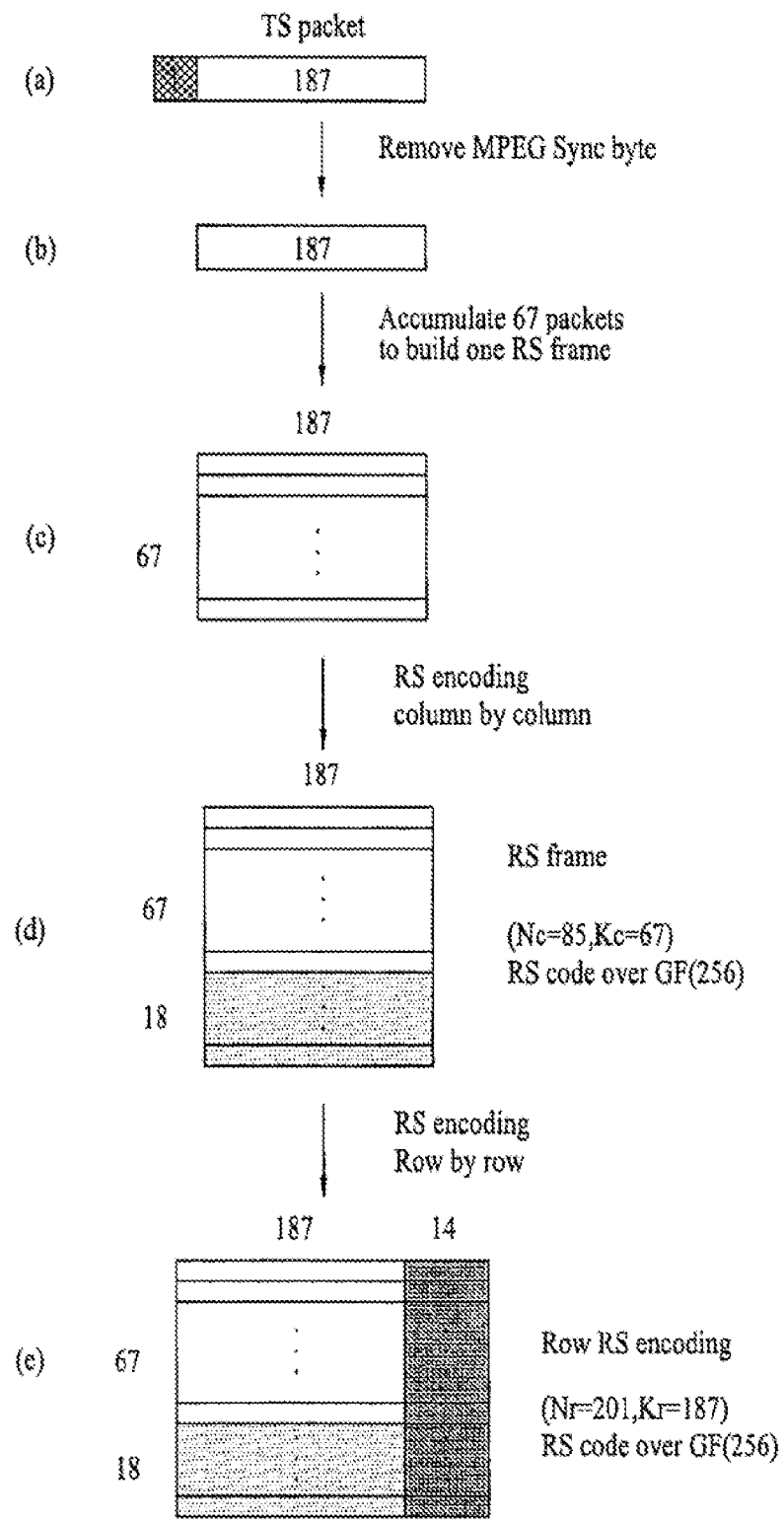
FIG. 2(a) to FIG. 2(e) illustrate examples showing the steps of an error correction encoding process according to a first embodiment of the present invention.

FIG. 2(*a*) to FIG. 2(*e*) illustrate examples showing the steps of an error correction encoding process according to a first embodiment of the present invention. In this embodiment, the inputted enhanced data are divided into units of an equal length A. A plurality of A-length enhanced data units is grouped to configure a RS frame. Then, a primary error correction encoding process is performed on the configured frame in a column direction, thereby adding parity data to the primarily error correction encoded enhanced data in a column direction. Subsequently, a secondary error correction encoding process is performed in a column direction on the enhanced data having parity data added thereto in a row direction, thereby adding parity data to the secondarily error correction encoded enhanced data in a row direction.

In the present invention, the particular length A will be referred to as the row for simplicity. Herein, the value A will be decided by the system designer. Additionally, in this example, the error correction encoding process adopts the RS encoding process. For example, if the inputted enhanced data correspond to a MPEG transport stream (TS) packet configured of 188-byte units, the first MPEG synchronization byte is removed, as shown in FIG. 2(*a*), thereby configuring a 187-byte row A, as shown in FIG. 2(*b*). Herein, the first MPEG synchronization byte is removed because each of enhanced data packets has the same value. If a fixed byte that can be removed is not included in the inputted enhanced data, or if the length of the inputted packet is not 187 bytes, the input data are divided into 187-byte units, thereby configuring a row A divided into 187 bytes. In a row A is decided in accordance with the above-described process, a plurality of rows (A's) is grouped to form a RS frame. As shown in FIG. 2(*c*), in the first embodiment of the present invention, 67 rows are grouped to form a single RS frame.

A (Nc,Kc)-RS encoding process is performed on each column in the RS frame so as to generate Nc-Kc number of parity bytes. Then, the generated Nc-Kc number of parity bytes are added at the end portion of each corresponding column (i.e., after the 67$^{th}$ row of each corresponding column). In this example, Nc is equal to 85, and Kc is equal to 67 (i.e., Nc=85 and Kc=67). Accordingly, the parity data being added to each column, as shown in FIG. 2(*d*), correspond to 18 bytes. When the (85,67)-RS encoding process is performed on each of the 187 columns within the RS frame, a RS frame includes 187 bytes in each row and 85 bytes in each column. In other words, the RS frame configured as a result of the primary error correction encoding process includes 85 rows each configured of 187 bytes.

Subsequently, a (Nr,Kr)-RS encoding process is performed on each row in the RS frame, which is RS-encoded in a column direction as shown in FIG. 2(d), so as to generate Nr-Kr number of parity bytes. Then, the generated Nr-Kr number of parity bytes are added at the end portion of each corresponding row (i.e., after the $187^{th}$ column of each corresponding row). In this example, Nr is equal to 201, and Kr is equal to 187 (i.e., Nr=201 and Kr=187). Accordingly, the parity data being added to each row, as shown in FIG. 2(e), correspond to 14 bytes. When the (201,187)-RS encoding process is performed on each of the 85 rows within the RS frame, a RS frame includes 201 bytes in each row and 85 bytes in each column. In other words, the RS frame configured as a result of the secondary error correction encoding process includes 85 rows each configured of 201 bytes.

As described above, according to the first embodiment of the present invention, since the number of bytes configuring each row, the number of rows configuring the RS frame, and the values of Nr, Nc, Kr, and Kc, which are used for the RS encoding process may vary depending upon the system design and any other circumstances, these details are not limited only to the examples given in the first embodiment of the present invention. Meanwhile, a row permutation process may be performed on the primarily and secondarily RS encoded enhanced data, as described above. Herein, by performing the row permutation, group errors that may occur during changes in a frequency environment may be scattered, thereby enabling the enhanced data to respond to the frequency environment, which is extremely vulnerable and liable to frequent changes.

More specifically, in the present invention, the secondarily error correction encoded RS frame (i.e., the RS frame having 85 rows each configured of 201 bytes) is divided into 2 RS sub-frames. For example, the enhanced data that are inputted to the RS frame encoder 101 for the RS encoding process (i.e., payload data) and the parity data that are generated by an RS encoding process performed in a column direction are collectively referred to as a "first RS sub-frame". The parity data that are generated by an RS encoding process performed in a row direction are referred to as a "second RS sub-frame". Therefore, the first RS sub-frame includes 85 units of 187 bytes, and the second RS sub-frame includes 85 units of 14 bytes. Accordingly, a row permutation process is performed on each of the above-described first RS sub-frame and second RS sub-frame.

Figure 3:
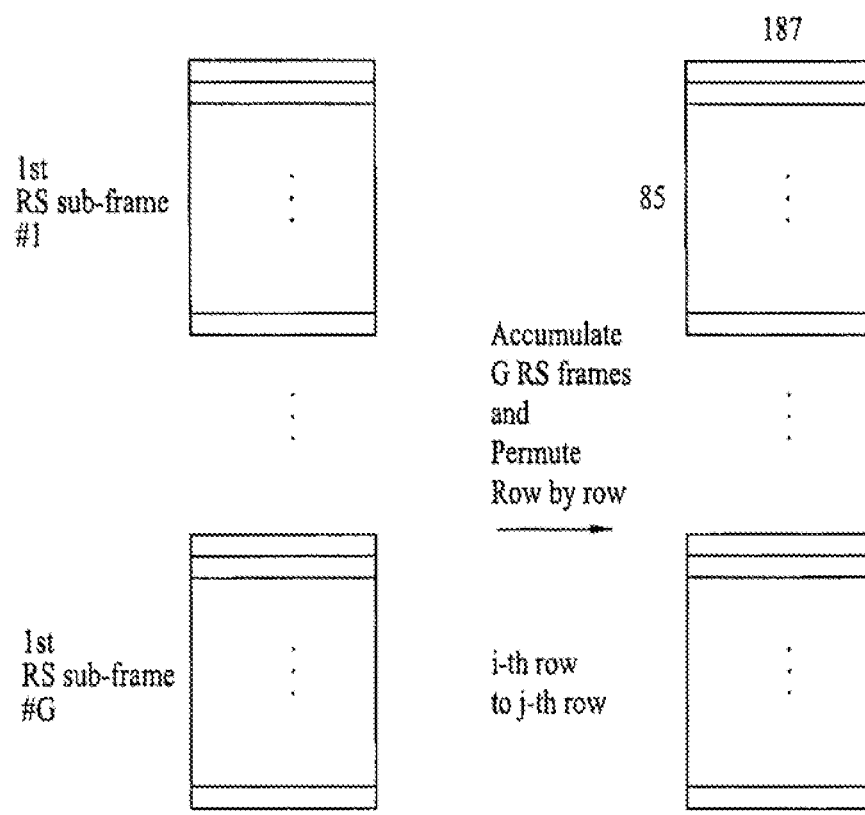
FIG. 3 and FIG. 4 illustrate examples show the step of a row permutation process according to the first embodiment of the present invention.
Figure 4:
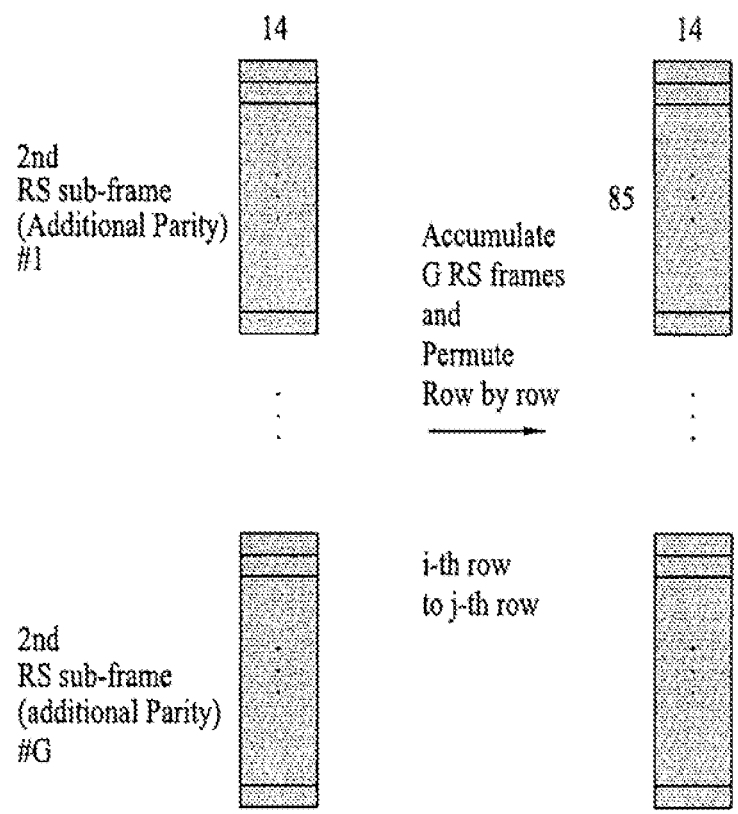

FIG. 3 illustrates a row permutation process performed on the first RS sub-frame, and FIG. 4 illustrates a row permutation process performed on the second RS sub-frame. Referring to FIG. 3, when a first RS sub-frame including 187 bytes in each row and 85 bytes in each column is configured, G number of first RS sub-frames are grouped to configure a first RS sub-frame group consisting of 85*G number of 187-byte rows. When the row permutation process is performed on the above-described first RS sub-frame group by using a predetermined method, the position of the rows may differ prior to and after the row permutation process within the first RS sub-frame group, as shown in FIG. 3. More specifically, the $i^{th}$ row of the first RS sub-frame group prior to the row permutation process is positioned in the $j^{th}$ row of the same first RS sub-frame after row permutation. The above-described relation between i and j can be easily understood with reference to Equation 1 below.

$$j=G(i \bmod 85)+\lfloor i/85 \rfloor$$

$$i=85(j \bmod G)+\lfloor j/G \rfloor \quad \text{Equation 1}$$

where 0≤i, j<85G

Herein, each row of the RS frame group is configured of 195 bytes even after being processes with row permutation.

Meanwhile, referring to FIG. 4, when a second RS sub-frame including 14 bytes in each row and 85 bytes in each column is configured, G number of second RS sub-frames are grouped to configure a second RS sub-frame group consisting of 85*G number of 14-byte rows. When the row permutation process is performed on the above-described second RS sub-frame group by using a predetermined method, the position of the rows may differ prior to and after the row permutation process within the second RS sub-frame group, as shown in FIG. 4. More specifically, the $i^{th}$ row of the second RS sub-frame group prior to the row permutation process is positioned in the $j^{th}$ row of the same second RS sub-frame after row permutation. Similarly, each row of the second RS sub-frame group is configured of 14 bytes even after the row permutation process is performed. The above-described relation between i and j of the second RS sub-frame group may be applied to the above-described Equation 1, or another row permutation method may be applied herein.

In other words, Equation 1 corresponds to a row permutation method according to the first embodiment of the present invention. Any row permutation method in which i and j may include all rows within the frame group may be used. The permutation method is not limited only to the examples given in the description of the present invention. Furthermore, in using the equation for performing row permutation on the first and second RS sub-frames, the same equation may be used on both sub-frames, or a different equation may be used on each sub-frame.

In addition, an error detection encoding process may be performed on the first RS sub-frame group that is processed with row permutation. The error detection encoding process is used for indicating whether the data of the first RS sub-frame group have been damaged by any error that may occur while the data are being transmitted to the receiving system through the channels. For example, CRC encoding may be used in the error detection encoding process. Alternatively, any error detection encoding method other than the CRC encoding method may also be used. Furthermore, an error correction encoding method may be used to enhance the overall error correction performance of the receiving system.

FIG. 5(a) to FIG. 5(c) illustrates examples of the CRC encoding process according to the present invention. More specifically, the CRC data generated by the CRC encoding process are used to indicate whether or not the enhanced data have been damaged while being transmitted through the channels. FIG. 5(a) illustrates an example of a CRC encoding process being performed by using an 8-bit checksum with the CRC data. Herein, a 1-byte CRC checksum (i.e., an 8-bit CRC checksum) is generated for 187 bytes of each row within the second RS sub-frame group. Thereafter, the generated CRC checksum is added to the row. Equation 2 (shown below) shows the equation for generating a 1-byte CRC checksum for 187 bytes.

$$g(x)=x^8+x^2+x^1+1 \quad \text{Equation 2}$$

In this case, the generated 1-byte CRC checksum may be added in any place within the row. In the example given in this embodiment, the CRC checksum is added at the end of the corresponding row, thereby configuring a row of 188 bytes.

FIG. 5(b) and FIG. 5(c) illustrate an example of a CRC encoding process being performed by using a 16-bit checksum with the CRC data. Herein, a 2-byte CRC checksum (i.e., a 16-bit CRC checksum) is generated for each 2 rows (i.e., 374 bytes). Thereafter, the generated CRC checksum is added to the corresponding row. Equation 3 (shown below) shows the equation for generating a 2-byte CRC checksum for 2 rows (i.e., 374 bytes).

$$g(x)=x^{16}+x^{12}+x^5+1 \quad \text{Equation 3}$$

In this case, the generated 2-byte CRC checksum may be added in any place within the 2 rows. In the example given in this embodiment, the 2-byte unit CRC checksum is added to a predetermined place within the 2 rows, which are then divided into 2 rows configured of 188 bytes. More specifically, FIG. 5(b) illustrates an example of adding a 1-byte CRC checksum at the end of each row, thereby configuring 2 separate rows having 188 bytes. FIG. 5(c) illustrates an example of adding a 2-byte CRC checksum at the end of the second row and, then, dividing the 2 rows, so as to configure 2 rows having 188 bytes. After being processed with the above-described CRC encoding process, the first RS sub-frame group is expanded from a RS sub-frame group having 85*G number of 187-byte rows to a RS sub-frame group having 85*G number of 188-byte rows. The first RS sub-frame group being processed with CRC encoding is then divided into G number of first RS sub-frames. The second RS sub-frame group that is processed with row permutation is also divided into G number of second RS sub-frames. Thereafter, the newly divided first and second RS sub-frames are inputted to the data processor 102.

Figure 6:
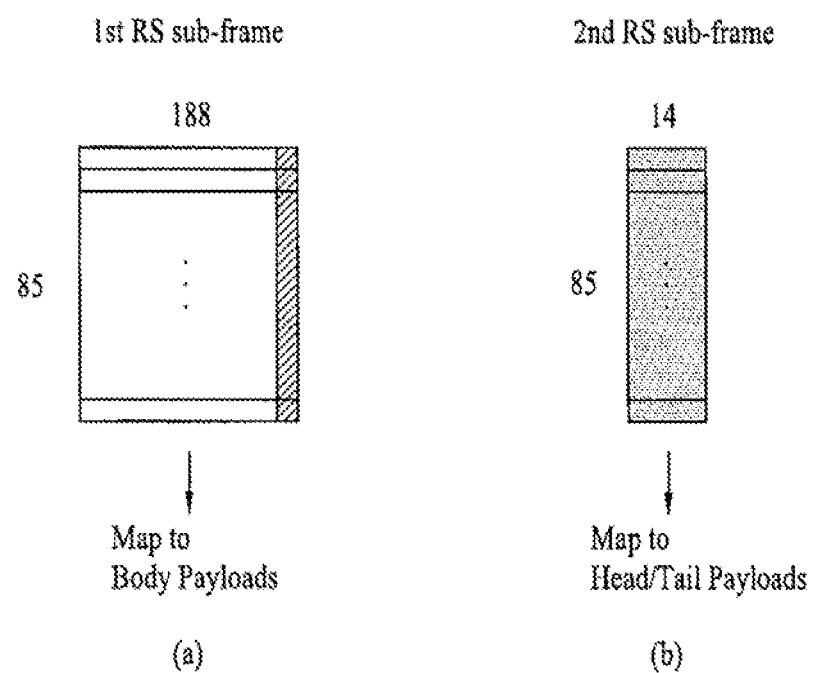
FIG. 6(a) and FIG. 6(b) illustrate examples of dividing an encoded frame into a plurality of sub-frames according to the first embodiment of the present invention.

FIG. 6(a) illustrates a structure of the first RS sub-frame being sequentially processed with RS encoding, row permutation, and CRC encoding, which is then inputted to the data processor 102. Herein, the first RS sub-frame is configured of 85 188-byte unit rows. Alternatively, FIG. 6(b) illustrates a structure of the second RS sub-frame being sequentially processed with error correction encoding and row permutation, which is then inputted to the data processor 102. Herein, the second RS sub-frame is configured of 85 14-byte unit rows. The data processor 102 takes into consideration the characteristics of the hierarchical areas within the data group and the characteristics of the first and second RS sub-frames, so as to allocate the first and second RS sub-frames to the corresponding areas within the data group. In the present invention, the first RS sub-frames being processed with CRC encoding are allocated to the body area of the data group. The second RS sub-frames being processed with row permutation are allocated to the head area and/or tail area of the data group. In other words, the data of the first RS sub-frames are allocated to the body area, and the data of the second RS sub-frames are allocated to the head area and/or tail area.

Second Embodiment

Figure 7:
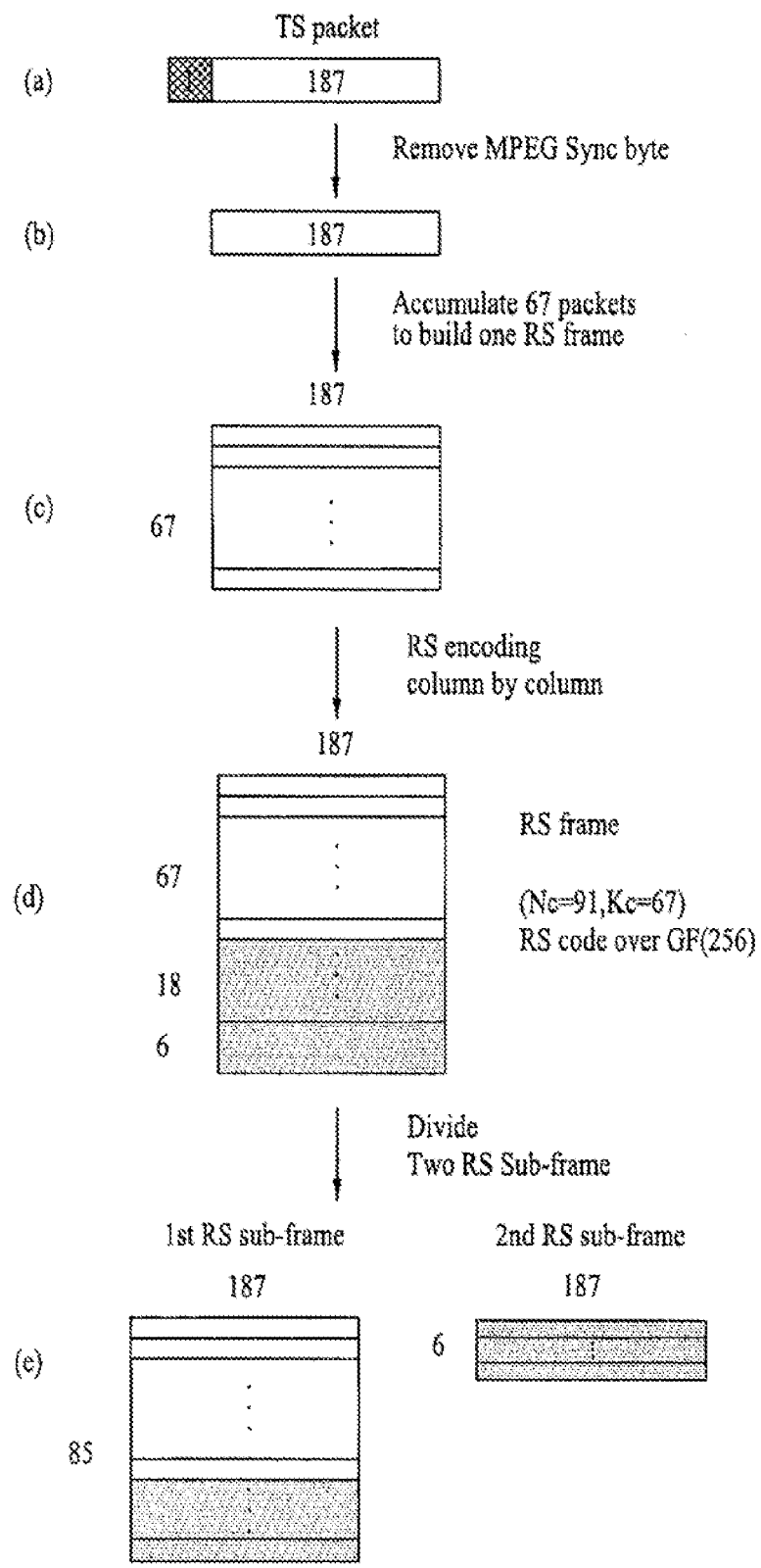
FIG. 7(a) to FIG. 7(e) illustrate examples showing the steps of an error correction encoding process according to a second embodiment of the present invention.

FIG. 7(a) to FIG. 7(e) illustrate examples showing the steps of an error correction encoding process according to a second embodiment of the present invention. In this embodiment, the inputted enhanced data are divided into units of an equal length A. A plurality of A-length enhanced data units is grouped to configure a RS frame. Then, an error correction encoding process is performed on the configured frame in a column direction, thereby adding parity data to the primarily error correction encoded enhanced data in a column direction. In the present invention, the particular length A will be referred to as the row for simplicity. Herein, the value A will be decided by the system designer. Additionally, in this example, the error correction encoding process adopts the RS encoding process. For example, if the inputted enhanced data correspond to a MPEG transport stream (TS) packet configured of 188-byte units, the first MPEG synchronization byte is removed, as shown in FIG. 7(a), thereby configuring a 187-byte row A, as shown in FIG. 7(b).

Herein, the first MPEG synchronization byte is removed because each of enhanced data packets has the same value. If a fixed byte that can be removed is not included in the inputted enhanced data, or if the length of the inputted packet is not 187 bytes, the input data are divided into 187-byte units, thereby configuring a row A divided into 187 bytes. In a row A is decided in accordance with the above-described process, a plurality of rows (A's) is grouped to form a RS frame. As shown in FIG. 7(c), in the first embodiment of the present invention, 67 rows are grouped to form a single RS frame.

A (Nc,Kc)-RS encoding process is performed on each column in the RS frame so as to generate Nc-Kc number of parity bytes. Then, the generated Nc-Kc number of parity bytes are added at the end portion of each corresponding column (i.e., after the 67$^{th}$ row of each corresponding column). In this example, Nc is equal to 91, and Kc is equal to 67 (i.e., Nc=91 and Kc=67). Accordingly, the parity data being added to each column, as shown in FIG. 7(d), correspond to 24 bytes. When the (91,67)-RS encoding process is performed on each of the 187 columns within the RS frame, a RS frame includes 187 bytes in each row and 91 bytes in each column. In other words, the RS frame configured as a result of the error correction encoding process includes 91 rows each configured of 187 bytes. In other words, each of the 187 columns within the RS frame includes 91 bytes.

As described above, according to the second embodiment of the present invention, since the number of bytes configuring each row, the number of rows configuring the RS frame, and the values of Nc and Kc, which are used for the RS encoding process may vary depending upon the system design and any other circumstances, these details are not limited only to the examples given in the first embodiment of the present invention. Meanwhile, a row permutation process may be performed on the primarily and secondarily RS encoded enhanced data, as described above. Herein, by performing the row permutation, group errors that may occur during changes in a frequency environment may be scattered, thereby enabling the enhanced data to respond to the frequency environment, which is extremely vulnerable and liable to frequent changes.

More specifically, in the present invention, the error correction encoded RS frame (i.e., the RS frame having 91 rows each configured of 187 bytes) is divided into 2 RS sub-frames. For example, the rows of the enhanced data that are inputted for the RS encoding process (i.e., payload data) and the rows of the parity data (e.g., rows including 18 of the 24 parities generated by a RS encoding process performed in a column direction) are collectively referred to as a "first RS sub-frame". The rows including the remaining 6 parities are referred to as a "second RS sub-frame". Therefore, the first RS sub-frame includes 85 units of 187 bytes, and the second RS sub-frame includes 6 units of 187 bytes. Accordingly, a row permutation process is performed on each of the above-described first RS sub-frame and second RS sub-frame.

Figure 8:
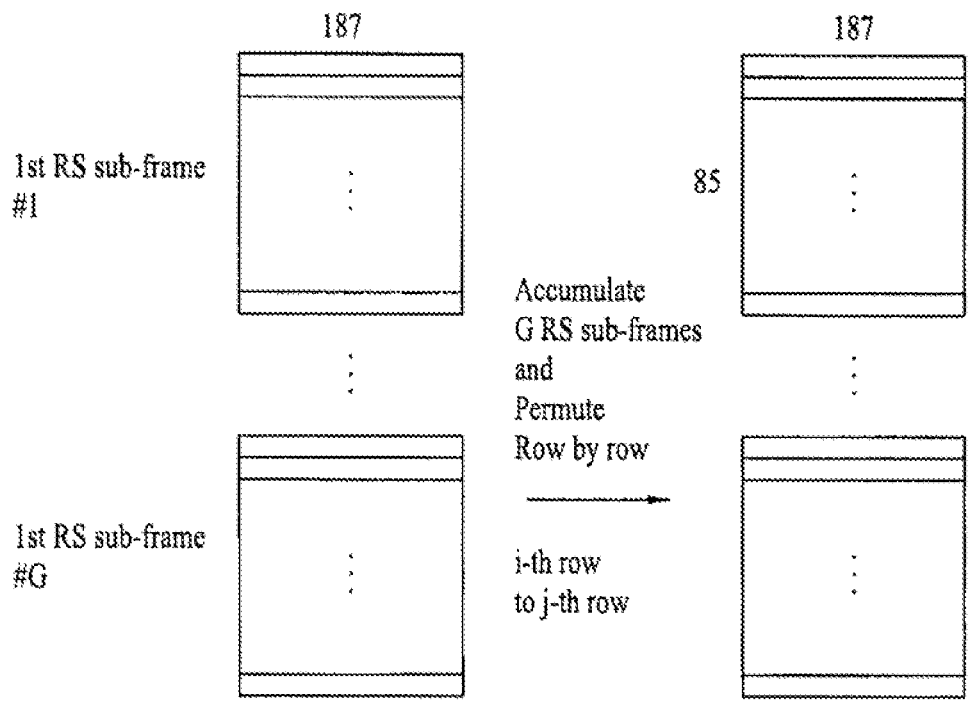
FIG. 8 and FIG. 9 illustrate examples show the step of a row permutation process according to the second embodiment of the present invention.
Figure 9:
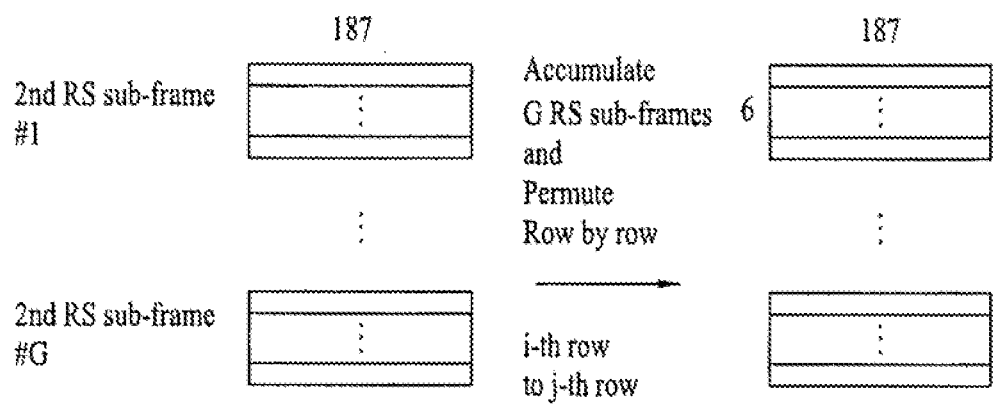

FIG. 8 illustrates a row permutation process performed on the first RS sub-frame according to the second embodiment of the present invention, and FIG. 9 illustrates a row permutation process performed on the second RS sub-frame according to the second embodiment of the present invention. The row permutation process performed on the first RS sub-frame shown in FIG. 8 is identical to the row permutation process performed on the first RS sub-frame according to the first embodiment of the present invention. Therefore, a detailed description of the same will be omitted for simplicity.

Meanwhile, referring to FIG. 9, when a second RS sub-frame including 187 bytes in each row and 6 bytes in each column is configured, G number of second RS sub-frames are grouped to configure a second RS sub-frame group consisting of 6*G number of 187-byte rows. When the row permutation process is performed on the above-described second RS sub-frame group by using a predetermined method, the position of the rows may differ prior to and after the row permutation process within the second RS sub-frame group, as shown in FIG. 9. More specifically, the $i^{th}$ row of the second RS sub-frame group prior to the row permutation process is positioned in the $j^{th}$ row of the same second RS sub-frame after row permutation. Similarly, each row of the second RS sub-frame group is configured of 187 bytes even after the row permutation process is performed. The above-described relation between i and j can be easily understood with reference to Equation 4 below.

$$j = G(i \bmod 6) + \lfloor i/6 \rfloor$$

$$i = 6(j \bmod G) + \lfloor j/G \rfloor \quad \text{Equation 4}$$

where $0 \le i, j < 6G$

More specifically, Equation 4 corresponds to a row permutation method according to the second embodiment of the present invention. Any row permutation method in which i and j may include all rows within the frame group may be used. The permutation method is not limited only to the examples given in the description of the present invention. Also in the second embodiment of the present invention, in using the equation for performing row permutation on the first and second RS sub-frames, the same equation may be used on both sub-frames, or a different equation may be used on each sub-frame.

In addition, an error detection encoding process may be performed on the first and second RS sub-frame groups that are processed with row permutation. The error detection encoding process is used for indicating whether the data of the first and second RS sub-frame groups have been damaged by any error that may occur while the data are being transmitted to the receiving system through the channels. For example, CRC encoding may be used in the error detection encoding process. Alternatively, any error detection encoding method other than the CRC encoding method may also be used. Furthermore, an error correction encoding method may be used to enhance the overall error correction performance of the receiving system. The CRC encoding process, which is performed on the first and second RS sub-frame groups according to the second embodiment of the present invention, is identical to the CRC encoding process performed in the first embodiment of the present invention. Therefore, a detailed description of the same will be omitted for simplicity.

Figure 10:
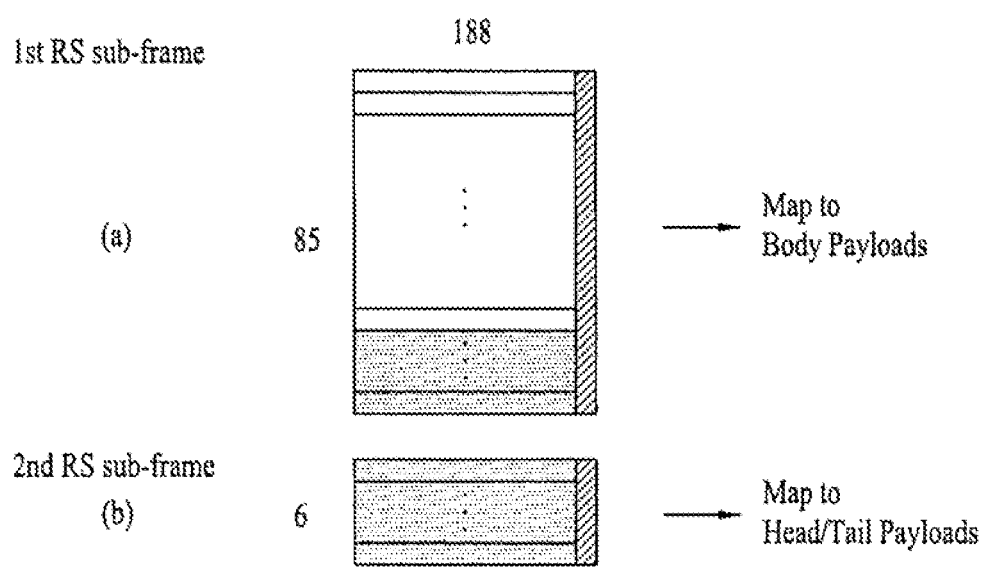
FIG. 10(a) and FIG. 10(b) illustrate examples of dividing an encoded frame into a plurality of sub-frames according to the second embodiment of the present invention.

After being processed with the above-described CRC encoding process, the first RS sub-frame group is expanded from a RS sub-frame group having 85*G number of 187-byte rows to a RS sub-frame group having 85*G number of 188-byte rows. Similarly, after being processed with the above-described CRC encoding process, the second RS sub-frame group is expanded from a RS sub-frame group having 6*G number of 187-byte rows to a RS sub-frame group having 7*G number of 188-byte rows. FIG. 10(a) illustrates a structure of the first RS sub-frame being sequentially processed with RS encoding, row permutation, and CRC encoding, which is then inputted to the data processor 102. Herein, the first RS sub-frame is configured of 85 188-byte unit rows. Alternatively, FIG. 10(b) illustrates a structure of the second RS sub-frame being sequentially processed with error correction encoding, row permutation, CRC encoding, which is then inputted to the data processor 102. Herein, the second RS sub-frame is configured of 6 188-byte unit rows.

The data processor 102 takes into consideration the characteristics of the hierarchical areas within the data group and the characteristics of the first and second RS sub-frames, so as to allocate the first and second RS sub-frames to the corresponding areas within the data group. In the present invention, the first RS sub-frames are allocated to the body area of the data group. The second RS sub-frames are allocated to the head area and/or tail area of the data group. In other words, the data of the first RS sub-frames are allocated to the body area, and the data of the second RS sub-frames are allocated to the head area and/or tail area. In the description of the first and second embodiments of the present invention, any combination of coding rate that satisfies the structure of the present invention may be used as the RS coding rates for the RS encoding process performed in the column direction and the RS encoding process performed in the row direction, respectively. Also, other types of error correction encoding, other than the RS encoding method, may also be used in the present invention.

In addition, when performing row permutation, the size of the RS sub-frame is not required to be identical prior to and after row permutation. However, only the total number of rows within the corresponding RS sub-frame group must be identical prior to and after row permutation. More specifically, when the size of the RS sub-frame prior to row permutation is equal to G, and the number of rows included in one RS sub-frame prior to row permutation is equal to N, the row permutation process may be performed without any difficulty if the number of the RS sub-frames is equal to 2N and if the number of rows included in one RS sub-frame is equal to G/2 (wherein, G is an even number). Therefore, the size of each RS sub-frame prior to and after row permutation may vary arbitrarily by the system designer.

Figure 11:
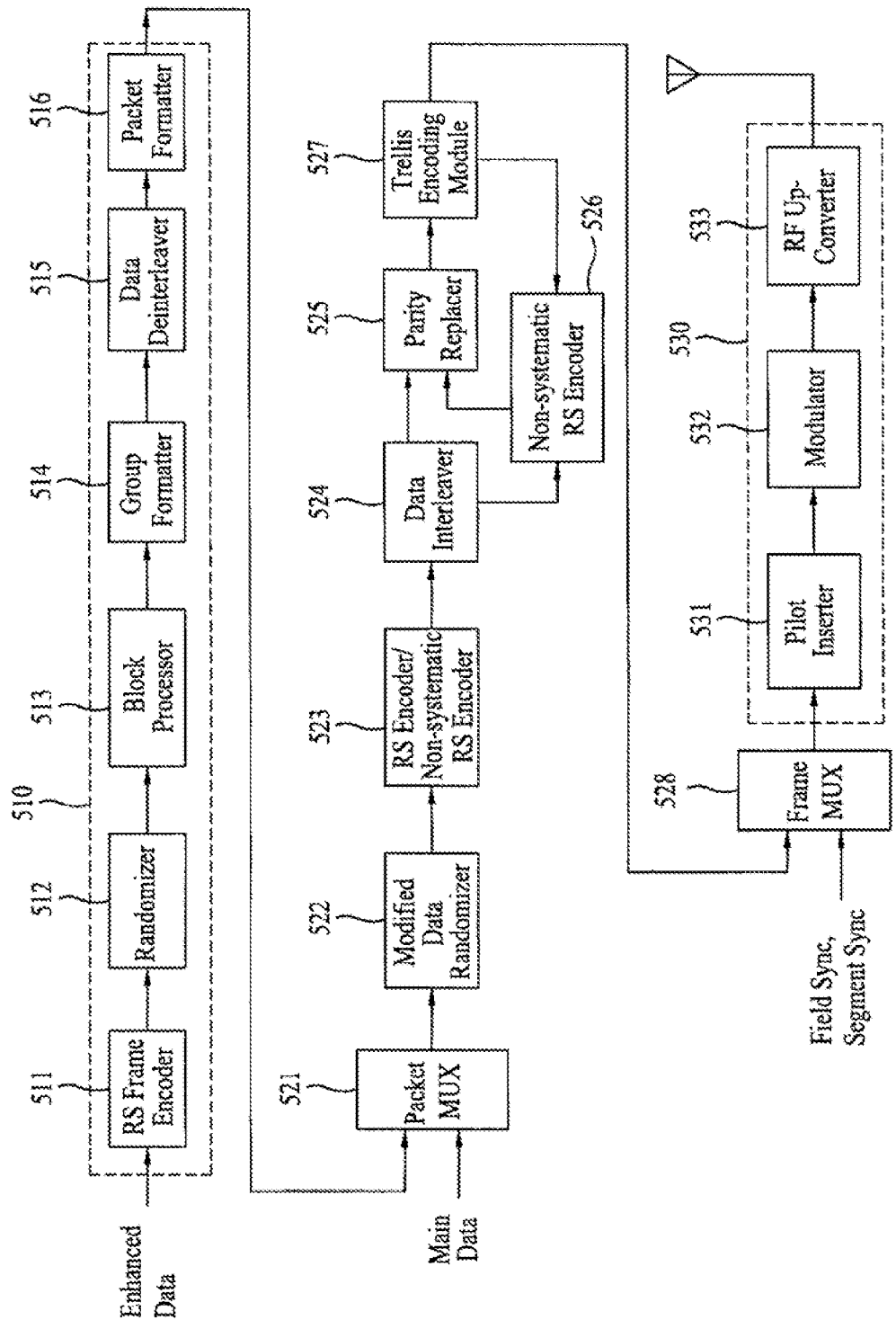
FIG. 11 illustrates a block diagram showing the structure of a digital broadcast transmitting system according to an embodiment of the present invention.
Figure 12:
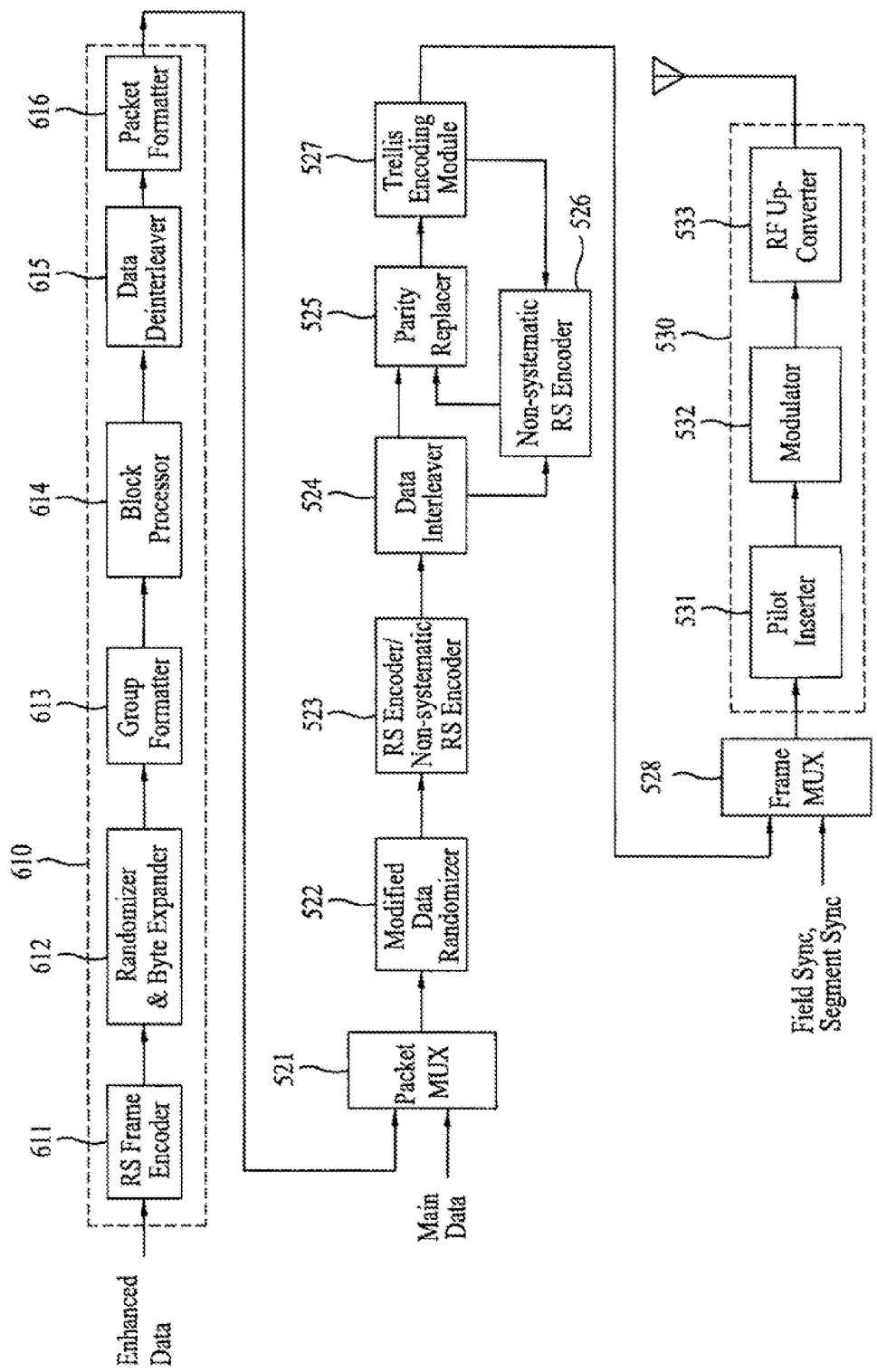
FIG. 12 illustrates a block diagram showing the structure of a digital broadcast transmitting system according to another embodiment of the present invention.
Figure 13:
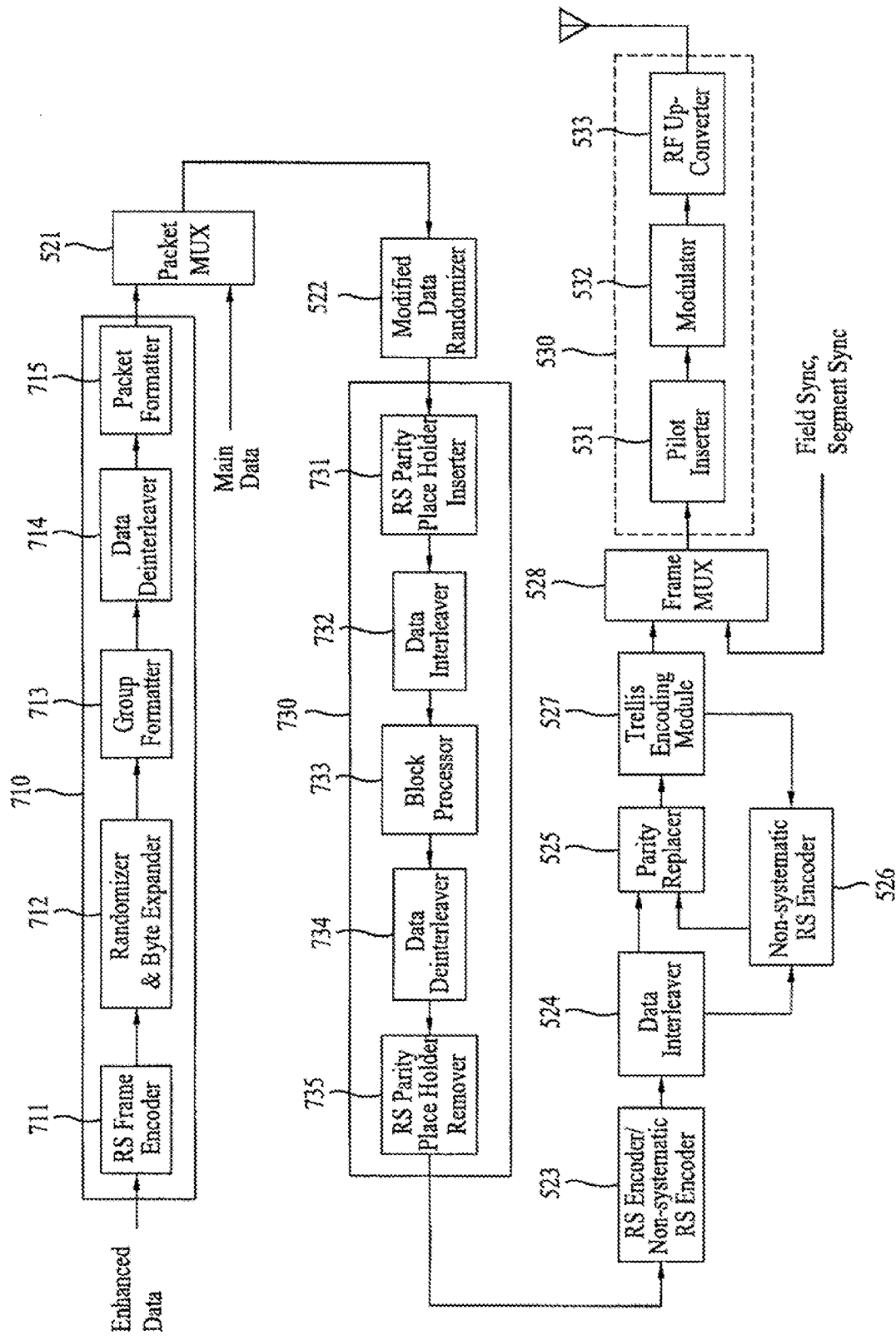
FIG. 13 illustrates a block diagram showing the structure of a digital broadcast transmitting system according to yet another embodiment of the present invention.

FIG. 11 to FIG. 13 illustrate examples of a digital broadcast transmitting system each including the above-described RS frame encoder. The digital broadcast transmitting system of FIG. 11 includes a pre-processor 510, a packet multiplexer 521, a data randomizer 522, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 510 includes a RS frame encoder 511, a randomizer 512, a block processor 513, a group formatter 514, a data deinterleaver 515, and a packet formatter 516. More specifically, the randomizer 512, the block processor 513, the group formatter 514, the data deinterleaver 515, and the packet formatter 516 collectively correspond to the data processor 102 of FIG. 1.

In the above-described structure of the present invention, the main data are inputted to the packet multiplier 521, and the enhanced data are inputted to the pre-processor 510, which performs additional encoding so that the enhanced data can respond more effectively to noise and channel environment that undergoes frequent changes. The pre-processor 510 of the RS frame encoder 511 sequentially performs the RS encoding process and the row permutation process on the enhanced data that are inputted as shown in the first and second embodiments, and a CRC encoding process may be performed whenever required. Thereafter, the processed enhanced data are outputted to the randomizer 512.

More specifically, in the first embodiment of the present invention, a primary RS encoding process is performed in a column direction on the RS frame that is formed to be processed with error correction. Then, a secondary RS encoding process is performed in a row direction on the primarily RS error encoded RS frame. Thereafter, the RS encoded RS frame is divided in to first and second RS sub-frames, which are then respectively processed with row permutation. Then, a CRC encoding process is performed only on the first RS sub-frame, which is then outputted to the randomizer 512 (ref. FIG. 2 to FIG. 6). Alternatively, in the second embodiment of the present invention, a RS encoding process is performed in a column direction on the RS frame that is formed to be processed with error correction. Thereafter, the RS encoded RS frame is divided in to first and second RS sub-frames, which are then respectively processed with row permutation. Then, a CRC encoding process is performed only on the row-permuted first and second RS sub-frames, which are then outputted to the randomizer 512 (ref. FIG. 7 to FIG. 10).

The randomizer 512 receives the enhanced data with added robustness from the encoding process according to the first and second embodiments. The randomizer 512, then, randomizes the received enhanced data and outputs the randomized data to the block processor 513. At this point, by having the randomizer 512 randomize the enhanced data, a later randomizing process on the enhanced data performed by another randomizer 522 may be omitted. The randomizer of the conventional broadcast system may be identically used as the randomizer for randomizing the enhanced data. Alternatively, any other type of randomizer may also be used for this process. For example, a pseudo random byte generated from the randomizer 512 may be used to randomize the inputted enhanced data.

The block processor 513 encodes the randomized enhanced data at a coding rate of M1/N1. Then, the block processor 513 outputs the M1/N1-rate encoded data to the group formatter 514. For example, if 1 bit of the enhanced data is encoded to 2 bits and outputted, then M1 is equal to 1 and N1 is equal to 2 (i.e., M1=1 and N1=2). Alternatively, if 1 bit of the enhanced data is encoded to 4 bits and outputted, then M1 is equal to 1 and N1 is equal to 4 (i.e., M1=1 and N1=4). At this point, in processing the enhanced data corresponding to the 2 sub-frames identified as the first RS sub-frame and the second RS sub-frame by using the randomizer 512 and the block processor 513, the same randomizer or block processor may be used. On the other hand, a separate randomizer or block processor may be used. In the example shown in FIG. 11, the same randomizer and block processor are used. As described above, the group formatter 514 configures a data group based upon a predetermined rule. Thereafter, the received enhanced data are inserted in a corresponding area within the configured data group, which are then outputted to the data deinterleaver 515.

Figure 14:
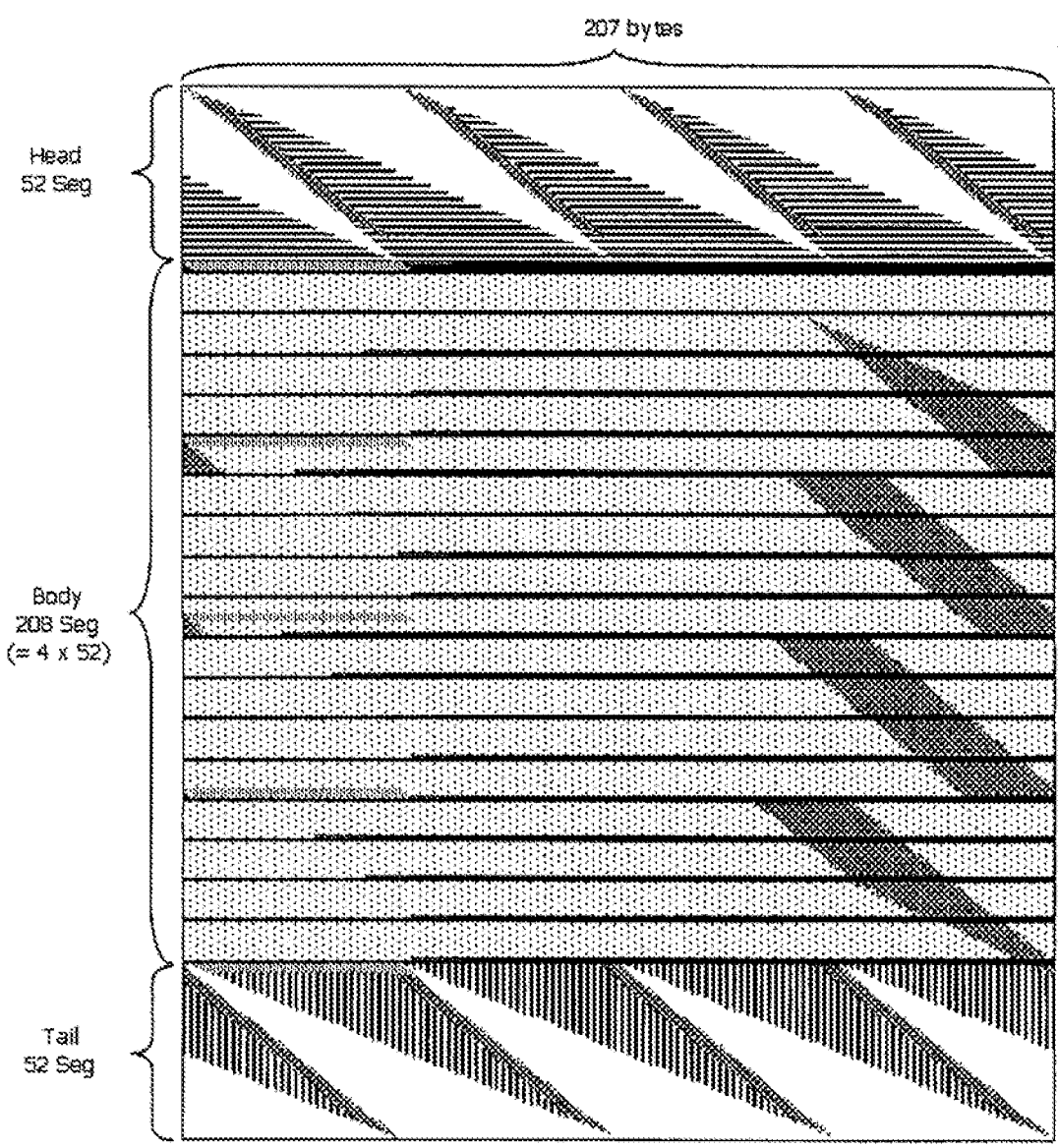
FIG. 14 and FIG. 15 illustrate examples of data configuration prior to and after a data deinterleaver in a digital broadcast transmitting system according to the present invention.
Figure 15:
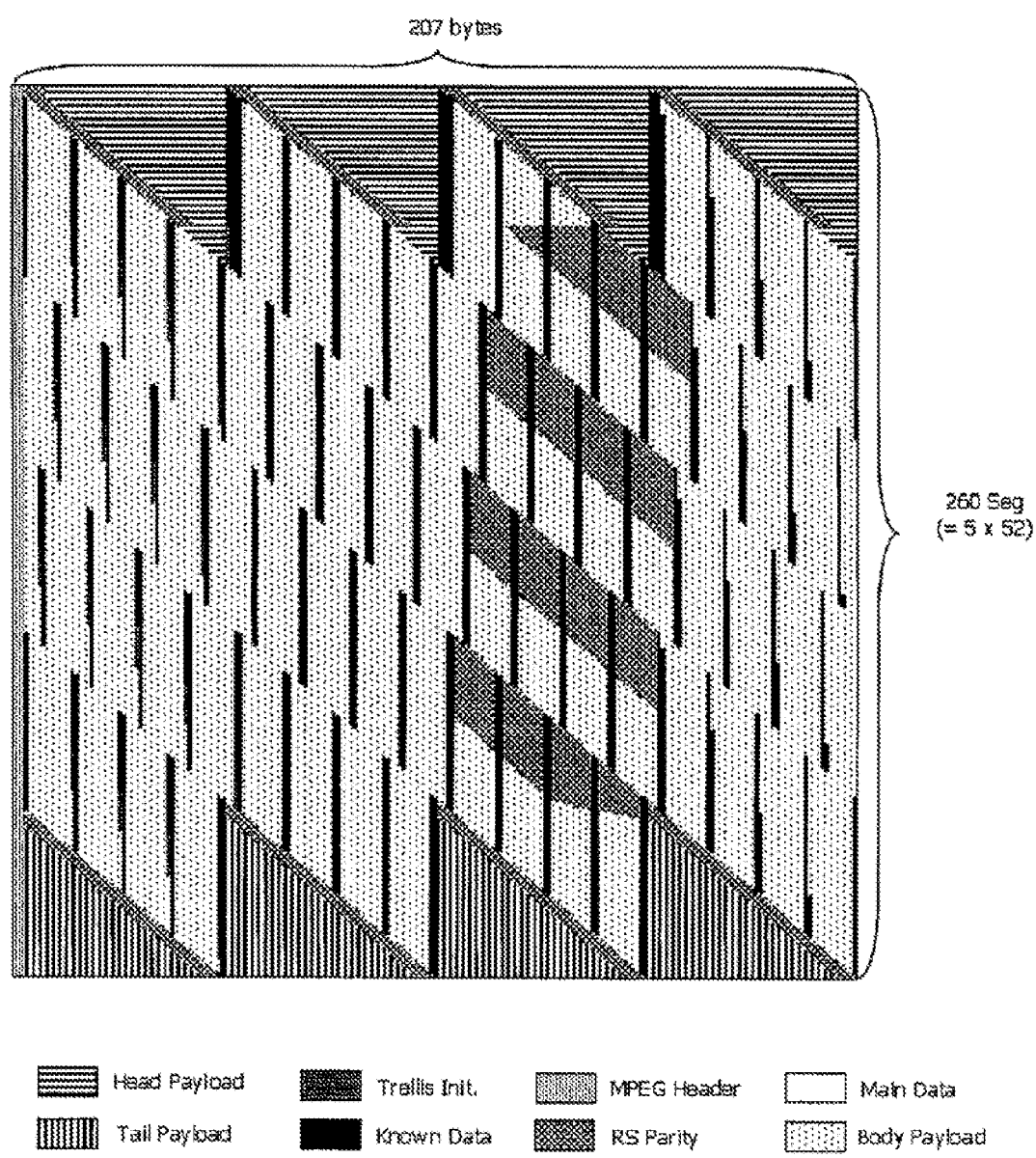

FIG. 14 illustrates an alignment of data prior to a data deinterleaving process, and FIG. 15 illustrates an alignment of data after the data deinterleaving process. In other words, FIG. 14 illustrates a data configuration after data interleaving, and FIG. 15 illustrates a data configuration prior to data interleaving. Referring to FIG. 14, in the data structure prior to data deinterleaving, the data group may be divided into 3 hierarchical areas: a head area, a body area, and a tail area. More specifically, based on the data group being data-interleaved and outputted, the portion being outputted first corresponds to the head area, the portion being outputted next corresponds to the body area, and the portion being outputted last corresponds to the tail area.

FIG. 14 and FIG. 15 illustrate examples of 260 packets configuring a data group. Since the data interleaver operates at a periodic cycle of 52 packets, the example given in the present invention corresponds to a multiple of 52 (i.e., 52*5=260). In addition, with respect to the data group being inputted to the data deinterleaver, the head, body and tail areas are set up so that only the enhanced data are included in the body area without being mixed with the main data. For example, the group formatter 514 inserts the data of the first RS sub-frame, which are encoded at a coding rate of M1/N1 and inputted, into the body area within the data group. The group formatter 514 then inserts the data of the second RS sub-frame into the head area and/or tail area. In addition, apart from the enhanced data, the group formatter 514 also allocates signaling information, which indicates overall transmission information, to the body area. More specifically, the signaling information corresponds to information required by the receiving system for receiving and processing data included in the data group. Herein, the signaling information may include data group information, and multiplexing information.

With respect to the data deinterleaving process, the group formatter 514 inserts a MPEG header place holder, a non-systematic RS parity place holder, and a main data place holder, as shown in FIG. 14. Herein, as shown in FIG. 14, the main data place is allocated because the enhanced data are mixed with the main data in the head and tail areas, based upon the input from the data deinterleaver. Also, with respect to the output data after being data-deinterleaved, the place holder for the MPEG header is allocated at the beginning of each packet. In addition, the group formatter 514 either inserts known data, which are generated based upon a pre-decided method, in a corresponding area, or inserts a known data place holder in a corresponding area so as to respectively insert the known data in a later process. The data group having the data or data place holder inserted thereto by the group formatter 514 is then inserted to the data deinterleaver 515.

The data deinterleaver 515 performs an inverse process of the data interleaving process. In other words, the data deinterleaver 515 deinterleaves the received data group and outputs the deinterleaved data group to the packet formatter 516. The packet formatter 516 removes the main data place holder and the RS parity place holder, which were allocated for the deinterleaving process, from the received deinterleaved data. Then, the remaining portions of the received data are gathered (or grouped), and the MPEG header is inserted to replace the 4-byte MPEG header place holder. Also, in case the group formatter 514 inserted the known data place holder, the packet formatter 516 may either insert known data in replacement of the known data place holder, or may directly output the known data place holder without any modification for a replacement insertion in a later process. Thereafter, the packet formatter 516 configures the data within the data group, which is packet-formatted as described above, into a 188-byte unit MPEG TS packet. Then, the packet formatter 516 provides the configured MPEG TS packet to the packet multiplexer 521.

The packet multiplexer 521 multiplexes the 188-byte unit enhanced data packet, which is outputted from the packet formatter 516, with a main data packet in accordance with a pre-defined multiplexing method. Then, the packet multiplexer 521 outputs the multiplexed data to the data randomizer 522. The multiplexing method may be adjusted in accordance with a plurality of variables of the system design. One of the multiplexing methods of the packet multiplexer 521 is to identify an enhanced data burst section and a main data section along a time axis and alternately repeating the two sections. At this point, at least one data group may be transmitted from the enhanced data burst section, and only the main data may be transmitted from the main data section. Herein, the enhanced data burst section may also transmit main data. As described above, if the enhanced data are transmitted in the burst structure, the receiving system receiving only the enhanced data turns the power on only during the burst section in order to receive the enhanced data. Alternatively, the receiving system turns the power off during the remaining section, which corresponds to the main data section transmitting only the main data, so that the receiving system does not receive any portion of the main data. Thus, power consumption of the receiving system may be reduced.

If the inputted data correspond to the main data packet, the data randomizer 522 performs the same randomizing process as the conventional randomizer. More specifically, the data randomizer 522 discards (or removes) the MPEG synchronization byte included in the main data packet and randomizes the remaining 187 byte by using a pseudo random byte that is generated by the data randomizer 522. Then, the randomized data bytes are outputted to the RS encoder/non-systematic RS encoder 523. However, if the inputted data correspond to the enhanced data packet, the data randomizer 522 discards (or removes) the MPEG synchronization byte from the 4-byte MPEG header included in the enhanced data packet and randomizes only the remaining 3 bytes. Also, the data randomizer 522 outputs the remaining portion of enhanced data excluding the MPEG header to the RS encoder/non-systematic RS encoder 523 without performing the randomizing process. This is because the randomizer 512 has already performed a randomizing process on the enhanced data in an earlier process. The known data (or the known data place holder) and the initialization data place holder included in the enhanced data packet may either randomized or not randomized.

The RS encoder/non-systematic RS encoder 523 RS-encodes the data randomized by the data randomizer 522 or the data bypassing the data randomizer 522 so as to add 20 bytes of RS parity to the corresponding data. Then, the RS encoder/non-systematic RS encoder 523 outputs the processed data to the data interleaver 524. At this point, if the inputted data correspond to the main data packet, the RS encoder/non-systematic RS encoder 523 performs a systematic RS-encoding process identical to that of the conventional broadcasting system, thereby adding 20 bytes of RS parity at the end of the 187-byte unit data. Alternatively, if the inputted data correspond to the enhanced data packet, the RS encoder/non-systematic RS encoder 523 performs a non-systematic RS-encoding process at a specific parity byte place within the enhanced data packet, thereby inserting the 20-byte RS parity. Herein, the data interleaver 524 corresponds to a byte unit convolutional interleaver. The output of the data interleaver 524 is inputted to the parity replacer 525 and the non-systematic RS encoder 526.

Meanwhile, a process of initializing a memory within the trellis encoder 527 is primarily required in order to decide the output data of the trellis encoder 527, which is located after the parity replacer 525, as the known data pre-defined according to an agreement between the receiving system and the transmitting system. More specifically, the memory of the trellis encoder 527 should first be initialized before the received known data sequence is trellis-encoded. At this point, the beginning portion of the known data sequence that is being received corresponds to the initialization data place holder and not the actual known data. Herein, the initialization data place holder has been included in the data by the group formatter 514 in an earlier process. Therefore, the process of generating initialization data and replacing the initialization data place holder of the corresponding memory with the generated initialization data are required to be performed immediately before the known data sequence being inputted is trellis-encoded.

Additionally, a value of the trellis memory initialization data is decided and generated based upon a memory status of the trellis encoder 527. Further, due to the newly replaced initialization data, a process of newly calculating the RS parity and replacing the RS parity, which is outputted from the data interleaver, with the newly calculated RS parity is required. Therefore, the non-systematic RS encoder 526 receives the enhanced data packet including the initialization data place holder, which is to be replaced with the actual initialization data, from the data interleaver 524 and also receives the initialization data from the trellis encoder 527. Among the inputted enhanced data packet, the initialization data place holder is replaced with the initialization data, and the RS parity data that are added to the enhanced data packet are removed. Thereafter, a new non-systematic RS parity is calculated and outputted to the parity replacer 525. Accordingly, the parity replacer 525 selects the output of the data interleaver 524 as the data within the enhanced data packet, and the parity replacer 525 selects the output of the non-systematic RS encoder 526 as the RS parity. The selected data are then outputted to the trellis encoder 527.

Meanwhile, if the main data packet is inputted or if the enhanced data packet, which does not include any initialization data place holder that is to be replaced, is inputted, the parity replacer 525 selects the data and RS parity that are outputted from the data interleaver 524. Then, the parity replacer 525 directly outputs the selected data to the trellis encoder 527 without any modification. The trellis encoder 527 converts the byte-unit data to symbol units and performs a 12-way interleaving process so as to trellis-encode the received data. Thereafter, the processed data are outputted to the frame multiplexer 528. The frame multiplexer 528 inserts a field synchronization signal and a segment synchronization signal to the data outputted from the trellis encoder 527 and, then, outputs the processed data to the transmitting unit 530. Herein, the transmitting unit 530 includes a pilot inserter 531, a modulator 532, and a radio frequency (RF) up-converter 533. The operations and roles of the transmitting unit 530 and its components are identical to those of the conventional transmitter. Therefore, detailed description of the same will be omitted for simplicity.

The digital broadcast transmitting system of FIG. 12 includes a pre-processor 610, a packet multiplexer 521, a data randomizer 522, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 610 includes a RS frame encoder 611, a randomizer/byte expansion unit 612, a group formatter 613, a block processor 614, a data deinterleaver 615, and a packet formatter 616. More specifically, the randomizer/byte expansion unit 612, the group formatter 613, the block processor 614, the data deinterleaver 615, and the packet formatter 616 collectively correspond to the data processor 102 of FIG. 1. Herein, the difference between the digital broadcast transmitting system of FIG. 12 and that of FIG. 11 is the positioning order of the group formatter and the block processor.

In FIG. 11, the group formatter 514 is located after the block processor 513, whereas in FIG. 12, the block processor 614 is placed after the group formatter 613. More specifically, in the digital broadcast transmitting system of FIG. 12, since the group formatter 613 is placed before the block processor 614, a byte-expansion process is required to be performed, in advance, before the group formatter 613 so that the block processor 614 can respond to the encoding process, thereby facilitating the operation of the group formatter 613. Therefore, in the digital broadcast transmitting system of FIG. 12, byte expansion may also be performed through randomizing and null data inserting processes by the randomizer/byte expanding unit 612. Conversely, in the digital broadcast transmitting system of FIG. 11, the group formatter 514 is placed before the block processor 513. And, since the encoding process of the block processor 513 directly performs the byte expansion process, a separate byte expansion process is not required. Therefore, the digital broadcast transmitting system shown in FIG. 11 only randomizes the enhanced data and does not perform any byte expansion process.

Hereinafter, only a portion of the pre-processor 610 of FIG. 12 will be described in detail, and the other blocks (i.e., reference numerals 521 to 528, and 530) may be identically applied as described above in FIG. 11. More specifically, the enhanced data are inputted to the pre-processor 610, which performs additional encoding so that the enhanced data can respond more effectively to noise and channel environment that undergoes frequent changes. The pre-processor 610 of the RS frame encoder 611 receives the enhanced data and configures a frame for the additional encoding process. Then, after performing the encoding process, the RS frame encoder 611 outputs the processed data to the randomizer/byte expansion unit 612.

The randomizer/byte expansion unit 612 receives the enhanced data with added robustness from the encoding process. The randomizer/byte expansion unit 612, then, performs byte expansion by randomizing and inserting null data in the received enhanced data. At this point, by having the randomizer/byte expansion unit 612 randomizes the enhanced data, a later randomizing process on the enhanced data performed by another randomizer 522 may be omitted. The randomizer of the conventional broadcast system may be identically used as the randomizer for randomizing the enhanced data. Alternatively, any other type of randomizer may also be used for this process.

Herein, the randomizing process and the byte expansion process may also be performed in a different order. More specifically, as described above, the byte expansion process may be performed after the randomizing process. And, conversely, the randomizing process may be performed after the byte expansion process. Any method may be selected in accordance with the overall characteristic of the broadcasting system. Moreover, the byte expansion method may vary in accordance with the encoding rate of the block processor 614. More specifically, if the encoding rate of the block processor 614 is M1/N1, the byte expansion unit expands the data bytes from M1 bytes to N1 bytes. For example, if the encoding rate is ½, then 1 byte is expanded to 2 bytes. Alternatively, if the encoding rate is ¼, then 1 byte is expanded to 4 bytes. The enhanced data being outputted from the randomizer/byte expansion unit 612 are inputted to the group formatter 613. As described in FIG. 11, FIG. 14, and FIG. 15, the group formatter 613 creates (or configures) a data group, and then, the group formatter 613 inserts the received data in corresponding areas within the data group. The operations of the group formatter 613 are identical to those of the group formatter shown in FIG. 11, and, therefore, a detailed description of the same will be omitted for simplicity.

The data or corresponding place holder inserted in the data group by the group formatter 613 is (or are) inputted to the block processor 614. The block processor 614 performs additional encoding only on the enhanced data that are outputted from the group formatter 613. For example, if the randomizer/byte expansion unit 612 expanded data from 1 byte to 2 bytes, the block processor 614 encodes the enhanced data at a coding rate of ½. Alternatively, if the randomizer/byte expansion unit 612 expanded data from 1 byte to 4 bytes, the block processor 614 encodes the enhanced data at a coding rate of ¼. Additionally, the MPEG header place holder, the main data place holder, and the RS parity place holder are to be directly outputted without any data modification. Further, the known data (or the known data place holder) and the initialization data place holder are either set to be directly outputted without any data modification, or set to be replaced with the known data generated from the block processor 614 and then outputted. Herein, the data being encoded and replaced by the block processor 614 and bypassing block processor 614 are inputted to the data deinterleaver 615. The data deinterleaver 615 performs an inverse process of the data interleaver 524 by deinterleaving the inputted data and outputs the deinterleaved data to the packet formatter 616.

The packet formatter 616 removes the main data place holder and the RS parity place holder, which were allocated for the deinterleaving process, from the deinterleaved data that are being inputted. Thereafter, the packet formatter 616 gathers (or groups) the remaining portions of the data and, then, inserts the MPEG header instead of the 4-byte MPEG header place holder. The packet formatter 616 configures the packet-formatted data in a 188-byte unit MPEG TS packet, which is then supplied to the packet multiplexer 521. The packet multiplexer 521 multiplexes the 188-byte unit enhanced data packet and the main data packet, which are outputted from the packet formatter 616. Then, the multiplexed data are outputted to the data randomizer 522. The packet multiplexing method and the later operations are identical to those described in FIG. 11. Therefore, the detailed description of the same will be omitted for simplicity.

The digital broadcast transmitting system of FIG. 13 includes a pre-processor 710, a packet multiplexer 521, a data randomizer 522, a post-processor 730, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 710 includes a RS frame encoder 711, a randomizer/byte expansion unit 712, a group formatter 713, a data deinterleaver 714, and a packet formatter 715. More specifically, the randomizer/byte expansion unit 712, the group formatter 713, the data deinterleaver 714, and the packet formatter 715 collectively correspond to the data processor 102 of FIG. 1. Also, the post-processor 730 includes a RS parity place holder inserter 731, a data interleaver 732, a block processor 733, a data deinterleaver 734, and a RS parity place holder remover 735.

In other words, apart from the block processor 614 included in the pre-processor of the digital broadcast transmitting system shown in FIG. 12, the pre-processor shown in both FIG. 12 and FIG. 13 have the same structure and operates identically. Also, the digital broadcast transmitting system of FIG. 13 further includes a post-processor 730 including a block processor 733. Furthermore, the packet multiplexer 521 and data randomizer 522 both provided between the pre-processor 710 and the post-processor 730, the RS encoder/non-systematic RS encoder 523 provided after the post-processor 730, the data interleaver 524, the parity replacer 525, the non-systematic encoder 526, the trellis encoder 527, the frame multiplexer 528, and the transmitting unit 530 have the same configuration and operates identically as those of FIG. 11. Therefore, a detailed description of the same will be omitted for simplicity. Hereinafter, referring to FIG. 13, only the post-processor 730 will be described in detail. On the other hand, detailed description of the remaining configuration blocks included in the transmitting system, shown in FIG. 13, having the same names as the configuration blocks shown in FIG. 11 or FIG. 12 will be omitted for simplicity.

More specifically, the data randomized by the data randomizer 522 or the data bypassing the data randomizer 522 are inputted to the RS parity place holder inserter 731 of the post-processor 730. If the inputted data correspond to the 187-byte main data packet, the RS parity place holder inserter 731 inserts a 20-byte RS parity place holder at the end of the 187-byte main data packet. Then, the RS parity place holder inserter 731 outputs the processed data to the data interleaver 732. Alternatively, if the inputted data correspond to the 187-byte enhanced data packet, a 20-byte RS parity place holder is inserted in the enhanced data packet for the non-systematic RS encoding process, which will be performed in a later process. Then, the RS parity place holder inserter 731 inserts the data bytes within the enhanced data packet in the byte places of the remaining 187 bytes of enhanced data, which are then outputted to the data interleaver 732. The data interleaver 732 performs a data interleaving process on the output of the RS parity place holder inserter 731 and, then, outputs the interleaved data to the block processor 733.

The block processor 733 performs additional encoding only on the enhanced data that are outputted from the data interleaver 732. For example, if the randomizer/byte expansion unit 712 expanded data from 1 byte to 2 bytes, the block processor 733 encodes the enhanced data at a coding rate of ½. Alternatively, if the randomizer/byte expansion unit 712 expanded data from 1 byte to 4 bytes, the block processor 733 encodes the enhanced data at a coding rate of ¼. The main data or RS parity place holders directly bypass the block processor 733. Additionally, the known data and the initialization data place holder also bypass the block processor 733. And, the known data place holder may be replaced by the known data generated from the block processor 733, which are then outputted. Herein, the data being encoded and replaced by the block processor 733 and bypassing block processor 733 are inputted to the data deinterleaver 734. The data deinterleaver 734 performs an inverse process of the data interleaver 732 by deinterleaving the inputted data and outputs the deinterleaved data to the RS parity place holder remover 735.

The RS parity place holder remover 735 removes the 20-byte RS parity place holder, which was inserted by the RS parity place holder inserter 731 for the operations of the data interleaver 732 and the data deinterleaver 734. Then, the RS parity place holder remover 735 outputs the processed data to the RS encoder/non-systematic RS encoder 523. If the inputted data correspond to the main data packet, the last 20 bytes, which correspond to the RS parity place holders, are removed from the total 207 data bytes. And, if the inputted data correspond to the enhanced data packet, the 20 bytes of the RS parity place holders that were inserted to perform the non-systematic RS-encoding process are removed from the total 207 data bytes. Herein, if the main data sequentially pass through the RS parity place holder inserter 731, the data interleaver 732, the block processor 733, the data deinterleaver 734, and the RS parity place holder remover 735, the main data become identical to the main data that were originally inputted to the RS parity place holder inserter 731. As described above, the embodiments of the digital broadcast transmitting system of the present invention shown in FIG. 11 to FIG. 13 are merely exemplary. Herein, any transmitting system that can perform additional error correction encoding on the enhanced data may be used in the present invention. And, therefore, the present invention is not limited to the examples set forth herein.

Meanwhile, the randomizer 512 of the transmitting system shown in FIG. 11 may be placed before the RS frame encoder 511. Also, only the randomizing function of the randomizer/byte expansion unit 612 or 712 of the transmitting system shown in FIG. 12 or FIG. 13 may be placed before the RS frame encoder. In this case, a derandomizing function included in a data deformatter 805 shown in FIG. 16 may be placed behind the RS frame encoder 806. And, if the randomizer is placed at the fore-end of the pre-processor 510, 610 or 710 within the transmitting system shown in FIG. 11, FIG. 12 or FIG. 13, the function of removing the MPEG synchronization byte, which is originally performed at the RS frame encoder 511, 611 or 711, may be placed in the randomizer.

Figure 16:
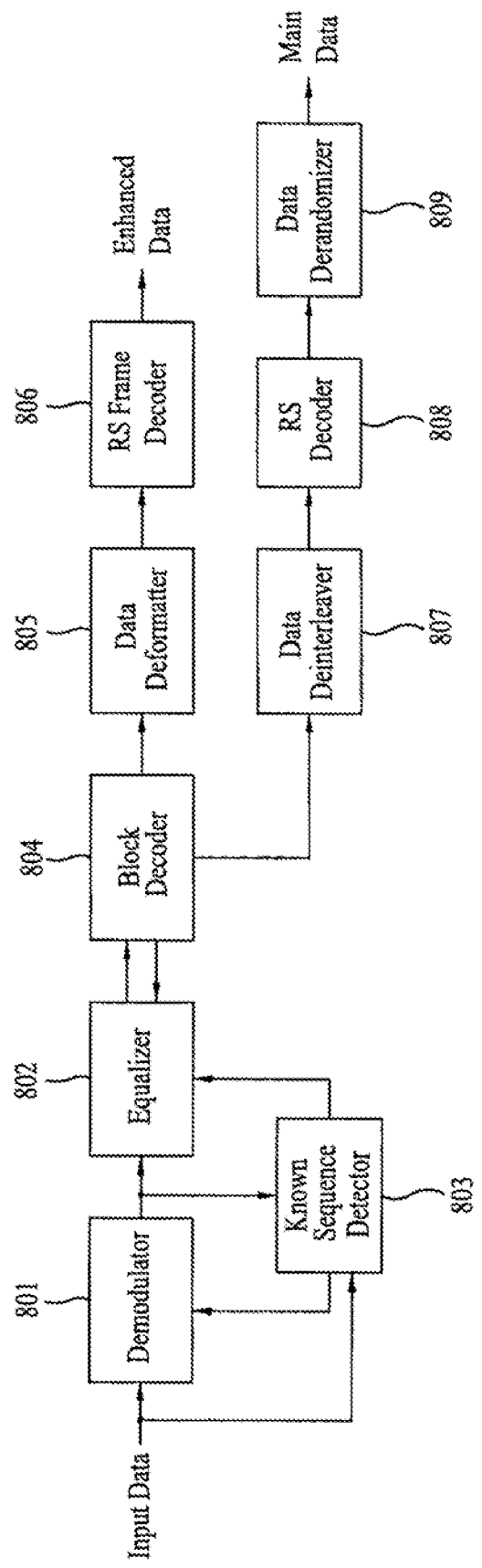
FIG. 16 illustrates a block diagram showing a demodulator within a digital broadcast receiving system according to an embodiment of the present invention.

FIG. 16 illustrates a block diagram showing a demodulating unit of a digital broadcast receiving system according to an embodiment of the present invention, wherein the demodulating unit is used for receiving data transmitted from the transmitting system, demodulating and equalizing the received data, so as to recover the processed data back to the initial (or original) data. Referring to FIG. 8, the demodulating unit of the digital broadcast receiving system includes a demodulator 801, an equalizer 802, a known sequence detector 803, a block decoder 804, a data deformatter 805, a RS frame decoder 806, a data deinterleaver 807, a RS decoder 808, and a derandomizer 809.

More specifically, an intermediate frequency (IF) signal of a particular channel that is tuned by a tuner is inputted to the demodulator 801 and the known sequence detector 803. The demodulator 801 performs self gain control, carrier recovery, and timing recovery processes on the inputted IF signal, thereby modifying the IF signal to a baseband signal. Then, the demodulator 801 outputs the newly created baseband signal to the equalizer 802 and the known sequence detector 803. The equalizer 802 compensates the distortion of the channel included in the demodulated signal and then outputs the error-compensated signal to the block decoder 804.

At this point, the known sequence detector 803 detects the known sequence place inserted by the transmitting end from the input/output data of the demodulator 801 (i.e., the data prior to the demodulation or the data after the modulation). Thereafter, the place information along with the symbol column of the known sequence, which is generated from the detected place, is outputted to the demodulator 801, the equalizer 802, and the block decoder 804. Also, the known sequence detector 803 outputs a set of information to the block decoder 804. This set of information is used to allow the block decoder 804 of the receiving system to identify the enhanced data that are processed with additional encoding from the transmitting system and the main data that are not processed with additional encoding. This set of information is also used to indicate a stating point of a block in the enhanced encoder. In addition, although the connection status is not shown in FIG. 10, the information detected from the known sequence detector 803 may be used throughout the entire receiving system and may also be used in the data deformatter 805 and the RS frame decoder 806.

The demodulator 801 uses the known data symbol column during the timing and/or carrier recovery, thereby enhancing the demodulating performance. Similarly, the equalizer 802 uses the known data sequence, thereby enhancing the equalizing quality. Moreover, the decoding result of the block decoder 804 may be fed-back to the equalizer 802, thereby enhancing the equalizing performance. Meanwhile, if the data that are inputted to the block decoder 804 from the equalizer 802 correspond to the enhanced data being processed with both additional encoding and trellis encoding by the transmitting system, trellis decoding and additional decoding processes are performed as inverse processes of the transmitting system. Alternatively, if the data that are inputted to the block decoder 804 from the equalizer 802 correspond to the main data being processed only with the trellis encoding process and not the additional encoding process, then only the trellis decoding process is performed. The data group decoded by the block decoder 804 is inputted to the data deformatter 805, and the main data packet is inputted to the data deinterleaver 807.

More specifically, if the inputted data correspond to the main data, the block decoder 804 performs Viterbi decoding on the input data, so as to either output a hard decision value or to perform hard decision on a soft decision value and, accordingly, output the hard decided result. On the other hand, if the input data correspond to the enhanced data, the block decoder 804 outputs either a hard decision value or a soft decision value on the inputted enhanced data. If the inputted data correspond to the enhanced data, the block decoder 804 performs a decoding process on the data encoded by the block processor and the trellis encoder of the transmitting system. At this point, the data outputted from a block encoder of the pre-processor may correspond to an external code, and the data outputted from any one of the block processor and the trellis encoder may correspond to an internal code. Therefore, in order to maximize the encoding performance of the external code when decoding such concatenated codes, a soft decision value should be outputted from the decoder of the internal code.

Accordingly, the block decoder 804 may output a hard decision value on the enhanced data. And, if required, it is preferable for the block decoder 804 to output a soft decision value. More specifically, depending upon the system design or conditions, the block decoder 804 outputs any one of the soft decision value and the hard decision value with respect to the enhanced data, and the block decoder 804 outputs the hard decision value with respect to the main data. Meanwhile, the data deinterleaver 807, the RS decoder 808, and the derandomizer 809 are configuration blocks required for receiving the main data. Therefore, in a receiving system that is structured for receiving only the enhanced data, the above-mentioned configuration blocks may not be required in the structure.

The data deinterleaver 807 performs an inverse process of the data interleaver. In other words, the data deinterleaver 807 deinterleaves the main data and outputs the deinterleaved main data to the RS decoder 808. The RS decoder 808 performs a systematic RS decoding process on the deinterleaved data and outputs the processed data to the derandomizer 809. The derandomizer 809 receives the output of the RS decoder 808 and generates a pseudo random data byte identical to that of the randomizer included in the digital broadcast transmitting system (or DTV transmitter). Thereafter, the derandomizer 809 performs a bitwise exclusive OR (XOR) operation on the generated pseudo random data byte, thereby inserting the MPEG synchronization bytes to the beginning of each packet so as to output the data in 188-byte main data packet units.

Meanwhile, the data being outputted from the block decoder 804 to the data deformatter 805 are inputted in the form of a data group. At this point, the data deformatter 805 already knows the structure of the data that are to be inputted and is, therefore, capable of identifying the signaling information, which includes the system information, and the enhanced data from the body area within the data group. Herein, the data deformatter 805 removes the known data, trellis initialization data, and MPEG header that were inserted to the main data and the data group, and also removes the RS parity that was added from the RS encoder/non-systematic RS encoder or non-systematic RS encoder of the transmitting system. Then, the data deformatter 805 outputs the processed data.

Thereafter, the data deformatter 805 performs an inverse process of the randomizer/byte expansion unit in the transmitting system by performing a derandomizing process on the enhanced data. At this point, the null data which were inserted for data expansion may or may not be required to be removed. In other words, depending upon the design of the receiving system, a unit for removing the byte that was expanded by the byte expansion unit of the transmitting system may be required. However, if the null data that were inserted at the time of the byte expansion are removed and if the null-data-removed data are outputted, the expanded byte is not required to be removed. If the expanded byte is required to be removed, the order of the process of removing the expanded data and the process of derandomizing the data may be changed depending upon the design of the transmitting system. More specifically, if byte expansion is performed after data-randomizing in the transmitting system, then data-derandomizing is performed after byte removal in the receiving system. Alternatively, if data-randomizing is performed after byte expansion in the transmitting system, then byte removal is performed after data-derandomizing in the receiving system.

Furthermore, during the derandomizing process, if the RS frame decoder 806 requires soft decision and, accordingly, receives the soft decision value from the block decoder 804, it is difficult to perform a bitwise exclusive OR (XOR) operation between the soft decision value and the pseudo random bit, which is used for derandomizing. Therefore, when an XOR operation is performed between the pseudo random bit and the soft decision value of the enhanced data bit, and when the pseudo random bit is equal to '1', the data deformatter 805 changes the code of the soft decision value and then outputs the changed code. On the other hand, if the pseudo random bit is equal to '0', the data deformatter 805 outputs the soft decision value without any change in the code. Thus, the soft decision status may be maintained and transmitted to the RS frame decoder 806.

If the pseudo random bit is equal to '1' as described above, the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the data deformatter 805 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted. The RS frame decoder 806 performs an inverse process of the RS frame encoder included in the transmitting system and, then, outputs the processed enhanced data.

In the description of the transmitting system, the encoding process of the RS frame encoder was described according to first and second embodiments of the present invention. Therefore, in the description of the receiving system, the decoding process of the RS frame decoder 806 will hereinafter be described according to third and fourth embodiment of the present invention, respectively.

Third Embodiment

Figure 17:
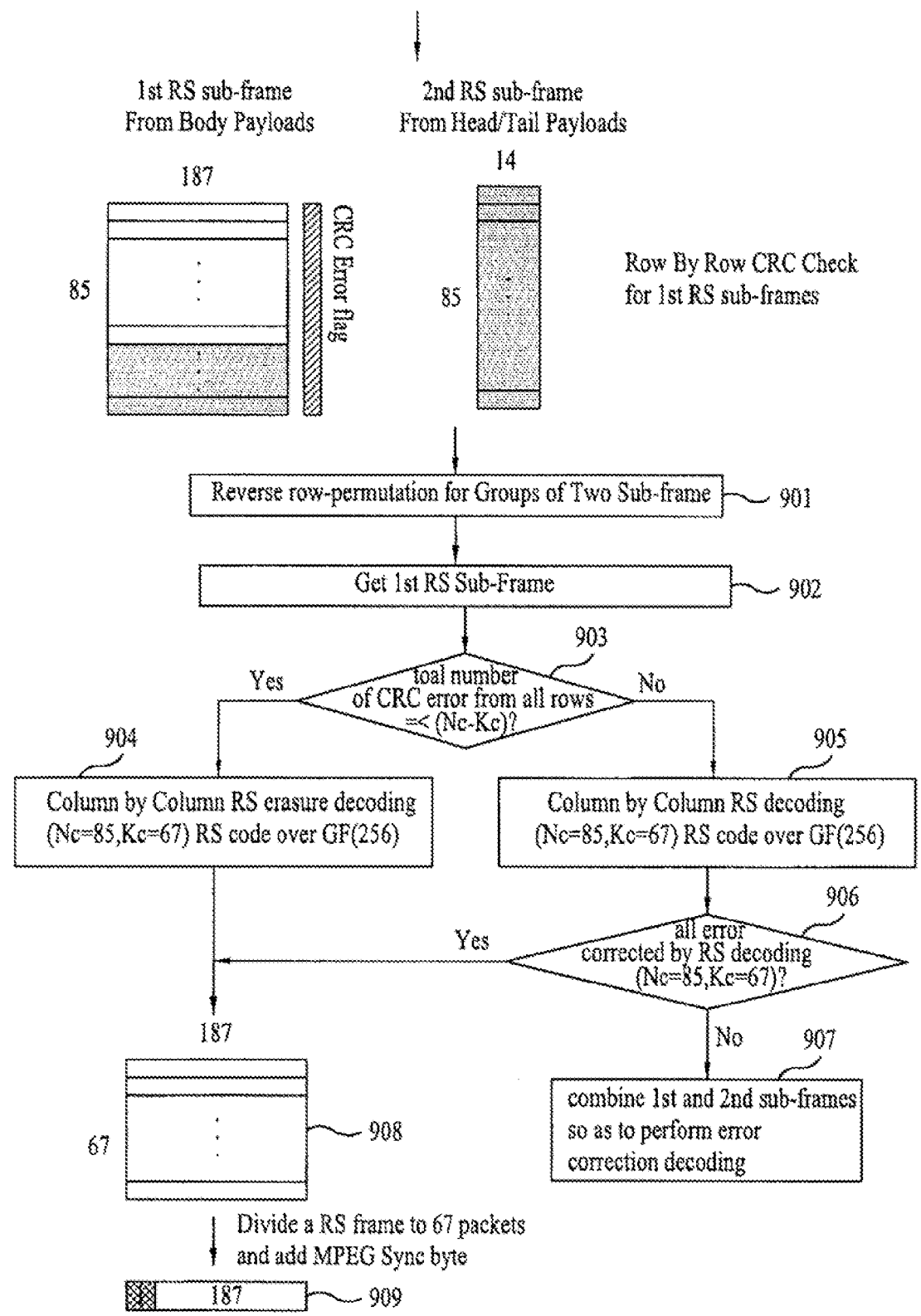
FIG. 17 illustrates a flow chart showing the general steps of an error correction decoding process according to a third embodiment of the present invention.

In the third embodiment of the present invention, a decoding process is performed on the enhanced data processed with the encoding process and transmitted from the transmitting system according to the first embodiment of the present invention. FIG. 17 illustrates a flow chart showing the general steps of the RS encoding process according to the third embodiment of the present invention. More specifically, referring to FIG. 17, when the present invention is unable to correct all errors by decoding only the first RS sub-frame, the present invention performs decoding by using the second RS sub-frame also. In the example of the present invention, when the number of errors within the enhanced data of the body area (i.e., the first RS sub-frame) is equal to or greater than a predetermined number, or when not all of the errors are corrected after decoding only the first RS sub-frame, the enhanced data of the head/tail area(s) (i.e., the second RS sub-frame) are additionally used to perform decoding. Hereinafter, the RS decoding process according to the third embodiment of the present invention will now be described in detail.

The RS frame decoder 806 groups (or gathers) G number of first RS sub-frames, which are transmitted to the body area, so as to create a first RS sub-frame group of 85*G 187-byte units. And, when using a 1-byte CRC (i.e., an 8-bit CRC), as shown in FIG. 5(a), each of the 188-byte packets is verified for existing errors. Then, after removing the 1-byte CRC checksum and leaving only 187 bytes, the presence of an error is indicated by an error flag corresponding to the packet. On the other hand, when using a 2-byte CRC (i.e., a 16-bit CRC), as shown in FIG. 5(b) and FIG. 5(c), two 188-byte packets are verified for existing errors. Then, the 2-byte CRC checksum is removed, thereby creating 2 187-byte packets. Thereafter, the presence of an error is indicated by an error flag corresponding to each of the packets, respectively. Herein, when using the 2-byte CRC checksum, errors should be indicated to exist either in both packets or in none of the two packets.

After checking for any error in each row by using the CRC checksum, an inverse process of the row permutation process is performed on the first RS sub-frame group, so as to align the first RS sub-frame group configured of 85*G 187-byte units, thereby aligning the first RS sub-frame group in the transmitting system (S901). Thereafter, the first RS sub-frame group is divided into G number of first RS sub-frames, which are configured of 85 187-byte units. When performing the inverse process of row permutation, the error flags corresponding to each packet (or row), and which indicates whether an error exists or not, are also changed and succeeded accordingly. Each RS frame is configured as a 187×85 byte matrix.

The RS frame decoder 806 also groups G number of second RS sub-frames that are being transmitted to the head/tail areas, thereby creating a second RS sub-frame group formed of 85*G second RS sub-frames. Then, the RS frame decoder 806 performs an inverse process of row permutation on the second RS sub-frame group and aligns the second RS sub-frame group to its initial order prior to being processed with row permutation at the transmitting system (S901). Subsequently, the second RS sub-frame group is divided into G number of second RS sub-frames, which are configured of 85 14-byte units. Since the transmitting system did not process the second RS sub-frame group, which is transmitted to the head/tail areas, with CRC encoding, the receiving system does not perform CRC decoding on the second RS sub-frame group.

After the inverse process of row permutation, the error flags indicating the presence of errors in each packet (or row), which are succeeded along with the first RS sub-frame, are used to perform the RS decoding process (S902). Herein, in Step 903, a CRC error flag corresponding to each row within the first RS sub-frame is verified in order to determine whether the number of rows having errors within the first RS sub-frame is equal to or smaller than a maximum number of errors (=Nc-Kc) that can be corrected by erasure, when performing RS decoding in a column direction. If it is determined that the number of rows within the first RS sub-frame having errors existing therein is equal to or smaller than the maximum number of errors that can be corrected by erasure, (85,67)-RS erasure decoding is performed in a column direction on the first RS sub-frame having 85 187-byte rows, and the 18 parity data bytes added at the end of each column are removed (S904 and S908). Accordingly, as shown in Step 908, a RS frame configured of 67 187-byte rows (or packets) may be obtained. And, as shown in Step 909, the MPEG synchronization byte, which was removed from the foremost portion (or beginning) of each 187-byte row is added once again, so that an enhanced TS packet recovered back to 188 bytes is outputted.

Meanwhile, in Step 903, if it is determined that the number of rows within the first RS sub-frame having errors existing therein is larger than the maximum number of errors (=Nc-Kc) that can be corrected by erasure, (85,67)-RS erasure decoding is performed in a column direction on the first RS sub-frame having 85 187-byte rows (S905). Then, based upon the result of performing the (85,67)-RS erasure decoding process, it is determined whether all of the errors within the first RS sub-frame are corrected (S906). Based upon the result of the (85,67)-RS decoding process of Step 906, if it is determined that all errors are corrected, the parity data bytes that were added at the end of each column are removed. Then, a RS frame configured of 67 187-byte rows (or packets) may be obtained, as shown in Step 908. And, as shown in Step 909, the MPEG synchronization byte, which was removed from the foremost portion (or beginning) of each 187-byte row, is added once again so as to output an enhanced TS packet that is recovered back to 188 bytes. Alternatively, if the result of the (85,67)-RS decoding process of Step 906 determines that not all errors are corrected, then RS decoding is performed by combining the first RS sub-frame and the second RS sub-frame (S907).

Figure 18:
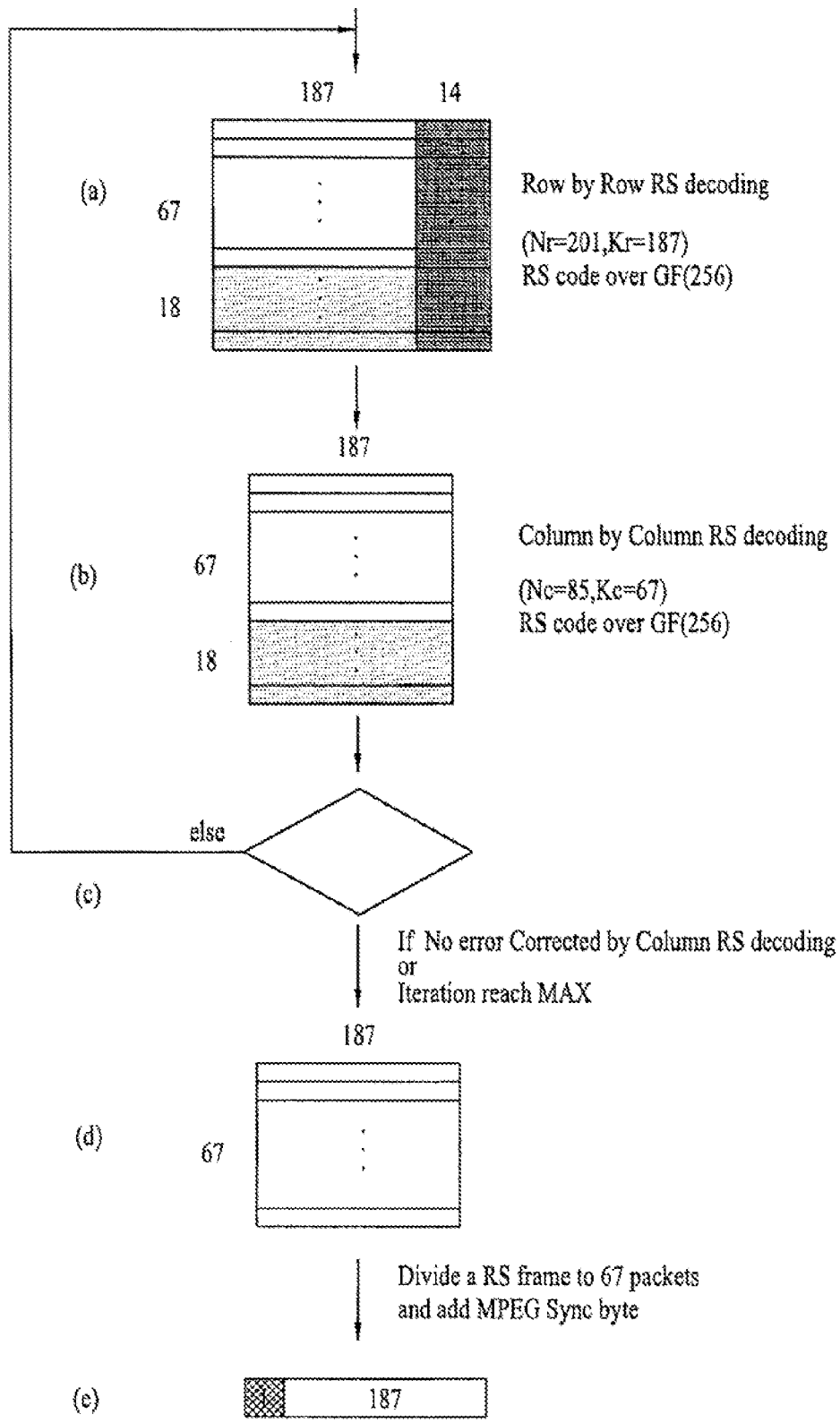
FIG. 18 illustrates a detailed diagram showing the steps of combining first and second sub-frames and performing the error correction encoding process of FIG. 17.

FIG. 18 illustrates an example of combining the first RS sub-frame, which is transmitted to the body area, and the second RS sub-frame, which is transmitted to the head/tail areas, in Step 907, so as to perform RS decoding. When the first RS sub-frame is merged with the second RS sub-frame, each RS sub-frame being processed with inverse processes of row permutation, the RS frame having 85 201-byte packets (or rows) may be obtained, as shown in FIG. 18(a). At this point, each RS frame has already been individually processed with double RS encoding by the transmitting. Therefore, the RS frame decoder 806 performs a double RS decoding process, as an inverse process of the double RS encoding performed by the transmitting system.

For example, if (85,67)-RS encoding was performed in a column direction, and if the RS-encoded result was processed with (201,187)-RS encoding in a row direction, as shown in FIG. 2, the RS frame decoder 806 performs (201,187)-RS decoding (i.e., primary RS decoding) in a row direction on each RS frame, as shown in FIG. 18(a). Subsequently, the RS frame decoder 806 performs (85,67)-RS decoding (i.e., secondary RS decoding) in a column direction on each RS frame, as shown in FIG. 18(b). At this point, FIG. 18(a) illustrates an example of performing (201,187)-RS encoding in a row direction on a RS frame having 85 201-byte rows. And, FIG. 18(b) illustrates an example of performing (85,67)-RS decoding in a column direction on a RS frame having 85 187-byte rows. Thereafter, in accordance with a pre-determined condition, the RS decoding process in a column direction and the RS decoding process in a row direction are either repeated or the decoding process is ended.

Herein, the pre-determined condition may be selected from a selection of conditions. In the example given in the present invention, whether or not to repeat the decoding process is decided based upon the pre-determined number of repetition and the number of error that are corrected by performing the secondary RS decoding process. More specifically, if the decoding process is repeated as much as the pre-determined maximum number of repetition, or if additional error correction is not performed as a result of the secondary RS decoding process, the decoding process is ended. Otherwise, the primary RS decoding process and the secondary RS decoding process are continuously repeated. Once the (85,67)-RS decoding process is performed in a column direction, as shown in FIG. 18(b), a process of verifying whether the pre-determined maximum number of repetition is completed or whether not a single data byte has been error corrected as a result of the RS decoding process performed in a column direction is carried out, as shown in FIG. 18(c).

At this point, as shown in FIG. 18(c), if the pre-determined maximum number of repetition still remains, and if at least one data byte has been error corrected after performing the RS decoding process in a column direction, the process step returns to the step shown in FIG. 18(a), thereby performing once again the RS decoding process in a row direction on the RS frame RS-decoded in a column direction. More specifically, as a result of the RS decoding process performed in a column direction, if at least one error corrected data byte exists, and if a RS decoding process is performed in a row direction on the RS frame that has been RS decoded in a column direction, there is a possibility of performing additional error correction during the process of performing RS decoding in a row direction. Moreover, if a RS decoding process is performed once again in a column direction on the RS frame that has been additionally error corrected after being processed with a RS decoding process in a row direction, there is also a possibility of performing additional error correction.

Therefore, in the present invention, if at least one error corrected data byte exists as a result of a RS decoding process performed in a column direction within the pre-determined range of number of repeating the decoding process, the RS decoding process is repeated in both row and column directions while reflecting the error corrected results in order to enhanced the decoding performance. At this point, if the RS decoding process is repeated in both row and column directions, errors are continuously corrected so as to enhance the decoding performance. However, in a particular state of error, an error may be corrected by the RS decoding process performed in a row direction, while another error may occur in a row direction due to a RS decoding process performed in a column direction. This may eventually lead to an endless repetition of correcting and creating errors. Therefore, in the present invention, the number of repetition is limited in order to prevent such endless repetition of correcting and creating errors from occurring.

Furthermore, when there is no error corrected data byte as a result of a RS decoding process performing in a column direction, this indicates that an error no longer exists within the RS frame. Therefore, there is no need to repeat the RS decoding process. Accordingly, as shown in FIG. 18(c), if the pre-determined maximum number of repetition is completed, and if not a single data byte is error corrected after performing the RS decoding process in a column direction, the RS decoding process is ended, as shown in FIG. 18(d), and the 14-byte parity data added at the end of each row and the 18-byte parity data added at the end of each column, which are added while performing the double RS decoding process, are removed. Thus, an RS frame configured of 67 187-byte rows (or packets) may be obtained, as shown in FIG. 18(d).

Finally, as shown in FIG. 18(e), the MPEG synchronization byte, which was removed from the foremost portion (or beginning) of each 187-byte row, is added once again so as to output an enhanced TS packet that is recovered back to 188 bytes. Herein, the number of repetition and the number of error corrected data bytes, both deciding whether to repeat the RS decoding process, may vary according to the design of the system designer. Therefore, the conditions are not limited only to the examples set forth in the description of the present invention.

Fourth Embodiment

Figure 19:
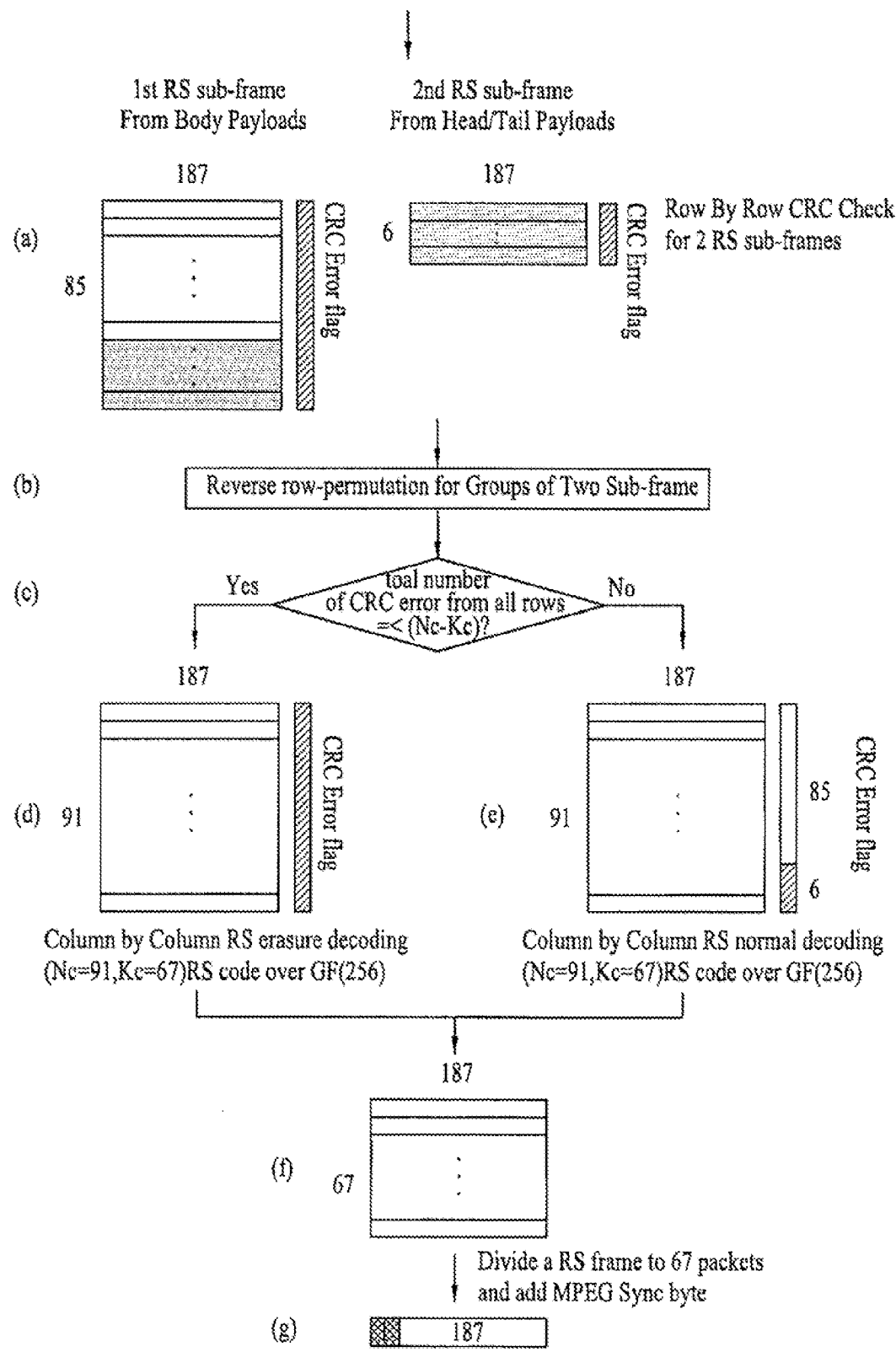
FIG. 19 illustrates a flow chart showing the general steps of an error correction decoding process according to a fourth embodiment of the present invention.

In the fourth embodiment of the present invention, a decoding process is performed on the enhanced data processed with the encoding process and transmitted from the transmitting system according to the second embodiment of the present invention. FIG. 19 illustrates a flow chart showing the general steps of the RS encoding process according to the fourth embodiment of the present invention. More specifically, referring to FIG. 19, the RS decoding process may vary in accordance with the sum of the number of errors within the first RS sub-frame, which is transmitted to the body area within the data group, and the number of errors within the second RS sub-frame, which is transmitted to the head/tail areas within the data group.

In order to do so, the RS frame decoder 806 groups (or gathers) G number of first RS sub-frames, which are transmitted to the body area, so as to create a first RS sub-frame group of 85*G 187-byte units. Herein, a first RS sub-frame is configured of 85 187-byte rows (or packets), as shown in FIG. 18(a). And, when using a 1-byte CRC (i.e., an 8-bit CRC), as shown in FIG. 5(a), each of the 188-byte packets within the first RS sub-frame group is verified for existing errors. Then, after removing the 1-byte CRC checksum and leaving only 187 bytes, the presence of an error is indicated by an error flag corresponding to the packet. On the other hand, when using a 2-byte CRC (i.e., a 16-bit CRC), as shown in FIG. 5(b) and FIG. 5(c), two 188-byte packets are verified for existing errors. Then, the 2-byte CRC checksum is removed, thereby creating 2 187-byte packets. Thereafter, the presence of an error is indicated by an error flag corresponding to each of the packets, respectively. Herein, when using the 2-byte CRC checksum, errors should be indicated to exist either in both packets or in none of the two packets.

After checking for any error in each row by using the CRC checksum, an inverse process of the row permutation process is performed on the first RS sub-frame, as shown in FIG. 19(b), so as to align the first RS sub-frame group configured of 85*G 187-byte units, thereby aligning the first RS sub-frame group in the transmitting system. Thereafter, the first RS sub-frame group is divided into G number of first RS sub-frames, which are configured of 85 187-byte units. When performing the inverse process of row permutation, the error flags corresponding to each packet (or row), and which indicates whether an error exists or not, are also changed and succeeded accordingly.

The RS frame decoder 806 also groups G number of second RS sub-frames that are being transmitted to the head/tail areas, thereby creating a second RS sub-frame group formed of 6*G second RS sub-frames. Herein, a second RS sub-frame is configured of 6 187-byte rows (or packets), as shown in FIG. 18(a). And, when using a 1-byte CRC (i.e., an 8-bit CRC), as shown in FIG. 5(a), each of the 188-byte packets within the first RS sub-frame group is verified for existing errors. Then, after removing the 1-byte CRC checksum and leaving only 187 bytes, the presence of an error is indicated by an error flag corresponding to the packet. On the other hand, when using a 2-byte CRC (i.e., a 16-bit CRC), as shown in FIG. 5(b) and FIG. 5(c), two 188-byte packets are verified for existing errors. Then, the 2-byte CRC checksum is removed, thereby creating 2 187-byte packets. Thereafter, the presence of an error is indicated by an error flag corresponding to each of the packets, respectively. Herein, when using the 2-byte CRC checksum, errors should be indicated to exist either in both packets or in none of the two packets.

After checking for any error in each row by using the CRC checksum, an inverse process of the row permutation process is performed on the second RS sub-frame group, as shown in FIG. 19(b), so as to align the second RS sub-frame group configured of 6*G 187-byte units, thereby aligning the second RS sub-frame group in the transmitting system. Thereafter, the second RS sub-frame group is divided into G number of second RS sub-frames, which are configured of 6 187-byte units. Similarly, when performing the inverse process of row permutation, the error flags corresponding to each packet (or row), and which indicates whether an error exists or not, are also changed and succeeded accordingly.

At this point, when the first and second RS sub-frames, which are processed with the inverse process of row permutation, are combined, a RS frame having 91 packets (or rows) configured of 187 bytes is obtained. As shown in FIG. 19(c), a process of verifying whether the total number of CRC errors occurring in the RS frame is greater than the number of parity bytes added to the RS frame. Herein, the total number of CRC errors occurring in the RS frame may be known by verifying the CRC error flag corresponding to each row within the RS frame. And, the number of parity bytes added to the RS frame may be known by performing Nc-Kc. If the total number of CRC errors occurring in the RS frame is equal to or smaller than the number of parity bytes added to the RS frame, the values of the 91 CRC error flags corresponding to each row within the RS frame are used, as shown in FIG. 19(d), thereby performing a (91,67)-RS erasure decoding process in each column direction of the RS frame.

Meanwhile, if the total number of CRC errors occurring in the RS frame is greater than the number of parity bytes added to the RS frame, the values of the 6 CRC error flags corresponding to each row of the second RS sub-frame within the RS frame are used, as shown in FIG. 19(e), thereby performing a (91,67)-RS erasure decoding process in each column direction of the RS frame. In another embodiment of the present invention, if the total number of CRC errors occurring in the RS frame is greater than the number of parity bytes added to the RS frame, a (91,67)-RS decoding process may be performed without using the CRC error flag values.

When the RS decoding process is performed on each RS frame, as shown in FIG. 19(d) or FIG. 19(e), the 24 parity bytes that were added to the end of each column when performing the RS encoding process are removed. Thus, a RS frame configured of 67 187-byte rows (or packets) may be obtained, as shown in FIG. 19(f). Furthermore, as shown in FIG. 19(g), the MPEG synchronization byte, which was removed from the foremost portion (or beginning) of each 187-byte row, is added once again so as to output an enhanced TS packet that is recovered back to 188 bytes.

Figure 20:
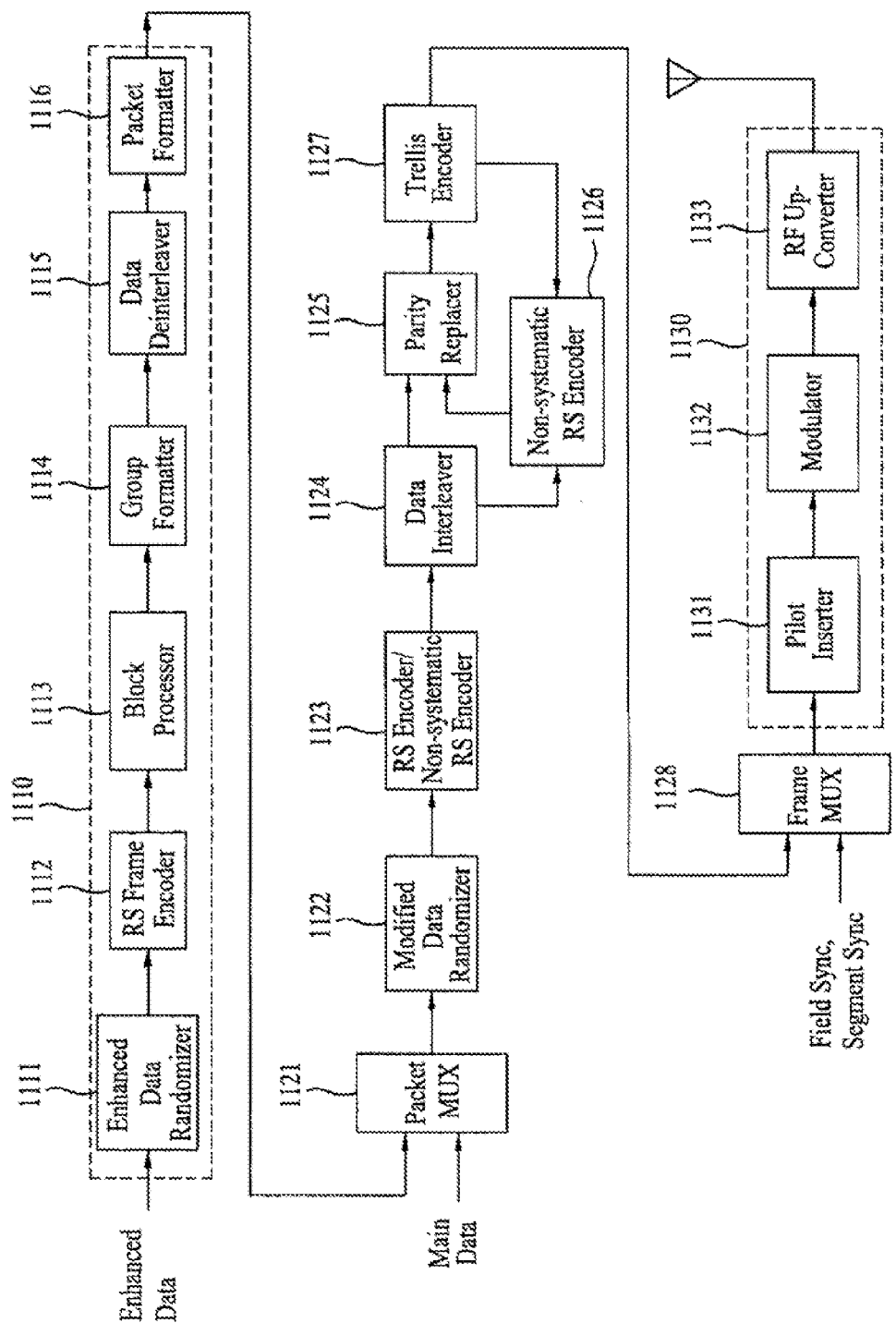
FIG. 20 illustrates a block diagram showing the structure of a digital broadcast transmitting system according to yet another embodiment of the present invention.

FIG. 20 illustrates a block diagram showing the structure of a digital broadcast transmitting system according to an embodiment of the present invention. The digital broadcast (or DTV) transmitting system includes a pre-processor 1110, a packet multiplexer 1121, a data randomizer 1122, a Reed-Solomon (RS) encoder/non-systematic RS encoder 1123, a data interleaver 1124, a parity byte replacer 1125, a non-systematic RS encoder 1126, a frame multiplexer 1128, and a transmitting system 1130. The pre-processor 1110 includes an enhanced data randomizer 1111, a RS frame encoder 1112, a block processor 1113, a group formatter 1114, a data deinterleaver 1115, and a packet formatter 1116.

In the present invention having the above-described structure, main data are inputted to the packet multiplexer 1121. Enhanced data are inputted to the enhanced data randomizer 1111 of the pre-processor 1110, wherein an additional coding process is performed so that the present invention can respond swiftly and appropriately against noise and change in channel. The enhanced data randomizer 1111 randomizes the received enhanced data and outputs the randomized enhanced data to the RS frame encoder 1112. At this point, by having the enhanced data randomizer 1111 perform the randomizing process on the enhanced data, the randomizing process on the enhanced data by the data randomizer 1122 in a later process may be omitted. Either the randomizer of the conventional broadcast system may be used as the randomizer for randomizing the enhanced data, or any other type of randomizer may be used herein.

The RS frame encoder 1112 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 1112 also includes a process of mixing in row units many sets of enhanced data each having a predetermined size. By performing an error correction coding process on the inputted enhanced data, the RS frame encoder 1112 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 1112 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 1112 is inputted to the block processor 1113. The block processor 1113 codes the RS-coded and CRC-coded enhanced data at a coding rate of M1/N1. Then, the block processor 1113 outputs the M1/N1-rate coded enhanced data to the group formatter 1114. In order to do so, the block processor 1113 identifies the block data bytes being inputted from the RS frame encoder 1112 as bits.

The block processor 1113 may receive supplemental information data such as signaling information, which include information on the system, and identifies the supplemental information data bytes as data bits. Herein, the supplemental information data, such as the signaling information, may equally pass through the enhanced data randomizer 1111 and the RS frame encoder 1112 so as to be inputted to the block processor 1113. Alternatively, the supplemental information data may be directly inputted to the block processor 1113 without passing through the enhanced data randomizer 1111 and the RS frame encoder 1112. The signaling information corresponds to information required for receiving and processing data included in the data group in the receiving system. Such signaling information includes data group information, multiplexing information, and burst information.

As a M1/N1-rate encoder, the block processor 1113 codes the inputted data at a coding rate of M1/N1 and then outputs the M1/N1-rate coded data. For example, if 1 bit of the input data is coded to 2 bits and outputted, then M1 is equal to 1 and N1 is equal to 2 (i.e., M1=1 and N1=2). Alternatively, if 1 bit of the input data is coded to 4 bits and outputted, then M1 is equal to 1 and N1 is equal to 4 (i.e., M1=1 and N1=4). As an example of the present invention, it is assumed that the block processor 1113 performs a coding process at a coding rate of ½ (also referred to as a ½-rate coding process) or a coding process at a coding rate of ¼ (also referred to as a ¼-rate coding process). More specifically, the block processor 1113 codes the received enhanced data and supplemental information data, such as the signaling information, at either a coding rate of ½ or a coding rate of ¼. Thereafter, the supplemental information data, such as the signaling information, are identified and processed as enhanced data.

Since the ¼-rate coding process has a higher coding rate than the ½-rate coding process, greater error correction ability may be provided. Therefore, in a later process, by allocating the ¼-rate coded data in an area with deficient receiving performance within the group formatter 1114, and by allocating the ½-rate coded data in an area with excellent receiving performance, the difference in the overall performance may be reduced. More specifically, in case of performing the ½-rate coding process, the block processor 1113 receives 1 bit and codes the received 1 bit to 2 bits (i.e., 1 symbol). Then, the block processor 1113 outputs the processed 2 bits (or 1 symbol). On the other hand, in case of performing the ¼-rate coding process, the block processor 1113 receives 1 bit and codes the received 1 bit to 4 bits (i.e., 2 symbols). Then, the block processor 1113 outputs the processed 4 bits (or 2 symbols). Additionally, the block processor 1113 performs a block interleaving process in symbol units on the symbol-coded data. Subsequently, the block processor 1113 converts to bytes the data symbols that are block-interleaved and have the order rearranged.

The group formatter 1114 inserts the enhanced data outputted from the block processor 1113 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 21:
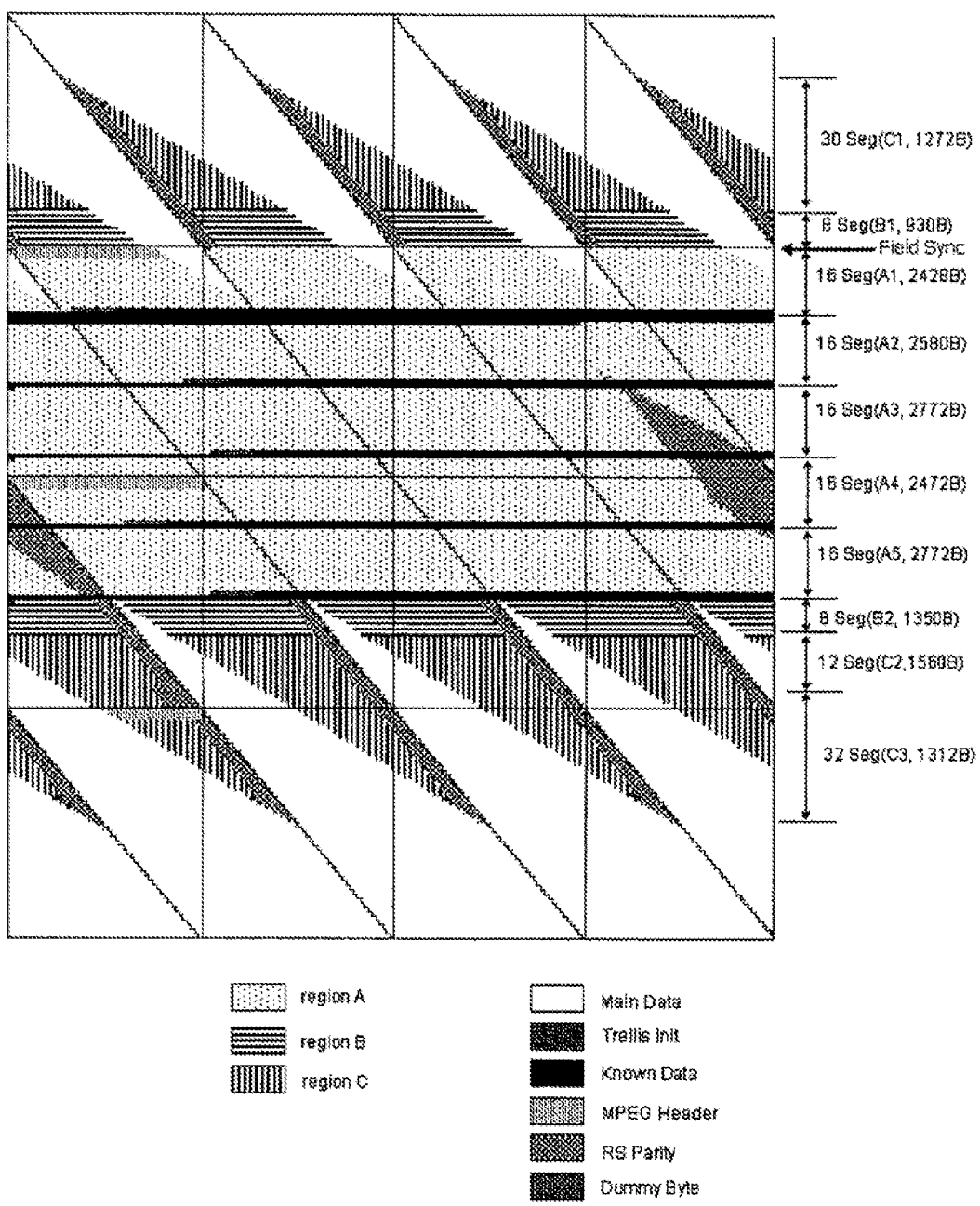
FIG. 21 and FIG. 22 illustrate another examples of data configuration at before and after ends of a data deinterleaver in a transmitting system according to the present invention.
Figure 22:
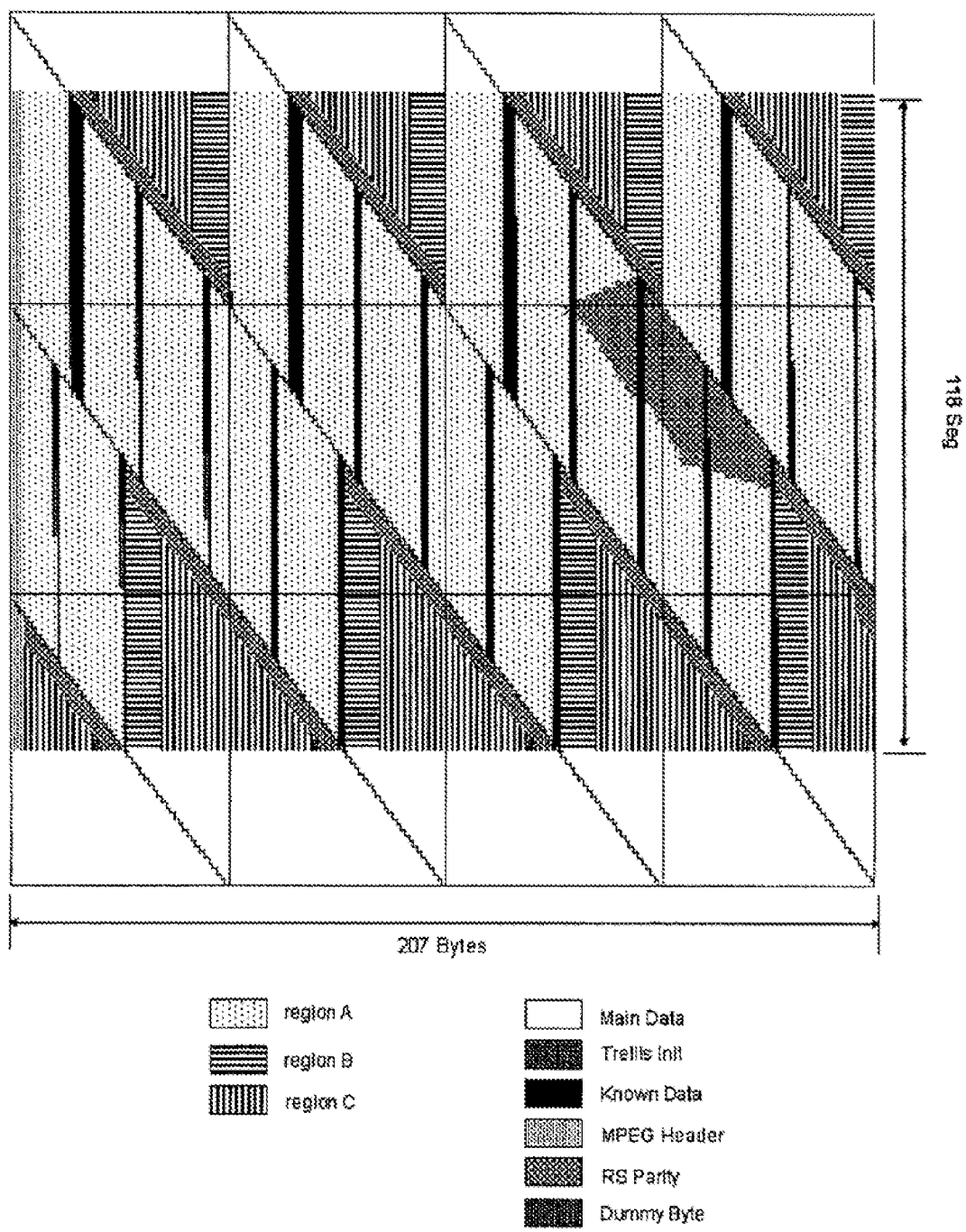

FIG. 21 illustrates an alignment of data before being data deinterleaved and identified, and FIG. 22 illustrates an alignment of data after being data deinterleaved and identified. More specifically, a data structure identical to that shown in FIG. 21 is transmitted to a receiving system. Also, the data group configured to have the same structure as the data structure shown in FIG. 21 is inputted to the data deinterleaver 1115.

As described above, FIG. 21 illustrates a data structure prior to data deinterleaving that is divided into 3 regions, such as region A, region B, and region C. Also, in the present invention, each of the regions A to C is further divided into a plurality of regions. Referring to FIG. 21, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 21. The data group size, the number of hierarchically divided regions within the data group and the size of each region, and the number of enhanced data bytes that can be inserted in each hierarchically divided region of FIG. 21 are merely examples given to facilitate the understanding of the present invention. Herein, the group formatter 1114 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 21, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 1130 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 1113 may encode the enhanced data, which are to be inserted to each region based upon the characteristic of each hierarchical region, at a different coding rate. For example, the block processor 1113 may encode the enhanced data, which are to be inserted in regions A1 to A5 of region A, at a coding rate of ½. Then, the group formatter 1114 may insert the ½-rate encoded enhanced data to regions A1 to A5.

The block processor 1113 may encode the enhanced data, which are to be inserted in regions B1 and B2 of region B, at a coding rate of ¼ having higher error correction ability as compared to the ½-coding rate. Then, the group formatter 1114 inserts the ¼-rate coded enhanced data in region B1 and region B2. Furthermore, the block processor 1113 may encode the enhanced data, which are to be inserted in regions C1 to C3 of region C, at a coding rate of ¼ or a coding rate having higher error correction ability than the ¼-coding rate. Then, the group formatter 1114 may either insert the encoded enhanced data to regions C1 to C3, as described above, or leave the data in a reserved region for future usage.

In addition, the group formatter 1114 also inserts supplemental data, such as signaling information that notifies the overall transmission information, other than the enhanced data in the data group. Also, apart from the encoded enhanced data outputted from the block processor 1113, the group formatter 1114 also inserts MPEG header place holders, non-systematic RS parity place holders, main data place holders, which are related to data deinterleaving in a later process, as shown in FIG. 21. Herein, the main data place holders are inserted because the enhanced data bytes and the main data bytes are alternately mixed with one another in regions B and C based upon the input of the data deinterleaver, as shown in FIG. 21. For example, based upon the data outputted after data deinterleaving, the place holder for the MPEG header may be allocated at the very beginning of each packet.

Furthermore, the group formatter 1114 either inserts known data generated in accordance with a pre-determined method or inserts known data place holders for inserting the known data in a later process. Additionally, place holders for initializing the trellis encoder 1127 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 1114 is inputted to the data deinterleaver 1115. And, the data deinterleaver 1115 deinterleaves data by performing an inverse process of the data interleaver on the data and place holders within the data group, which are then outputted to the packet formatter 1116. More specifically, when the data and place holders within the data group configured, as shown in FIG. 21, are deinterleaved by the data deinterleaver 1115, the data group being outputted to the packet formatter 1116 is configured to have the structure shown in FIG. 22.

Among the data deinterleaved and inputted, the packet formatter 1116 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 1114 inserts the known data place holder, the packet formatter 1116 may either insert actual known data in the known data place holder or output the known data place holder without any change or modification for a replacement insertion in a later process. Afterwards, the packet formatter 1116 divides the data within the above-described packet-formatted data group into 188-byte unit enhanced data packets (i.e., MPEG TS packets), which are then provided to the packet multiplexer 1121. The packet multiplexer 1121 multiplexes the 188-byte unit enhanced data packet and main data packet outputted from the packet formatter 1116 according to a pre-defined multiplexing method. Subsequently, the multiplexed data packets are outputted to the data randomizer 1122. The multiplexing method may be modified or altered in accordance with diverse variables of the system design.

As an example of the multiplexing method of the packet multiplexer 1121, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 1122 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 1123. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 1123. This is because the randomizing process has already been performed on the enhanced data by the enhanced data randomizer 1111 in an earlier process. Herein, a data randomizing process may or may not be performed on the known data (or known data place holder) and the initialization data place holder included in the enhanced data packet.

The RS encoder/non-systematic RS encoder 1123 RS-codes the data randomized by the data randomizer 1122 or the data bypassing the data randomizer 1122. Then, the RS encoder/non-systematic RS encoder 1123 adds a 20-byte RS parity to the coded data, thereby outputting the RS-parity-added data to the data interleaver 1124. At this point, if the inputted data correspond to the main data packet, the RS encoder/non-systematic RS encoder 1123 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 1124 corresponds to a byte unit convolutional interleaver. The output of the data interleaver 1124 is inputted to the parity byte replacer 1125 and the non-systematic RS encoder 1126.

Meanwhile, a memory within the trellis encoding module 1127, which is positioned after the parity byte replacer 1125, should first be initialized in order to allow the output data of the trellis encoding module 1127 so as to become the known data defined based upon an agreement between the receiving system and the transmitting system. More specifically, the memory of the trellis encoding module 1127 should first be initialized before the known data sequence being inputted is trellis-encoded. At this point, the beginning of the known data sequence that is inputted corresponds to the initialization data place holder inserted by the group formatter 1114 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 1127, thereby generating the trellis memory initialization data accordingly. Due to the influence of the replace initialization data, a process of recalculating the RS parity, thereby replacing the RS parity outputted from the trellis encoding module 1127 with the newly calculated RS parity is required. Accordingly, the non-systematic RS encoder 1126 receives the enhanced data packet including the initialization data place holder that is to be replaced with the initialization data from the data interleaver 1124 and also receives the initialization data from the trellis encoding module 1127. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 1125. Accordingly, the parity byte replacer 1125 selects the output of the data interleaver 1124 as the data within the enhanced data packet, and selects the output of the non-systematic RS encoder 1126 as the RS parity. Thereafter, the parity byte replacer 1125 outputs the selected data.

Meanwhile, if the main data packet is inputted, or if the enhanced data packet that does not include the initialization data place holder that is to be replaced, the parity byte replacer 1125 selects the data and RS parity outputted from the data interleaver 1124 and directly outputs the selected data to the trellis encoding module 1127 without modification. The trellis encoding module 1127 converts the byte-unit data to symbol-unit data and 12-way interleaves and trellis-encodes the converted data, which are then outputted to the frame multiplexer 1128. The frame multiplexer 1128 inserts field synchronization and segment synchronization signals in the output of the trellis encoding module 1127 and then outputs the processed data to the transmitting unit 1130. Herein, the transmitting unit 1130 includes a pilot inserter 1131, a modulator 1132, and a radio frequency (RF) up-converter 1133. The operation of the transmitting unit 1130 is identical to the conventional transmitters. Therefore, a detailed description of the same will be omitted for simplicity.

Figure 23:
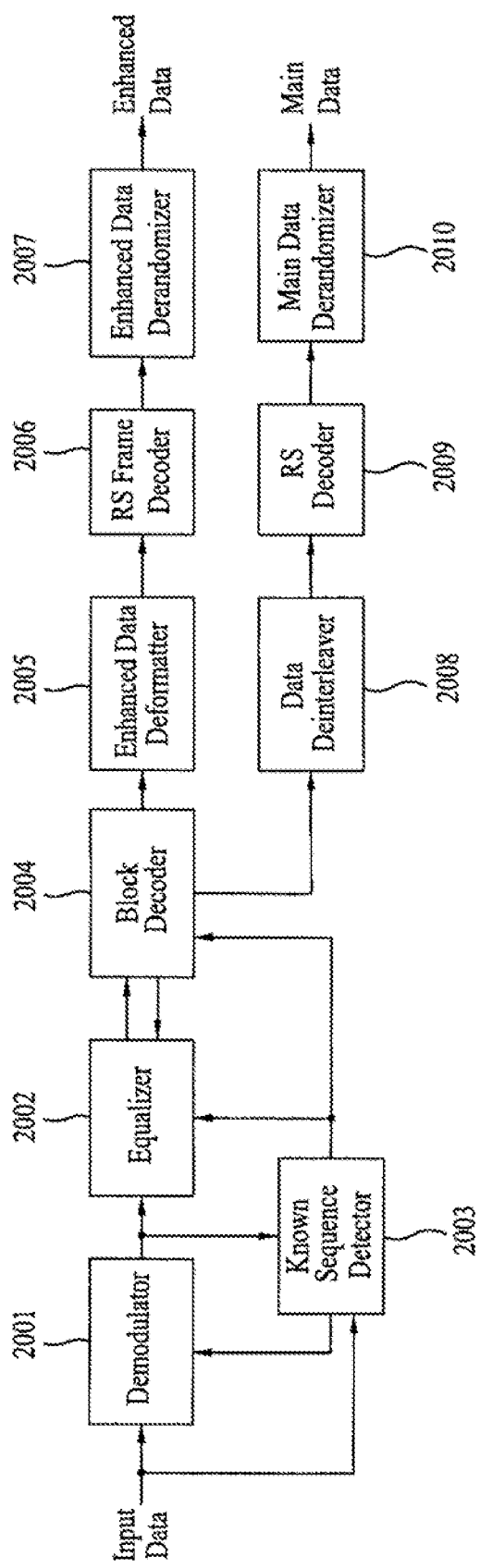
FIG. 23 illustrates a block diagram showing a general structure of a demodulating unit within a digital broadcast (or television or DTV) receiving system according to another embodiment of the present invention.

FIG. 23 illustrates a block diagram of a demodulating unit included in the receiving system according to another embodiment of the present invention. Herein, the demodulating unit may effectively process signals transmitted from the transmitting system shown in FIG. 20. Referring to FIG. 23, the demodulating unit includes a demodulator 2001, a channel equalizer 2002, a known data detector 2003, a block decoder 2004, an enhanced data deformatter 2005, a RS frame decoder 2006, an enhanced data derandomizer 2007, a data deinterleaver 2008, a RS decoder 2009, and a main data derandomizer 2010. For simplicity, the demodulator 2001, the channel equalizer 2002, the known data detector 2003, the block decoder 2004, the enhanced data deformatter 2005, the RS frame decoder 2006, and the enhanced data derandomizer 2007 will be referred to as an enhanced data processor. And, the data deinterleaver 2008, the RS decoder 2009, and the main data derandomizer 2010 will be referred to as a main data processor.

More specifically, the enhanced data including known data and the main data are received through the tuner and inputted to the demodulator 2001 and the known data detector 2003. The demodulator 2001 performs automatic gain control, carrier wave recovery, and timing recovery on the data that are being inputted, thereby creating baseband data, which are then outputted to the equalizer 2002 and the known data detector 2003. The equalizer 2002 compensates the distortion within the channel included in the demodulated data. Then, the equalizer 2002 outputs the compensated data to the block decoder 2004.

At this point, the known data detector 2003 detects the known data place inserted by the transmitting system to the input/output data of the demodulator 2001 (i.e., data prior to demodulation or data after demodulation). Then, along with the position information, the known data detector 2003 outputs the symbol sequence of the known data generated from the corresponding position to the demodulator 2001 and the equalizer 2002. Additionally, the known data detector 2003 outputs information enabling the block decoder 2004 to identify the enhanced data being additionally encoded by the transmitting system and the main data that are not additionally encoded to the block decoder 2004. Furthermore, although the connection is not shown in FIG. 23, the information detected by the known data detector 2003 may be used in the overall receiving system and may also be used in the enhanced data formatter 2005 and the RS frame decoder 2006.

By using the known data symbol sequence when performing the timing recovery or carrier wave recovery, the demodulating performance of the demodulator 2001 may be enhanced. Similarly, by using the known data, the channel equalizing performance of the channel equalizer 2002 may be enhanced. Furthermore, by feeding-back the decoding result of the block decoder 2004 to the channel equalizer 2002, the channel equalizing performance may also be enhanced.

The channel equalizer 2002 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 21. More specifically, in the example of the present invention, each region A, B, and C are further divided into regions A1 to A5, regions B1 and B2, and regions C1 to C3, respectively. Referring to FIG. 21, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 2004 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 2004 correspond to the main data on which additional encoding is not performed and only trellis-encoding is performed by the transmitting system, only the trellis-decoding process is performed. The data group decoded by the block decoder 2004 is inputted to the enhanced data deformatter 2005, and the main data packet is inputted to the data deinterleaver 2008.

More specifically, if the inputted data correspond to the main data, the block decoder 2004 performs Viterbi decoding on the inputted data, so as to either output a hard decision value or hard-decide a soft decision value and output the hard-decided result. On the other hand, if the inputted correspond to the enhanced data, the block decoder 2004 outputs either a hard decision value or a soft decision value on the inputted enhanced data. In other words, if the data inputted to the block decoder 2004 correspond to the enhanced data, the block decoder 2004 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 2004 may output a hard decision value on the enhanced data. However, when required, it is more preferable that the block decoder 2004 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 2008, the RS decoder 2009, and the main data derandomizer 2010 are blocks required for receiving the main data. These blocks may not be required in a receiving system structure that receives only the enhanced data. The data deinterleaver 2008 performs an inverse process of the data interleaver of the transmitting system. More specifically, the data deinterleaver 2008 deinterleaves the main data being outputted from the block decode 2004 and outputs the deinterleaved data to the RS decoder 2009. The RS decoder 2009 performs systematic RS decoding on the deinterleaved data and outputs the systematically decoded data to the main data derandomizer 2010. The main data derandomizer 2010 receives the data outputted from the RS decoder 2009 so as to generate the same pseudo random byte as that of the randomizer in the transmitting system. The main data derandomizer 2010 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 2005 from the block decoder 2004 is a data group format. At this point, the enhanced data deformatter 2005 already knows the structure of the input data. Therefore, the enhanced data deformatter 2005 identifies the system information including signaling information and the enhanced data from the data group. Thereafter, the identified signaling information is transmitted to where the system information is required, and the enhanced data are outputted to the RS frame decoder 2006. The enhanced data deformatter 2005 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 2006.

More specifically, the RS frame decoder 2006 receives the RS-coded and CRC-coded enhanced data from the enhanced data deformatter 2005 so as to configure the RS frame. The RS frame decoder 2006 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 2007. Herein, the enhanced data derandomizer 2007 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 2006 may also be configured as follows. The RS frame decoder 2006 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 2006 compares the absolute value of the soft decision value obtained from the block decoder 2004 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 24:
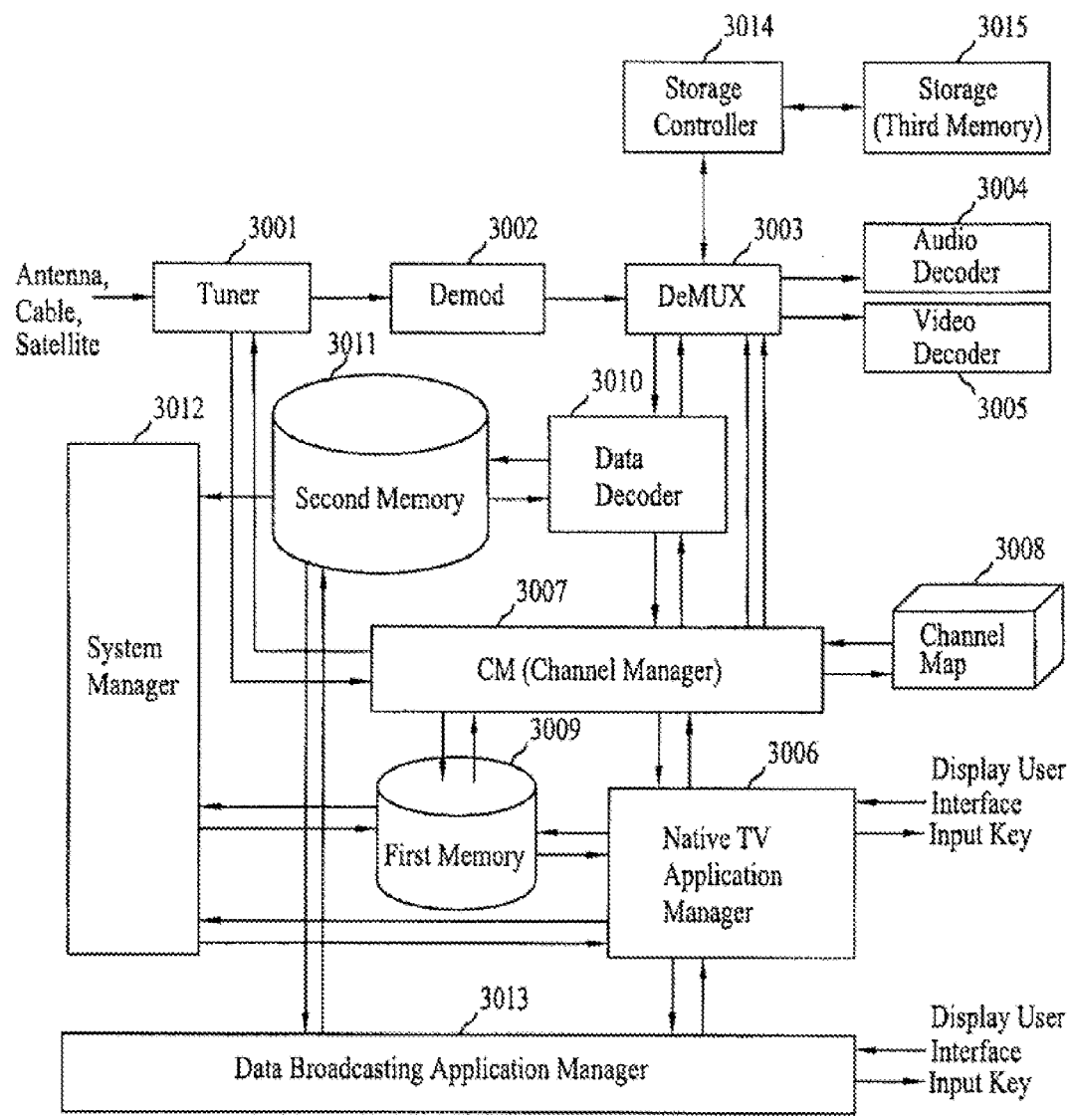
FIG. 24 illustrates a block diagram showing the structure of a digital broadcast (or television or DTV) receiving system according to an embodiment of the present invention.

FIG. 24 illustrates a block diagram showing the structure of a digital broadcast receiving system according to an embodiment of the present invention. Referring to FIG. 24, the digital broadcast receiving system includes a tuner 3001, a demodulating unit 3002, a demultiplexer 3003, an audio decoder 3004, a video decoder 3005, a native TV application manager 3006, a channel manager 3007, a channel map 3008, a first memory 3009, a data decoder 3010, a second memory 3011, a system manager 3012, a data broadcasting application manager 3013, a storage controller 3014, and a third memory 3015. Herein, the third memory 3015 is a mass storage device, such as a hard disk drive (HDD) or a memory chip. The tuner 3001 tunes a frequency of a specific channel through any one of an antenna, cable, and satellite. Then, the tuner 3001 down-converts the tuned frequency to an intermediate frequency (IF), which is then outputted to the demodulating unit 3002. At this point, the tuner 3001 is controlled by the channel manager 3007. Additionally, the result and strength of the broadcast signal of the tuned channel are also reported to the channel manager 3007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 3002 performs demodulation and channel equalization on the signal being outputted from the tuner 3001, thereby identifying the main data and the enhanced data. Thereafter, the identified main data and enhanced data are outputted in TS packet units. Examples of the demodulating unit 3002 are shown in FIG. 16 and FIG. 23. The demodulating unit shown in FIG. 16 and FIG. 23 is merely exemplary and the scope of the present invention is not limited to the examples set forth herein. In the embodiment given as an example of the present invention, only the enhanced data packet outputted from the demodulating unit 3002 is inputted to the demultiplexer 3003. In this case, the main data packet is inputted to another demultiplexer (not shown) that processes main data packets. Herein, the storage controller 3014 is also connected to the other demultiplexer in order to store the main data after processing the main data packets. The demultiplexer of the present invention may also be designed to process both enhanced data packets and main data packets in a single demultiplexer.

The storage controller 3014 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 24, the corresponding enhanced data and/or main data that are inputted to the demultiplexer are stored in the third memory 3015 in accordance with the control of the storage controller 3014. The third memory 3015 may be described as a temporary storage area and/or a permanent storage area. Herein, the temporary storage area is used for the time shifting function, and the permanent storage area is used for a permanent storage of data according to the user's choice (or decision).

When the data stored in the third memory 3015 need to be reproduced (or played), the storage controller 3014 reads the corresponding data stored in the third memory 3015 and outputs the read data to the corresponding demultiplexer (e.g., the enhanced data are outputted to the demultiplexer 3003 shown in FIG. 24). At this point, according to the embodiment of the present invention, since the storage capacity of the third memory 3015 is limited, the compression encoded enhanced data and/or main data that are being inputted are directly stored in the third memory 3015 without any modification for the efficiency of the storage capacity. In this case, depending upon the reproduction (or reading) command, the data read from the third memory 3015 pass trough the demultiplexer so as to be inputted to the corresponding decoder, thereby being restored to the initial state.

The storage controller 3014 may control the reproduction (or play), fast-forward, rewind, slow motion, instant replay functions of the data that are already stored in the third memory 3015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 3014 compression encodes the inputted data and stored the compression-encoded data to the third memory 3015. In order to do so, the storage controller 3014 may include an encoder, wherein the encoder may be embodied as one of software, middleware, and hardware. Herein, an MPEG encoder may be used as the encoder according to an embodiment of the present invention. The encoder may also be provided outside of the storage controller 3014.

Meanwhile, in order to prevent illegal duplication (or copies) of the input data being stored in the third memory 3015, the storage controller 3014 scrambles the input data and stores the scrambled data in the third memory 3015. Accordingly, the storage controller 3014 may include a scramble algorithm for scrambling the data stored in the third memory 3015 and a descramble algorithm for descrambling the data read from the third memory 3015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 3003 receives the real-time data outputted from the demodulating unit 3002 or the data read from the third memory 3015 and demultiplexes the received data. In the example given in the present invention, the demultiplexer 3003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 3003 and the subsequent elements.

The demultiplexer 3003 demultiplexes enhanced data and program specific information/program and system information protocol (PSI/PSIP) tables from the enhanced data packet inputted in accordance with the control of the data decoder 3010. Thereafter, the demultiplexed enhanced data and PSI/PSIP tables are outputted to the data decoder 3010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 3010, the demultiplexer 3003 performs section filtering, thereby discarding repetitive sections and outputting only the non-repetitive sections to the data decoder 3010. The demultiplexer 3003 may also output only the sections configuring desired tables (e.g., VCT) to the data decoder 3010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 3003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 3003 may output only an application information table (AIT) to the data decoder 3010 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 3011 by the data decoder 3010.

The data decoder 3010 parses the DSM-CC section configuring the demultiplexed enhanced data. Then, the enhanced data corresponding to the parsed result are stored as a database in the second memory 3011. The data decoder 3010 groups a plurality of sections having the same table identification (table_id) so as to configure a table, which is then parsed. Thereafter, the parsed result is stored as a database in the second memory 3011. At this point, by parsing data and/or sections, the data decoder 3010 reads all of the remaining actual section data that are not section-filtered by the demultiplexer 3003. Then, the data decoder 3010 stores the read data to the second memory 3011. The second memory 3011 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 3011 or be outputted to the data broadcasting application manager 3013. In addition, reference may be made to the application identification information, service component identification information, and service information in order to decode the data service data. Alternatively, such information may also prepare the operation of the application program for the data service. Furthermore, the data decoder 3010 controls the demultiplexing of the system information table, which corresponds to the information table associated with the channel and events. Thereafter, an A.V PID list may be transmitted to the channel manager 3007.

The channel manager 3007 may refer to the channel map 3008 in order to transmit a request for receiving system-related information data to the data decoder 3010, thereby receiving the corresponding result. In addition, the channel manager 3007 may also control the channel tuning of the tuner 3001. Furthermore, the channel manager 3007 may directly control the demultiplexer 3003, so as to set up the A/V PID, thereby controlling the audio decoder 3004 and the video decoder 3005. The audio decoder 3004 and the video decoder 3005 may respectively decode and output the audio data and video data demultiplexed from the main data packet. Alternatively, the audio decoder 3004 and the video decoder 3005 may respectively decode and output the audio data and video data demultiplexed from the enhanced data packet. Meanwhile, when the enhanced data include data service data, and also audio data and video data, it is apparent that the audio data and video data demultiplexed by the demultiplexer 3003 are respectively decoded by the audio decoder 3004 and the video decoder 3005. For example, an audio-coding (AC)-3 decoding algorithm may be applied to the audio decoder 3004, and a MPEG-2 decoding algorithm may be applied to the video decoder 3005.

Meanwhile, the native TV application manager 3006 operates a native application program stored in the first memory 3009, thereby performing general functions such as channel change. The native application program refers to software stored in the receiving system upon shipping of the product. More specifically, when a user request (or command) is transmitted to the receiving system through a user interface (UI), the native TV application manger 3006 displays the user request on a screen through a graphic user interface (GUI), thereby responding to the user's request. The user interface receives the user request through an input device, such as a remote controller, a key pad, a jog controller, an touch-screen provided on the screen, and then outputs the received user request to the native TV application manager 3006 and the data broadcasting application manager 3013. Furthermore, the native TV application manager 3006 controls the channel manager 3007, thereby controlling channel-associated, such as the management of the channel map 3008, and controlling the data decoder 3010. The native TV application manager 3006 also controls the GUI of the overall receiving system, thereby storing the user request and status of the receiving system in the first memory 3009 and restoring the stored information.

The channel manager 3007 controls the tuner 3001 and the data decoder 3010, so as to managing the channel map 3008 so that it can respond to the channel request made by the user. More specifically, channel manager 3007 sends a request to the data decoder 3010 so that the tables associated with the channels that are to be tuned are parsed. The results of the parsed tables are reported to the channel manager 3007 by the data decoder 3010. Thereafter, based on the parsed results, the channel manager 3007 updates the channel map 3008 and sets up a PID in the demultiplexer 3003 for demultiplexing the tables associated with the data service data from the enhanced data.

The system manager 3012 controls the booting of the receiving system by turning the power on or off. Then, the system manager 3012 stores ROM images (including downloaded software images) in the first memory 3009. More specifically, the first memory 3009 stores management programs such as operating system (OS) programs required for managing the receiving system and also application program executing data service functions. The application program is a program processing the data service data stored in the second memory 3011 so as to provide the user with the data service. If the data service data are stored in the second memory 3011, the corresponding data service data are processed by the above-described application program or by other application programs, thereby being provided to the user. The management program and application program stored in the first memory 3009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 3009 upon the shipping of the receiving system, or be stored in the first 3009 after being downloaded. The application program for the data service (i.e., the data service providing application program) stored in the first memory 3009 may also be deleted, updated, and corrected. Furthermore, the data service providing application program may be downloaded and executed along with the data service data each time the data service data are being received.

When a data service request is transmitted through the user interface, the data broadcasting application manager 3013 operates the corresponding application program stored in the first memory 3009 so as to process the requested data, thereby providing the user with the requested data service. And, in order to provide such data service, the data broadcasting application manager 3013 supports the graphic user interface (GUI). Herein, the data service may be provided in the form of text (or short message service (SMS)), voice message, still image, and moving image. The data broadcasting application manager 3013 may be provided with a platform for executing the application program stored in the first memory 3009. The platform may be, for example, a Java virtual machine for executing the Java program. Hereinafter, an example of the data broadcasting application manager 3013 executing the data service providing application program stored in the first memory 3009, so as to process the data service data stored in the second memory 3011, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 24, the GPS module receives satellite signals transmitted from a plurality of low earth orbit satellites and extracts the current position (or location) information (e.g., longitude, latitude, altitude), thereby outputting the extracted information to the data broadcasting application manager 3013.

At this point, it is assumed that the electronic map including information on each link and nod and other diverse graphic information are stored in one of the second memory 3011, the first memory 3009, and another memory that is not shown. More specifically, according to the request made by the data broadcasting application manager 3013, the data service data stored in the second memory 3011 are read and inputted to the data broadcasting application manager 3013. The data broadcasting application manager 3013 translates (or deciphers) the data service data read from the second memory 3011, thereby extracting the necessary information according to the contents of the message and/or a control signal.

Figure 25:
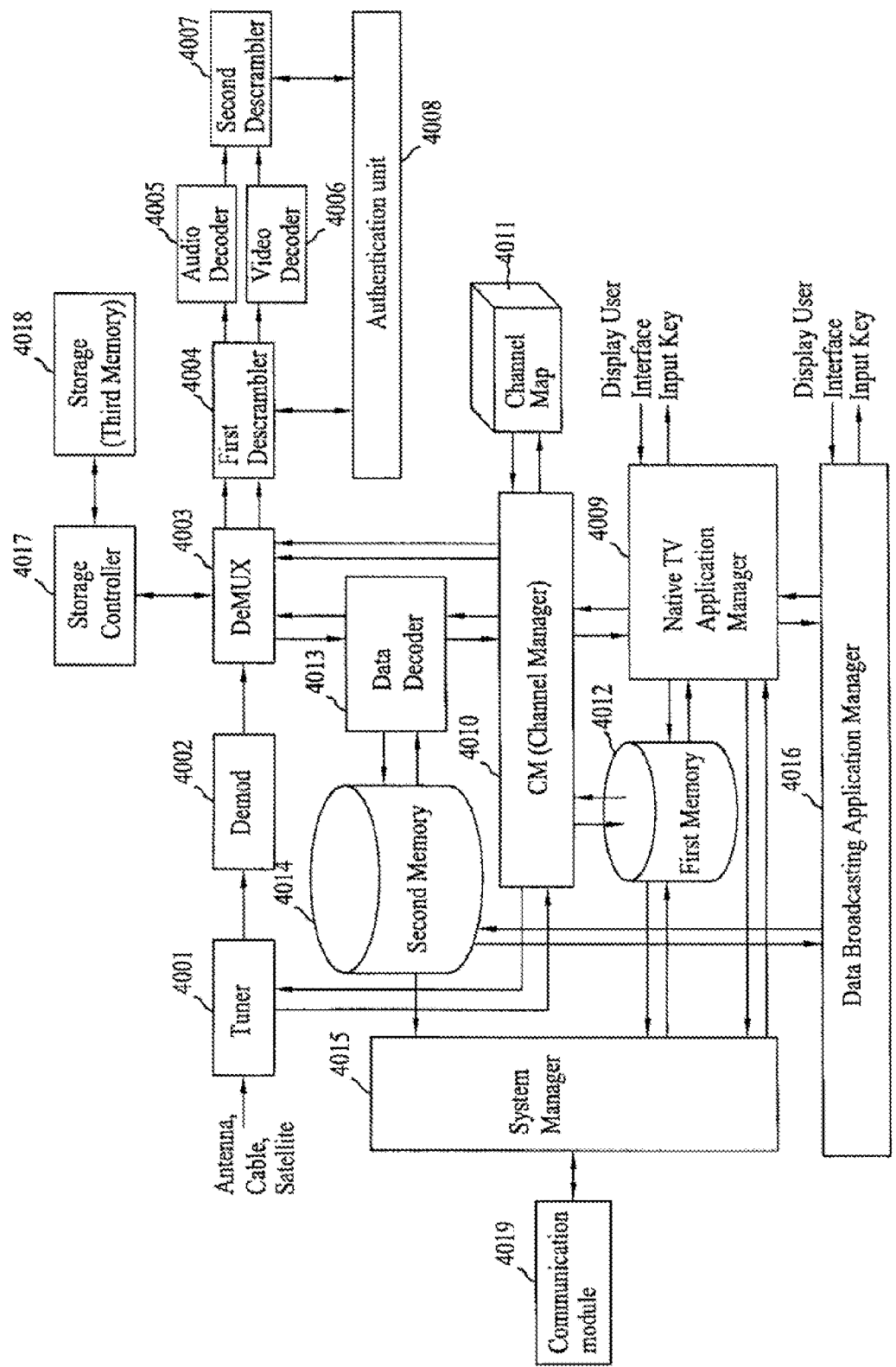
FIG. 25 illustrates a block diagram showing the structure of a digital broadcast (or television or DTV) receiving system according to another embodiment of the present invention.

FIG. 25 illustrates a block diagram showing the structure of a digital broadcast (or television) receiving system according to another embodiment of the present invention. Referring to FIG. 25, the digital broadcast receiving system includes a tuner 4001, a demodulating unit 4002, a demultiplexer 4003, a first descrambler 4004, an audio decoder 4005, a video decoder 4006, a second descrambler 4007, an authentication unit 4008, a native TV application manager 4009, a channel manager 4010, a channel map 4011, a first memory 4012, a data decoder 4013, a second memory 4014, a system manager 4015, a data broadcasting application manager 4016, a storage controller 4017, a third memory 4018, and a telecommunication module 4019. Herein, the third memory 4018 is a mass storage device, such as a hard disk drive (HDD) or a memory chip. Also, during the description of the digital broadcast (or television or DTV) receiving system shown in FIG. 25, the components that are identical to those of the digital broadcast receiving system of FIG. 24 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 4004 and 4007, and the authentication means will be referred to as an authentication unit 4008. Such naming of the corresponding components is merely exemplary and is not limited to the terms suggested in the description of the present invention. For example, the units may also be referred to as a decryptor. Although FIG.

25 illustrates an example of the descramblers 4004 and 4007 and the authentication unit 4008 being provided inside the receiving system, each of the descramblers 4004 and 4007 and the authentication unit 4008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 4008, the scrambled broadcasting contents are descrambled by the descramblers 4004 and 4007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 4008 and the descramblers 4004 and 4007 will now be described in detail. The receiving system receives the scrambled broadcasting contents through the tuner 4001 and the demodulating unit 4002. Then, the system manager 4015 decides whether the received broadcasting contents have been scrambled. Herein, the demodulating unit 4002 may be included as a demodulating means according to embodiments of the present invention as described in FIG. 16 and FIG. 23. However, the present invention is not limited to the examples given in the description set forth herein. If the system manager 4015 decides that the received broadcasting contents have been scrambled, then the system manager 4015 controls the system to operate the authentication unit 4008. As described above, the authentication unit 4008 performs an authentication process in order to decide whether the receiving system according to the present invention corresponds to a legitimate host entitled to receive the paid broadcasting service. Herein, the authentication process may vary in accordance with the authentication methods.

For example, the authentication unit 4008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 4008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 4008 performs the authentication process by determining the conformity between the address of the corresponding receiving system and the system information of the receiving system that is mapped with the IP address. In other words, if the authentication unit 4008 determines that the two types of information conform to one another, then the authentication unit 4008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 4008 of the receiving system extracts the identification information of the receiving system and the identification information included in the EMM of the broadcasting service that is being received. Then, the authentication unit 4008 determines whether the identification information conform to each other, so as to perform the authentication process. More specifically, if the authentication unit 4008 determines that the information conform to each other, then the authentication unit 4008 eventually determines that the receiving system is entitled to receive the request broadcasting service.

In yet another example, the authentication unit 4008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 4015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 4015 transmits the payment information to the remote transmitting system through the telecommunication module 4019.

The authentication unit 4008 authenticates the corresponding receiving system and/or the external module. Then, if the authentication process is successfully completed, the authentication unit 4008 certifies the corresponding receiving system and/or the external module as a legitimate system and/or module entitled to receive the requested paid broadcasting service. In addition, the authentication unit 4008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 4008, the receiving system may descramble the scrambled broadcasting contents received from the transmitting system. At this point, the descrambling process is performed by the first and second descramblers 4004 and 4007. Herein, the first and second descramblers 4004 and 4007 may be included in an internal module or an external module of the receiving system.

The receiving system is also provided with a common interface for communicating with the external module including the first and second descramblers 4004 and 4007, so as to perform the descrambling process. More specifically, the first and second descramblers 4004 and 4007 may be included in the module or in the receiving system in the form of hardware, middleware or software. Herein, the descramblers 4004 and 4007 may be included in any one of or both of the module and the receiving system. If the first and second descramblers 4004 and 4007 are provided inside the receiving system, it is advantageous to have the transmitting system (i.e., at least any one of a service provider and a broadcast station) scramble the corresponding data using the same scrambling method.

Alternatively, if the first and second descramblers 4004 and 4007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 4015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 4012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 4008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 4008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 4015, then the memory card is verified and determined to be a normal memory card that may be used in the receiving system. At this point, the CAS software may either be installed in the first memory 4012 upon the shipping of the present invention, or be downloaded to the first memory 4012 from the transmitting system or the module or memory card, as described above. Herein, the descrambling function may be operated by the data broadcasting application manger 4016 as an application program.

Thereafter, the CAS software parses the EMM/ECM packets outputted from the demultiplexer 4003, so as to verify whether the receiving system is entitled to receive the corresponding data, thereby obtaining the information required for descrambling (i.e., the CW) and providing the obtained CW to the descramblers 4004 and 4007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 4004 and 4007. Each of the descramblers 4004 and 4007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 4004 and 4007 may be included in the module either in the form of hardware or in the form of software. In this case, the scrambled data that being received are descrambled by the module and then demodulated. Also, if the scrambled data that are being received are stored in the third memory 4018, the received data may be descrambled and then stored, or stored in the memory at the point of being received and then descrambled later on prior to being played (or reproduced). Thereafter, in case scramble/descramble algorithms are provided in the storage controller 4017, the storage controller 4017 scrambles the data that are being received once again and then stores the re-scrambled data to the third memory 4018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 4019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 4019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 4019 may also be configured. Also, the PDU may be configured in the Java application of the receiving system and then outputted to the telecommunication module 4019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1×EV-DO, which can be connected through a mobile telecommunication base station, such as CDMA and GSM, and also provided with a wireless LAN, mobile internet, WiBro, WiMax, which can be connected through an access point.

The above-described receiving system corresponds to the system that is not equipped with a telecommunication function. However, a receiving system equipped with telecommunication function does not require the telecommunication module 4019.

The broadcasting data being transmitted and received through the above-described wireless data network may include data required for performing the function of limiting data reception. Meanwhile, the demultiplexer 4003 receives either the real-time data outputted from the demodulating unit 4002 or the data read from the third memory 4018, thereby performing demultiplexing. In this embodiment of the present invention, the demultiplexer 4003 performs demultiplexing on the enhanced data packet. Similar process steps have already been described earlier in the description of the present invention. Therefore, a detailed of the process of demultiplexing the enhanced data will be omitted for simplicity.

The first descrambler 4004 receives the demultiplexed signals from the demultiplexer 4003 and then descrambles the received signals. At this point, the first descrambler 4004 may receive the authentication result received from the authentication unit 4008 and other data required for the descrambling process, so as to perform the descrambling process. The audio decoder 4005 and the video decoder 4006 receive the signals descrambled by the first descrambler 4004, which are then decoded and outputted. Alternatively, if the first descrambler 4004 did not perform the descrambling process, then the audio decoder 4005 and the video decoder 4006 directly decode and output the received signals. In this case, the decoded signals are received and then descrambled by the second descrambler 4007 and processed accordingly.

As described above, the DTV transmitting system and receiving system and method of processing broadcast data according to the present invention have the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by performing an error correction decoding process and a row permutation process on the enhanced data, and by performing an error detection encoding process when required, robustness is provided to the enhanced data, thereby enabling the enhanced data to respond adequately and strongly against the fast and frequent change in channels. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast transmitting system, the method comprising:
   randomizing, by a hardware processor, enhanced data;
   first encoding, by the hardware processor, the randomized enhanced data to add first parity data for first forward error correction;
   second encoding, by the hardware processor, the first-encoded enhanced data to add second parity data for second forward error correction;
   permuting the second-encoded enhanced data;
   block interleaving, by the hardware processor, the permuted enhanced data;
   third encoding signaling information for signaling the enhanced data to add parity data to the signaling information;
   fourth encoding the third-encoded signaling information at a code rate;
   modulating the block-interleaved enhanced data and the fourth-encoded signaling information; and
   transmitting a broadcast signal including the modulated enhanced data and the modulated signaling information,
   wherein the broadcast signal further includes data for performing channel estimation in a broadcast receiver.

2. The method of claim 1, wherein the broadcast signal further includes main data multiplexed with the enhanced data.

3. The method of claim 2, wherein the signaling information includes multiplexing information of the enhanced data and the main data.

4. A broadcast transmitting system for processing broadcast data, the broadcast transmitting system comprising:
   a hardware processor configured to:
     randomize enhanced data,
     first encode the randomized enhanced data to add first parity data for first forward error correction,
     second encode the first-encoded enhanced data to add second parity data for second forward error correction,
     permute the second-encoded enhanced data,
     block interleave the permuted enhanced data,
     third encode signaling information for signaling the enhanced data to add parity data to the signaling information, and
     fourth encode the third-encoded signaling information at a code rate; and
   a transmitter including a modulator which modulates the block-interleaved enhanced data and the fourth-encoded signaling information,
   wherein the transmitter is configured to transmit a broadcast signal including the modulated enhanced data and the modulated signaling information, and
   wherein the broadcast signal further includes data for performing channel estimation in a broadcast receiver.

5. The broadcast transmitting system of claim 4, wherein the broadcast signal further includes main data multiplexed with the enhanced data.

6. The broadcast transmitting system of claim 5, wherein the signaling information includes multiplexing information of the enhanced data and the main data.

* * * * *